United States Patent [19]

Komatsu et al.

[11] Patent Number: 5,119,098
[45] Date of Patent: Jun. 2, 1992

[54] FULL FLASH ANALOG-TO-DIGITAL CONVERTER

[75] Inventors: Yoshihiro Komatsu; Yuji Gendai, both of Kanagawa, Japan

[73] Assignee: Sony Corporation, Tokyo, Japan

[21] Appl. No.: 661,321

[22] Filed: Feb. 26, 1991

[30] Foreign Application Priority Data

| Jun. 20, 1989 | [JP] | Japan | 1-155846 |
| Feb. 28, 1990 | [JP] | Japan | 2-047431 |
| Mar. 20, 1990 | [JP] | Japan | 2-071555 |
| Mar. 20, 1990 | [JP] | Japan | 2-071556 |
| Mar. 30, 1990 | [JP] | Japan | 2-084320 |
| Apr. 6, 1990 | [JP] | Japan | 2-091427 |
| Apr. 20, 1990 | [JP] | Japan | 2-104475 |

[51] Int. Cl.$^5$ .............................................. G08B 1/36
[52] U.S. Cl. ......................................... 341/159; 341/160
[58] Field of Search .................................. 341/159, 160

[56] References Cited

U.S. PATENT DOCUMENTS

| 4,276,543 | 6/1981 | Miller et al. | 341/159 |
| 4,591,825 | 5/1986 | Bucklen | 341/159 |
| 4,596,978 | 6/1986 | Fujita | 341/159 |
| 4,617,549 | 10/1986 | Reiner | 341/159 |
| 4,774,498 | 9/1988 | Traa | 341/159 |
| 4,897,657 | 1/1990 | Brubaker | 341/159 |

FOREIGN PATENT DOCUMENTS 5387628  5/1983  Japan .

Primary Examiner—A. D. Pellinen
Assistant Examiner—Marc S. Hoff
Attorney, Agent, or Firm—Hill, Van Santen, Steadman & Simpson

[57] ABSTRACT

A full flash analog-to-digital converter has a plurality of comparators for comparing an analog input voltage with respective reference voltages, a first-stage encoder for generating low-order bits based on output signals from the comparators, and a second-stage encoder for generating high-order bits based on the low-order bits generated by the first-stage encoder. The first-stage encoder generates a complement bit of the highest-order bit of the low-order bits generated by the first-stage encoder. The second-stage encoder generates the high-order bits based on the highest-order bit and the complement bit. Alternatively, the full flash analog-to-digital converter has an encoder for generating a plurality of bits based on output signals from the comparators. The encoder generates an additional bit by ORing the AND logical product of complement bits of second and third low-order bits of the plurality of bits, and a complement bit of a first low-order bit of the plurality of bits. The additional bit and a complement bit of the additional bit and ANDed by a logic circuit, and an error pattern in the output signals from the comparators is detected based on an output signal from the logic circuit.

11 Claims, 40 Drawing Sheets

FIG. 2B (PRIOR ART)

| | SUP | D5 | D4 | D3 | D2 | D1 | D0 |
|---|---|---|---|---|---|---|---|
| 1 | 1 | 0 | 0 | 0 | 0 | 0 | 1 |
| 2 | 1 | 0 | 0 | 0 | 0 | 1 | 0 |
| 3 | 1 | 0 | 0 | 0 | 0 | 1 | 1 |
| 4 | 0 | 0 | 0 | 0 | 1 | 0 | 0 |
| 5 | 0 | 0 | 0 | 0 | 1 | 0 | 1 |
| 6 | 0 | 0 | 0 | 0 | 1 | 1 | 0 |
| 7 | 0 | 0 | 0 | 0 | 1 | 1 | 1 |
| 8 | 0 | 0 | 0 | 1 | 0 | 0 | 0 |
| 9 | 0 | 0 | 0 | 1 | 0 | 0 | 1 |
| 10 | 0 | 0 | 0 | 1 | 0 | 1 | 0 |
| 11 | 0 | 0 | 0 | 1 | 0 | 1 | 1 |
| 12 | 0 | 0 | 0 | 1 | 1 | 0 | 0 |
| 13 | 0 | 0 | 0 | 1 | 1 | 0 | 1 |
| 14 | 0 | 0 | 0 | 1 | 1 | 1 | 0 |
| 15 | 0 | 0 | 0 | 1 | 1 | 1 | 1 |
| 16 | 0 | 0 | 1 | 0 | 0 | 0 | 0 |
| 17 | 0 | 0 | 1 | 0 | 0 | 0 | 1 |
| 18 | 0 | 0 | 1 | 0 | 0 | 1 | 0 |
| 19 | 0 | 0 | 1 | 0 | 0 | 1 | 1 |
| 20 | 0 | 0 | 1 | 0 | 1 | 0 | 0 |
| 21 | 0 | 0 | 1 | 0 | 1 | 0 | 1 |
| 22 | 0 | 0 | 1 | 0 | 1 | 1 | 0 |
| 23 | 0 | 0 | 1 | 0 | 1 | 1 | 1 |
| 24 | 0 | 0 | 1 | 1 | 0 | 0 | 0 |
| 25 | 0 | 0 | 1 | 1 | 0 | 0 | 1 |
| 26 | 0 | 0 | 1 | 1 | 0 | 1 | 0 |
| 27 | 0 | 0 | 1 | 1 | 0 | 1 | 1 |
| 28 | 0 | 0 | 1 | 1 | 1 | 0 | 0 |
| 29 | 0 | 0 | 1 | 1 | 1 | 0 | 1 |
| 30 | 0 | 0 | 1 | 1 | 1 | 1 | 0 |
| 31 | 1 | 0 | 1 | 1 | 1 | 1 | 1 |
| 32 | 1 | 0 | 1 | 1 | 1 | 1 | 1 |

| | SUP | D5 | D4 | D3 | D2 | D1 | D0 |
|---|---|---|---|---|---|---|---|
| 33 | 0 | 1 | 0 | 0 | 0 | 0 | 0 |
| 34 | 0 | 1 | 0 | 0 | 0 | 0 | 1 |
| 35 | 0 | 1 | 0 | 0 | 0 | 1 | 0 |
| 36 | 0 | 1 | 0 | 0 | 0 | 1 | 1 |
| 37 | 0 | 1 | 0 | 0 | 1 | 0 | 0 |
| 38 | 0 | 1 | 0 | 0 | 1 | 0 | 1 |
| 39 | 0 | 1 | 0 | 0 | 1 | 1 | 0 |
| 40 | 0 | 1 | 0 | 0 | 1 | 1 | 1 |
| 41 | 0 | 1 | 0 | 1 | 0 | 0 | 0 |
| 42 | 0 | 1 | 0 | 1 | 0 | 0 | 1 |
| 43 | 0 | 1 | 0 | 1 | 0 | 1 | 0 |
| 44 | 0 | 1 | 0 | 1 | 0 | 1 | 1 |
| 45 | 0 | 1 | 0 | 1 | 1 | 0 | 0 |
| 46 | 0 | 1 | 0 | 1 | 1 | 0 | 1 |
| 47 | 0 | 1 | 0 | 1 | 1 | 1 | 0 |
| 48 | 0 | 1 | 0 | 1 | 1 | 1 | 1 |
| 49 | 0 | 1 | 1 | 0 | 0 | 0 | 0 |
| 50 | 0 | 1 | 1 | 0 | 0 | 0 | 1 |
| 51 | 0 | 1 | 1 | 0 | 0 | 1 | 0 |
| 52 | 0 | 1 | 1 | 0 | 0 | 1 | 1 |
| 53 | 0 | 1 | 1 | 0 | 1 | 0 | 0 |
| 54 | 0 | 1 | 1 | 0 | 1 | 0 | 1 |
| 55 | 0 | 1 | 1 | 0 | 1 | 1 | 0 |
| 56 | 0 | 1 | 1 | 0 | 1 | 1 | 1 |
| 57 | 0 | 1 | 1 | 1 | 0 | 0 | 0 |
| 58 | 0 | 1 | 1 | 1 | 0 | 0 | 1 |
| 59 | 0 | 1 | 1 | 1 | 0 | 1 | 0 |
| 60 | 0 | 1 | 1 | 1 | 0 | 1 | 1 |
| 61 | 0 | 1 | 1 | 1 | 1 | 0 | 0 |
| 62 | 0 | 1 | 1 | 1 | 1 | 0 | 1 |
| 63 | 0 | 1 | 1 | 1 | 1 | 1 | 0 |
| 64 | 0 | 1 | 1 | 1 | 1 | 1 | 1 |

FIG. 7B

| | D1 | D0 | D5N | D4 | D3 | D2 | D5 | B1 | B0 |
|---|---|---|---|---|---|---|---|---|---|
| 1  | 0 | 0 | 1 | 0 | 0 | 0 | 0 | 0 | 0 |
| 2  | 0 | 1 | 0 | 0 | 0 | 0 | 0 | 0 | 0 |
| 3  | 1 | 0 | 0 | 0 | 0 | 0 | 0 | 0 | 0 |
| 4  | 1 | 1 | 0 | 0 | 0 | 0 | 0 | 0 | 0 |
| 5  | 0 | 0 | 0 | 0 | 0 | 1 | 0 | 0 | 0 |
| 6  | 0 | 1 | 1 | 0 | 0 | 0 | 0 | 0 | 0 |
| 7  | 1 | 0 | 0 | 0 | 0 | 0 | 0 | 0 | 0 |
| 8  | 1 | 1 | 0 | 0 | 1 | 0 | 0 | 0 | 0 |
| 9  | 0 | 0 | 1 | 0 | 0 | 0 | 0 | 0 | 0 |
| 10 | 0 | 1 | 0 | 0 | 0 | 0 | 0 | 0 | 0 |
| 11 | 1 | 0 | 0 | 0 | 0 | 0 | 0 | 0 | 0 |
| 12 | 1 | 1 | 0 | 0 | 0 | 0 | 0 | 0 | 0 |
| 13 | 0 | 0 | 1 | 0 | 1 | 1 | 0 | 0 | 0 |
| 14 | 0 | 1 | 0 | 0 | 0 | 0 | 0 | 0 | 0 |
| 15 | 1 | 0 | 0 | 0 | 0 | 0 | 0 | 0 | 0 |
| 16 | 1 | 1 | 0 | 0 | 0 | 0 | 0 | 0 | 0 |
| 17 | 0 | 0 | 1 | 1 | 0 | 0 | 0 | 0 | 0 |
| 18 | 0 | 1 | 0 | 0 | 0 | 0 | 0 | 0 | 0 |
| 19 | 1 | 0 | 0 | 0 | 0 | 0 | 0 | 0 | 0 |
| 20 | 1 | 1 | 0 | 0 | 0 | 0 | 0 | 0 | 0 |
| 21 | 0 | 0 | 1 | 0 | 0 | 1 | 0 | 0 | 0 |
| 22 | 0 | 1 | 0 | 0 | 0 | 0 | 0 | 0 | 0 |
| 23 | 1 | 0 | 0 | 0 | 0 | 0 | 0 | 0 | 0 |
| 24 | 1 | 1 | 0 | 0 | 1 | 0 | 0 | 0 | 0 |
| 25 | 0 | 0 | 1 | 0 | 0 | 0 | 0 | 0 | 0 |
| 26 | 0 | 1 | 0 | 0 | 0 | 0 | 0 | 0 | 0 |
| 27 | 1 | 0 | 0 | 0 | 0 | 0 | 0 | 0 | 0 |
| 28 | 1 | 1 | 0 | 0 | 0 | 0 | 0 | 0 | 0 |
| 29 | 0 | 0 | 1 | 1 | 1 | 1 | 0 | 0 | 0 |
| 30 | 0 | 1 | 0 | 0 | 0 | 0 | 0 | 0 | 0 |
| 31 | 1 | 0 | 0 | 0 | 0 | 0 | 0 | 0 | 0 |
| 32 | 1 | 1 | 0 | 0 | 0 | 0 | 0 | 0 | 0 |
| 33 | 0 | 0 | 0 | 0 | 0 | 0 | 1 | 0 | 0 |
| 34 | 0 | 0 | 0 | 0 | 0 | 0 | 0 | 0 | 1 |
| 35 | 0 | 0 | 0 | 0 | 0 | 0 | 0 | 1 | 0 |
| 36 | 0 | 0 | 0 | 0 | 0 | 0 | 0 | 1 | 1 |
| 37 | 0 | 0 | 0 | 0 | 0 | 1 | 1 | 0 | 0 |
| 38 | 0 | 0 | 0 | 0 | 0 | 0 | 0 | 0 | 1 |
| 39 | 0 | 0 | 0 | 0 | 0 | 0 | 0 | 1 | 0 |
| 40 | 0 | 0 | 0 | 0 | 1 | 0 | 0 | 1 | 1 |
| 41 | 0 | 0 | 0 | 0 | 0 | 0 | 1 | 0 | 0 |
| 42 | 0 | 0 | 0 | 0 | 0 | 0 | 0 | 0 | 1 |
| 43 | 0 | 0 | 0 | 0 | 0 | 0 | 0 | 1 | 0 |
| 44 | 0 | 0 | 0 | 0 | 0 | 0 | 0 | 1 | 1 |
| 45 | 0 | 0 | 0 | 0 | 1 | 1 | 1 | 0 | 0 |
| 46 | 0 | 0 | 0 | 0 | 0 | 0 | 0 | 0 | 1 |
| 47 | 0 | 0 | 0 | 0 | 0 | 0 | 0 | 1 | 0 |
| 48 | 0 | 0 | 0 | 0 | 0 | 0 | 0 | 1 | 1 |
| 49 | 0 | 0 | 0 | 1 | 0 | 0 | 1 | 0 | 0 |
| 50 | 0 | 0 | 0 | 0 | 0 | 0 | 0 | 0 | 1 |
| 51 | 0 | 0 | 0 | 0 | 0 | 0 | 0 | 1 | 0 |
| 52 | 0 | 0 | 0 | 0 | 0 | 0 | 0 | 1 | 1 |
| 53 | 0 | 0 | 0 | 1 | 0 | 1 | 1 | 0 | 0 |
| 54 | 0 | 0 | 0 | 0 | 0 | 0 | 0 | 0 | 1 |
| 55 | 0 | 0 | 0 | 0 | 0 | 0 | 0 | 1 | 0 |
| 56 | 0 | 0 | 0 | 0 | 1 | 0 | 0 | 1 | 1 |
| 57 | 0 | 0 | 0 | 1 | 0 | 0 | 1 | 0 | 0 |
| 58 | 0 | 0 | 0 | 0 | 0 | 0 | 0 | 0 | 1 |
| 59 | 0 | 0 | 0 | 0 | 0 | 0 | 0 | 1 | 0 |
| 60 | 0 | 0 | 0 | 0 | 0 | 0 | 0 | 1 | 1 |
| 61 | 0 | 0 | 0 | 1 | 1 | 1 | 1 | 0 | 0 |
| 62 | 0 | 0 | 0 | 0 | 0 | 0 | 0 | 0 | 1 |
| 63 | 0 | 0 | 0 | 0 | 0 | 0 | 0 | 1 | 0 |
| 64 | 0 | 0 | 0 | 0 | 0 | 0 | 0 | 1 | 1 |

FIG. 13A

| # | D5 | D4 | D3 | D2 | D1 D0 | D* |
|---|----|----|----|----|-------|-----|
| 1 | 0 | 0 | 0 | 0 | 0 0 | 1 |
| 2 | 0 | 0 | 0 | 0 | 0 1 | 1 |
| 3 | 0 | 0 | 0 | 0 | 1 0 | 0 |
| 4 | 0 | 0 | 0 | 0 | 1 1 | 0 |
| 5 | 0 | 0 | 0 | 1 | 0 0 | 1 |
| 6 | 0 | 0 | 0 | 1 | 0 1 | 1 |
| 7 | 0 | 0 | 0 | 1 | 1 0 | 0 |
| 8 | 0 | 0 | 0 | 1 | 1 1 | 0 |
| 9 | 0 | 0 | 1 | 0 | 0 0 | 1 |
| 10 | 0 | 0 | 1 | 0 | 0 1 | 1 |
| 11 | 0 | 0 | 1 | 0 | 1 0 | 0 |
| 12 | 0 | 0 | 1 | 0 | 1 1 | 0 |
| 13 | 0 | 0 | 1 | 1 | 0 0 | 1 |
| 14 | 0 | 0 | 1 | 1 | 0 1 | 1 |
| 15 | 0 | 0 | 1 | 1 | 1 0 | 0 |
| 16 | 0 | 0 | 1 | 1 | 1 1 | 0 |
| 17 | 0 | 1 | 0 | 0 | 0 0 | 1 |
| 18 | 0 | 1 | 0 | 0 | 0 1 | 1 |
| 19 | 0 | 1 | 0 | 0 | 1 0 | 0 |
| 20 | 0 | 1 | 0 | 0 | 1 1 | 0 |
| 21 | 0 | 1 | 0 | 1 | 0 0 | 1 |
| 22 | 0 | 1 | 0 | 1 | 0 1 | 1 |
| 23 | 0 | 1 | 0 | 1 | 1 0 | 0 |
| 24 | 0 | 1 | 0 | 1 | 1 1 | 0 |
| 25 | 0 | 1 | 1 | 0 | 0 0 | 1 |
| 26 | 0 | 1 | 1 | 0 | 0 1 | 1 |
| 27 | 0 | 1 | 1 | 0 | 1 0 | 0 |
| 28 | 0 | 1 | 1 | 0 | 1 1 | 0 |
| 29 | 0 | 1 | 1 | 1 | 0 0 | 1 |
| 30 | 0 | 1 | 1 | 1 | 0 1 | 1 |
| 31 | 0 | 1 | 1 | 1 | 1 0 | 0 |
| 32 | 0 | 1 | 1 | 1 | 1 1 | 0 |

FIG. 14A

| # | D5 | D4 | D3 | D2 | D1 | D0 | D* |
|---|----|----|----|----|----|----|----|
| 1 | 0 | 0 | 0 | 0 | 1 | 0 | 1 |
| 2 | 0 | 0 | 0 | 0 | 1 | 1 | 1 |
| 3 | 0 | 0 | 0 | 1 | 1 | 0 | 1 |
| 4 | 0 | 0 | 0 | 1 | 1 | 1 | 1 |
| 5 | 0 | 0 | 0 | 1 | 1 | 0 | 1 |
| 6 | 0 | 0 | 0 | 1 | 1 | 1 | 1 |
| 7 | 0 | 0 | 1 | 1 | 1 | 0 | 1 |
| 8 | 0 | 0 | 1 | 1 | 1 | 1 | 1 |
| 9 | 0 | 0 | 1 | 1 | 1 | 0 | 1 |
| 10 | 0 | 0 | 1 | 1 | 1 | 1 | 1 |
| 11 | 0 | 0 | 1 | 1 | 1 | 0 | 1 |
| 12 | 0 | 0 | 1 | 1 | 1 | 1 | 1 |
| 13 | 0 | 0 | 1 | 1 | 1 | 0 | 1 |
| 14 | 0 | 0 | 1 | 1 | 1 | 1 | 1 |
| 15 | 0 | 1 | 1 | 1 | 1 | 0 | 1 |
| 16 | 0 | 1 | 1 | 1 | 1 | 1 | 1 |
| 17 | 0 | 1 | 1 | 0 | 1 | 0 | 1 |
| 18 | 0 | 1 | 1 | 0 | 1 | 1 | 1 |
| 19 | 0 | 1 | 1 | 1 | 1 | 0 | 1 |
| 20 | 0 | 1 | 1 | 1 | 1 | 1 | 1 |
| 21 | 0 | 1 | 1 | 1 | 1 | 0 | 1 |
| 22 | 0 | 1 | 1 | 1 | 1 | 1 | 1 |
| 23 | 0 | 1 | 1 | 1 | 1 | 0 | 1 |
| 24 | 0 | 1 | 1 | 1 | 1 | 1 | 1 |
| 25 | 0 | 1 | 1 | 1 | 1 | 0 | 1 |
| 26 | 0 | 1 | 1 | 1 | 1 | 1 | 1 |
| 27 | 0 | 1 | 1 | 1 | 1 | 0 | 1 |
| 28 | 0 | 1 | 1 | 1 | 1 | 1 | 1 |
| 29 | 0 | 1 | 1 | 1 | 1 | 0 | 1 |
| 30 | 0 | 1 | 1 | 1 | 1 | 1 | 1 |
| 31 | 1 | 1 | 1 | 1 | 1 | 0 | 1 |
| 32 | 1 | 1 | 1 | 1 | 1 | 1 | 1 |

| | D5 | D4 | D3 | D2 | D1 | D0 | Dp | Dq |
|---|---|---|---|---|---|---|---|---|
| 1 | 0 | 0 | 0 | 0 | 1 | 0 | 1 | 1 |
| 2 | 0 | 0 | 0 | 0 | 1 | 1 | 1 | 1 |
| 3 | 0 | 0 | 0 | 0 | 1 | 0 | 0 | 0 |
| 4 | 0 | 0 | 0 | 1 | 1 | 1 | 1 | 1 |
| 5 | 0 | 0 | 0 | 1 | 1 | 0 | 1 | 1 |
| 6 | 0 | 0 | 0 | 1 | 1 | 1 | 1 | 1 |
| 7 | 0 | 0 | 0 | 1 | 1 | 0 | 1 | 1 |
| 8 | 0 | 0 | 1 | 0 | 1 | 1 | 1 | 1 |
| 9 | 0 | 0 | 1 | 0 | 1 | 0 | 1 | 1 |
| 10 | 0 | 0 | 1 | 0 | 1 | 1 | 1 | 1 |
| 11 | 0 | 0 | 1 | 1 | 1 | 0 | 1 | 1 |
| 12 | 0 | 0 | 1 | 1 | 1 | 1 | 1 | 0 |
| 13 | 0 | 0 | 1 | 1 | 1 | 0 | 1 | 1 |
| 14 | 0 | 0 | 1 | 1 | 1 | 1 | 1 | 1 |
| 15 | 0 | 0 | 1 | 1 | 1 | 0 | 1 | 1 |
| 16 | 0 | 1 | 1 | 1 | 1 | 1 | 1 | 0 |
| 17 | 0 | 1 | 0 | 0 | 1 | 0 | 1 | 1 |
| 18 | 0 | 1 | 0 | 0 | 1 | 1 | 1 | 0 |
| 19 | 0 | 1 | 0 | 0 | 1 | 0 | 1 | 1 |
| 20 | 0 | 1 | 0 | 1 | 1 | 1 | 1 | 1 |
| 21 | 0 | 1 | 0 | 1 | 1 | 0 | 1 | 1 |
| 22 | 0 | 1 | 0 | 1 | 1 | 1 | 1 | 1 |
| 23 | 0 | 1 | 0 | 1 | 1 | 0 | 1 | 1 |
| 24 | 0 | 1 | 0 | 1 | 1 | 1 | 0 | 0 |
| 25 | 0 | 1 | 1 | 0 | 1 | 0 | 1 | 1 |
| 26 | 0 | 1 | 1 | 0 | 1 | 1 | 1 | 1 |
| 27 | 0 | 1 | 1 | 0 | 1 | 0 | 1 | 1 |
| 28 | 0 | 1 | 1 | 1 | 1 | 1 | 1 | 1 |
| 29 | 0 | 1 | 1 | 1 | 1 | 0 | 1 | 1 |
| 30 | 0 | 1 | 1 | 1 | 1 | 1 | 1 | 0 |
| 31 | 1 | 1 | 1 | 1 | 1 | 0 | 1 | 1 |
| 32 | 1 | 1 | 1 | 1 | 1 | 1 | 1 | 1 |

FIG. 19A

| | D5 | D4 | D3 | D2 | D1 | D0 | Dp | Dq |
|---|---|---|---|---|---|---|---|---|
| 1 | 0 | 0 | 0 | 0 | 0 | 0 | 1 | 0 |
| 2 | 0 | 0 | 0 | 0 | 0 | 1 | 0 | 1 |
| 3 | 0 | 0 | 0 | 0 | 1 | 0 | 0 | 1 |
| 4 | 0 | 0 | 0 | 0 | 1 | 1 | 1 | 0 |
| 5 | 0 | 0 | 0 | 1 | 0 | 0 | 0 | 1 |
| 6 | 0 | 0 | 0 | 1 | 0 | 1 | 1 | 0 |
| 7 | 0 | 0 | 0 | 1 | 1 | 0 | 1 | 0 |
| 8 | 0 | 0 | 0 | 1 | 1 | 1 | 0 | 1 |
| 9 | 0 | 0 | 1 | 0 | 0 | 0 | 0 | 1 |
| 10 | 0 | 0 | 1 | 0 | 0 | 1 | 1 | 0 |
| 11 | 0 | 0 | 1 | 0 | 1 | 0 | 1 | 0 |
| 12 | 0 | 0 | 1 | 0 | 1 | 1 | 0 | 1 |
| 13 | 0 | 0 | 1 | 1 | 0 | 0 | 1 | 0 |
| 14 | 0 | 0 | 1 | 1 | 0 | 1 | 0 | 1 |
| 15 | 0 | 0 | 1 | 1 | 1 | 0 | 0 | 1 |
| 16 | 0 | 0 | 1 | 1 | 1 | 1 | 1 | 0 |
| 17 | 0 | 1 | 0 | 0 | 0 | 0 | 1 | 1 |
| 18 | 0 | 1 | 0 | 0 | 0 | 1 | 0 | 0 |
| 19 | 0 | 1 | 0 | 0 | 1 | 0 | 0 | 0 |
| 20 | 0 | 1 | 0 | 0 | 1 | 1 | 1 | 1 |
| 21 | 0 | 1 | 0 | 1 | 0 | 0 | 0 | 0 |
| 22 | 0 | 1 | 0 | 1 | 0 | 1 | 1 | 1 |
| 23 | 0 | 1 | 0 | 1 | 1 | 0 | 1 | 1 |
| 24 | 0 | 1 | 0 | 1 | 1 | 1 | 0 | 0 |
| 25 | 0 | 1 | 1 | 0 | 0 | 0 | 0 | 0 |
| 26 | 0 | 1 | 1 | 0 | 0 | 1 | 1 | 1 |
| 27 | 0 | 1 | 1 | 0 | 1 | 0 | 1 | 1 |
| 28 | 0 | 1 | 1 | 0 | 1 | 1 | 0 | 0 |
| 29 | 0 | 1 | 1 | 1 | 0 | 0 | 1 | 1 |
| 30 | 0 | 1 | 1 | 1 | 0 | 1 | 0 | 0 |
| 31 | 0 | 1 | 1 | 1 | 1 | 0 | 0 | 0 |
| 32 | 0 | 1 | 1 | 1 | 1 | 1 | 1 | 1 |

FIG. 20B

| | D5 | D4 | D3 | D2 | D1 | D0 | Dp | Dq |
|---|---|---|---|---|---|---|---|---|
| 33 | 1 | 0 | 0 | 0 | 1 | 0 | 1 | 1 |
| 34 | 1 | 0 | 0 | 1 | 1 | 1 | 1 | 0 |
| 35 | 1 | 0 | 0 | 1 | 1 | 0 | 1 | 1 |
| 36 | 1 | 0 | 0 | 1 | 1 | 1 | 1 | 1 |
| 37 | 1 | 0 | 0 | 1 | 1 | 0 | 1 | 1 |
| 38 | 1 | 0 | 0 | 1 | 1 | 1 | 1 | 1 |
| 39 | 1 | 0 | 0 | 1 | 1 | 0 | 1 | 1 |
| 40 | 1 | 0 | 0 | 1 | 1 | 1 | 1 | 1 |
| 41 | 1 | 0 | 1 | 0 | 1 | 0 | 1 | 0 |
| 42 | 1 | 0 | 1 | 1 | 1 | 1 | 0 | 1 |
| 43 | 1 | 0 | 1 | 1 | 1 | 0 | 1 | 1 |
| 44 | 1 | 0 | 1 | 1 | 1 | 1 | 1 | 1 |
| 45 | 1 | 0 | 1 | 1 | 1 | 0 | 1 | 1 |
| 46 | 1 | 0 | 1 | 1 | 1 | 1 | 1 | 1 |
| 47 | 1 | 0 | 1 | 1 | 1 | 0 | 1 | 1 |
| 48 | 1 | 0 | 1 | 1 | 1 | 1 | 0 | 1 |
| 49 | 1 | 1 | 0 | 0 | 1 | 0 | 1 | 1 |
| 50 | 1 | 1 | 0 | 0 | 1 | 1 | 1 | 1 |
| 51 | 1 | 1 | 0 | 0 | 1 | 0 | 1 | 1 |
| 52 | 1 | 1 | 0 | 1 | 1 | 1 | 0 | 0 |
| 53 | 1 | 1 | 0 | 1 | 1 | 0 | 1 | 1 |
| 54 | 1 | 1 | 0 | 1 | 1 | 1 | 1 | 1 |
| 55 | 1 | 1 | 0 | 1 | 1 | 0 | 1 | 1 |
| 56 | 1 | 1 | 0 | 1 | 1 | 1 | 1 | 1 |
| 57 | 1 | 1 | 1 | 0 | 1 | 0 | 1 | 1 |
| 58 | 1 | 1 | 1 | 0 | 1 | 1 | 1 | 0 |
| 59 | 1 | 1 | 1 | 0 | 1 | 0 | 1 | 1 |
| 60 | 1 | 1 | 1 | 1 | 1 | 1 | 0 | 1 |
| 61 | 1 | 1 | 1 | 1 | 1 | 0 | 1 | 1 |
| 62 | 1 | 1 | 1 | 1 | 1 | 1 | 1 | 1 |

FIG. 19B

| | D5 | D4 | D3 | D2 | D1 | D0 | Dp | Dq |
|---|---|---|---|---|---|---|---|---|
| 33 | 1 | 0 | 0 | 0 | 0 | 1 | 0 | 1 |
| 34 | 1 | 0 | 0 | 0 | 0 | 0 | 1 | 0 |
| 35 | 1 | 0 | 0 | 0 | 1 | 1 | 1 | 0 |
| 36 | 1 | 0 | 0 | 0 | 1 | 0 | 0 | 1 |
| 37 | 1 | 0 | 0 | 1 | 0 | 1 | 0 | 0 |
| 38 | 1 | 0 | 0 | 1 | 0 | 0 | 1 | 1 |
| 39 | 1 | 0 | 0 | 1 | 1 | 1 | 1 | 1 |
| 40 | 1 | 0 | 0 | 1 | 1 | 0 | 0 | 0 |
| 41 | 1 | 0 | 1 | 0 | 0 | 1 | 0 | 1 |
| 42 | 1 | 0 | 1 | 0 | 0 | 0 | 1 | 0 |
| 43 | 1 | 0 | 1 | 0 | 1 | 1 | 1 | 1 |
| 44 | 1 | 0 | 1 | 0 | 1 | 0 | 0 | 0 |
| 45 | 1 | 0 | 1 | 1 | 0 | 1 | 0 | 1 |
| 46 | 1 | 0 | 1 | 1 | 0 | 0 | 1 | 1 |
| 47 | 1 | 0 | 1 | 1 | 1 | 1 | 1 | 0 |
| 48 | 1 | 0 | 1 | 1 | 1 | 0 | 0 | 1 |
| 49 | 1 | 1 | 0 | 0 | 0 | 1 | 1 | 0 |
| 50 | 1 | 1 | 0 | 0 | 0 | 0 | 0 | 1 |
| 51 | 1 | 1 | 0 | 0 | 1 | 1 | 0 | 1 |
| 52 | 1 | 1 | 0 | 0 | 1 | 0 | 1 | 0 |
| 53 | 1 | 1 | 0 | 1 | 0 | 1 | 1 | 0 |
| 54 | 1 | 1 | 0 | 1 | 0 | 0 | 0 | 0 |
| 55 | 1 | 1 | 0 | 1 | 1 | 1 | 1 | 1 |
| 56 | 1 | 1 | 0 | 1 | 1 | 0 | 0 | 1 |
| 57 | 1 | 1 | 1 | 0 | 0 | 1 | 1 | 0 |
| 58 | 1 | 1 | 1 | 0 | 0 | 0 | 1 | 1 |
| 59 | 1 | 1 | 1 | 0 | 1 | 1 | 0 | 1 |
| 60 | 1 | 1 | 1 | 0 | 1 | 0 | 1 | 0 |
| 61 | 1 | 1 | 1 | 1 | 0 | 1 | 1 | 1 |
| 62 | 1 | 1 | 1 | 1 | 0 | 0 | 0 | 0 |
| 63 | 1 | 1 | 1 | 1 | 1 | 1 | 0 | 0 |
| 64 | 1 | 1 | 1 | 1 | 1 | 0 | 1 | 0 |

FIG. 26A

| | A | 1010101010101010 1010101010101010 |
|---|---|---|
| | Z0 | 1111111111111111 1111111111111111 |
| | Z1 | 0011001100110011 0011001100110011 |
| | Z2 | 0000111100001111 0000111100001111 |
| | Z3 | 0000000011111111 0000000011111111 |
| | Z4 | 0000000000000000 1111111111111111 |
| | Z5 | 0000000000000000 0000000000000000 |
| | | 1 2 3 4 5 6 7 8 9 10 11 12 13 14 15 16   17 18 19 20 21 22 23 24 25 26 27 28 29 30 31 32 |

FIG. 25A

| | X0 | 0101010101010101 0101010101010101 |
|---|---|---|
| | X1 | 0011001100110011 0011001100110011 |
| | X2 | 0000111100001111 0000111100001111 |
| | X3 | 0000000011111111 0000000011111111 |
| | X4 | 0000000000000000 1111111111111111 |
| | X5 | 0000000000000000 0000000000000000 |
| | | 1 2 3 4 5 6 7 8 9 10 11 12 13 14 15 16   17 18 19 20 21 22 23 24 25 26 27 28 29 30 31 32 |

FIG. 26B

| | A | 1 0 1 0 1 0 1 0 1 0 1 0 1 0 1 0 | 1 0 1 0 1 0 1 0 1 0 1 0 1 0 1 1 |
|---|---|---|---|
| | Z0 | 1 1 1 1 1 1 1 1 1 1 1 1 1 1 1 1 | 1 1 1 1 1 1 1 1 1 1 1 1 1 1 1 1 |
| | Z1 | 0 0 1 1 0 0 1 1 0 0 1 1 0 0 1 1 | 0 0 1 1 0 0 1 1 0 0 1 1 0 0 1 0 |
| | Z2 | 0 0 0 0 1 1 1 1 0 0 0 0 1 1 1 1 | 0 0 0 0 1 1 1 1 0 0 0 0 0 0 0 1 |
| | Z3 | 0 0 0 0 0 0 0 0 1 1 1 1 1 1 1 1 | 0 0 0 0 0 0 0 0 1 1 1 1 1 1 1 1 |
| | Z4 | 0 0 0 0 0 0 0 0 0 0 0 0 0 0 0 0 | 1 1 1 1 1 1 1 1 1 1 1 1 1 1 1 1 |
| | Z5 | 1 1 1 1 1 1 1 1 1 1 1 1 1 1 1 1 | 1 1 1 1 1 1 1 1 1 1 1 1 1 1 1 1 |
| | | 33 34 35 36 37 38 39 40 41 42 43 44 45 46 47 48 | 49 50 51 52 53 54 55 56 57 58 59 60 61 |

FIG. 25B

| | X0 | 0 1 0 1 0 1 0 1 0 1 0 1 0 1 0 1 | 0 1 0 1 0 1 0 1 0 1 0 1 0 1 0 1 |
|---|---|---|---|
| | X1 | 0 0 1 1 0 0 1 1 0 0 1 1 0 0 1 1 | 0 0 1 1 0 0 1 1 0 0 1 1 0 0 1 1 |
| | X2 | 0 0 0 0 1 1 1 1 0 0 0 0 1 1 1 1 | 0 0 0 0 1 1 1 1 0 0 0 0 1 1 1 1 |
| | X3 | 0 0 0 0 0 0 0 0 1 1 1 1 1 1 1 1 | 0 0 0 0 0 0 0 0 1 1 1 1 1 1 1 1 |
| | X4 | 0 0 0 0 0 0 0 0 0 0 0 0 0 0 0 0 | 1 1 1 1 1 1 1 1 1 1 1 1 1 1 1 1 |
| | X5 | 1 1 1 1 1 1 1 1 1 1 1 1 1 1 1 1 | 1 1 1 1 1 1 1 1 1 1 1 1 1 1 1 1 |
| | | 33 34 35 36 37 38 39 40 41 42 43 44 45 46 47 48 | 49 50 51 52 53 54 55 56 57 58 59 60 61 62 63 64 |

FIG. 27

|   | 1 | 2 | 3 | 4 | 5 | 6 | 7 | 8 | 9 | 10 | 11 | 12 | 13 | 14 | 15 | 16 |
|---|---|---|---|---|---|---|---|---|---|----|----|----|----|----|----|----|
| 1 | 0 | 0 | 1 | 0 | 1 | 2 | 3 | 0 | 1 | 2  | 3  | 4  | 5  | 6  | 7  | 0  |
| 2 | 0 | 0 | 0 | 0 | 2 | 2 | 0 | 0 | 2 | 2  | 4  | 4  | 6  | 6  | 0  | 0  |
| 3 | 0 | 0 | 1 | 0 | 1 | 0 | 1 | 0 | 1 | 4  | 5  | 4  | 5  | 0  | 1  | 0  |
| 4 | 0 | 0 | 0 | 0 | 0 | 0 | 0 | 0 | 4 | 4  | 4  | 4  | 0  | 0  | 0  | 0  |
| 5 | 0 | 0 | 1 | 0 | 1 | 2 | 3 | 0 | 1 | 2  | 3  | 0  | 1  | 2  | 3  | 0  |
| 6 | 0 | 0 | 0 | 0 | 2 | 2 | 0 | 0 | 2 | 2  | 0  | 0  | 2  | 2  | 0  | 0  |
| 7 | 0 | 0 | 1 | 0 | 1 | 0 | 1 | 0 | 1 | 0  | 1  | 0  | 1  | 0  | 1  | 0  |
| 8 | 0 | 0 | 0 | 0 | 0 | 0 | 0 | 0 | 0 | 0  | 0  | 0  | 0  | 0  | 0  | 0  |

FIG. 29A

| No. | Z4 | Z3 | Z2 | Z1 | Z0 | Δ |
|-----|----|----|----|----|----|----|
| 1 | 0 | 0 | 0 | 0 | 0 | 0 |
| 2 | 0 | 0 | 0 | 0 | 1 | 0 |
| 3 | 0 | 0 | 0 | 1 | -1 | 1 |
| 4 | 0 | 0 | 0 | 1 | 0 | -1 |
| 5 | 0 | 0 | 1 | 0 | -1 | 0 |
| 6 | 0 | 0 | 1 | -1 | 0 | -2 |
| 7 | 0 | 0 | 1 | 0 | 1 | 1 |
| 8 | 0 | 0 | 1 | 1 | -1 | -3 |
| 9 | 0 | 0 | 1 | 0 | 0 | 0 |
| 10 | 0 | 1 | -1 | 0 | 1 | -4 |
| 11 | 0 | 1 | 0 | 1 | 0 | 1 |
| 12 | 0 | 1 | 0 | 1 | -1 | -5 |
| 13 | 0 | 1 | 1 | 0 | 0 | 0 |
| 14 | 0 | 1 | 1 | 0 | 1 | -6 |
| 15 | 0 | 1 | 1 | 1 | -1 | 1 |
| 16 | 0 | 1 | 1 | 1 | 0 | -7 |
| 17 | 1 | 0 | 0 | 0 | 0 | 0 |

FIG. 29B

| No. | Z4 | Z3 | Z2 | Z1 | Z0 | Δ |
|-----|----|----|----|----|----|----|
| 1 | 0 | 0 | 0 | 0 | 0 | 0 |
| 2 | 0 | 0 | 0 | 0 | 1 | 0 |
| 3 | 0 | 0 | 0 | 1 | 0 | 0 |
| 4 | 0 | 0 | 0 | 1 | 1 | 0 |
| 5 | 0 | 0 | 1 | 0 | 0 | 0 |
| 6 | 0 | 0 | 1 | 0 | 1 | 0 |
| 7 | 0 | 0 | 1 | 1 | 0 | 0 |
| 8 | 0 | 0 | 1 | 1 | 1 | 0 |
| 9 | 0 | 1 | 0 | 0 | 0 | 0 |
| 10 | 0 | 1 | 0 | 0 | 1 | 0 |
| 11 | 0 | 1 | 0 | 1 | 0 | 0 |
| 12 | 0 | 1 | 0 | 1 | 1 | 0 |
| 13 | 0 | 1 | 1 | 0 | 0 | 0 |
| 14 | 0 | 1 | 1 | 0 | 1 | 0 |
| 15 | 0 | 1 | 1 | 1 | 0 | 0 |
| 16 | 0 | 1 | 1 | 1 | 1 | 0 |
| 17 | 1 | 0 | 0 | 0 | 0 | 0 |

FIG. 29C

| No. | Z4 | Z3 | Z2 | Z1 | Z0 | Δ |
|-----|----|----|----|----|----|----|
| 1 | 0 | 0 | 0 | 0 | 0 | 0 |
| 2 | 0 | 0 | 0 | 0 | 1 | 0 |
| 3 | 0 | 0 | 0 | 1 | 0 | 0 |
| 4 | 0 | 0 | 1 | 1 | 0 | -1 |
| 5 | 0 | 0 | 1 | 1 | 1 | 0 |
| 6 | 0 | 1 | 1 | 0 | 1 | 3 |
| 7 | 0 | 0 | 1 | 1 | 1 | 0 |
| 8 | 0 | 1 | 1 | 1 | 0 | -1 |
| 9 | 0 | 1 | 0 | 0 | 1 | -1 |
| 10 | 0 | 1 | 0 | 1 | 0 | 0 |
| 11 | 0 | 1 | 0 | 1 | 1 | 0 |
| 12 | 0 | 1 | 1 | 1 | 0 | -1 |
| 13 | 0 | 1 | 1 | 0 | 1 | 3 |
| 14 | 0 | 1 | 1 | 1 | 0 | 0 |
| 15 | 0 | 1 | 1 | 1 | 1 | 0 |
| 16 | 0 | 1 | 1 | 1 | 0 | -1 |
| 17 | 1 | 1 | 1 | 1 | 1 | 15 |

FIG. 31A

| No. | Z4 | Z3 | Z2 | Z1 | Z0 | Δ |
|---|---|---|---|---|---|---|
| 1 | 0 | 0 | 0 | 0 | 0 | 0 |
| 2 | 0 | 0 | 0 | 0 | 1 | 0 |
| 3 | 0 | 0 | 0 | 1 | 1 | 1 |
| 4 | 0 | 0 | 1 | 1 | 0 | 1 |
| 5 | 0 | 0 | 1 | 0 | 0 | 0 |
| 6 | 0 | 0 | 1 | 1 | 1 | 0 |
| 7 | 0 | 0 | 1 | 1 | 1 | 1 |
| 8 | 0 | 1 | 1 | 0 | 0 | 1 |
| 9 | 0 | 1 | 0 | 0 | 0 | 0 |
| 10 | 0 | 1 | 0 | 0 | 1 | 0 |
| 11 | 0 | 1 | 0 | 1 | 1 | 1 |
| 12 | 0 | 1 | 1 | 1 | 1 | 1 |
| 13 | 0 | 1 | 1 | 0 | 0 | 0 |
| 14 | 0 | 1 | 1 | 1 | 1 | 0 |
| 15 | 0 | 1 | 1 | 1 | 1 | 1 |
| 16 | 0 | 0 | 0 | 0 | 0 | 1 |
| 17 | 1 | 0 | 0 | 0 | 0 | 0 |

FIG. 31B

| No. | Z4 | Z3 | Z2 | Z1 | Z0 | Δ |
|---|---|---|---|---|---|---|
| 1 | 0 | 0 | 0 | 0 | 0 | 0 |
| 2 | 0 | 0 | 0 | 0 | 1 | 0 |
| 3 | 0 | 0 | 0 | 1 | 0 | 0 |
| 4 | 0 | 0 | 0 | 1 | 1 | 0 |
| 5 | 0 | 0 | 1 | 0 | 0 | 0 |
| 6 | 0 | 0 | 1 | 0 | 1 | 0 |
| 7 | 0 | 0 | 1 | 1 | 0 | 0 |
| 8 | 0 | 0 | 1 | 1 | 1 | 0 |
| 9 | 0 | 1 | 0 | 0 | 0 | 0 |
| 10 | 0 | 1 | 0 | 0 | 1 | 0 |
| 11 | 0 | 1 | 0 | 1 | 0 | 0 |
| 12 | 0 | 1 | 0 | 1 | 1 | 0 |
| 13 | 0 | 1 | 1 | 0 | 0 | 0 |
| 14 | 0 | 1 | 1 | 0 | 1 | 0 |
| 15 | 0 | 1 | 1 | 1 | 0 | 0 |
| 16 | 0 | 1 | 1 | 1 | 1 | 0 |
| 17 | 1 | 0 | 0 | 0 | 0 | 0 |

FIG. 31C

| No. | Z4 | Z3 | Z2 | Z1 | Z0 | Δ |
|---|---|---|---|---|---|---|
| 1 | 0 | 0 | 0 | 0 | 0 | 0 |
| 2 | 0 | 0 | 0 | 0 | 1 | 0 |
| 3 | 0 | 0 | 0 | 1 | 0 | 0 |
| 4 | 0 | 0 | 0 | 1 | 1 | 1 |
| 5 | 0 | 0 | 1 | 1 | 0 | 1 |
| 6 | 0 | 0 | 1 | 1 | 1 | 0 |
| 7 | 0 | 0 | 1 | 0 | 1 | 0 |
| 8 | 0 | 0 | 1 | 0 | 0 | 1 |
| 9 | 0 | 1 | 1 | 0 | 0 | 1 |
| 10 | 0 | 1 | 1 | 0 | 1 | 0 |
| 11 | 0 | 1 | 1 | 1 | 1 | 0 |
| 12 | 0 | 1 | 1 | 1 | 0 | 1 |
| 13 | 0 | 1 | 0 | 1 | 0 | 1 |
| 14 | 0 | 1 | 0 | 1 | 1 | 0 |
| 15 | 0 | 1 | 0 | 0 | 1 | 0 |
| 16 | 0 | 1 | 0 | 0 | 0 | 1 |
| 17 | 1 | 1 | 1 | 1 | 1 | 1 |

FIG. 33A

| No. | DA5 | DB5 | DA4 | DB4 | DA3 | DB3 | DA2 | DB2 | DA1 | DB1 | DA0 | DB0 |
|---|---|---|---|---|---|---|---|---|---|---|---|---|
| 1  | 0 | 0 | 0 | 0 | 0 | 0 | 0 | 0 | 0 | 0 | 0 | 0 |
| 2  | 0 | 0 | 0 | 0 | 0 | 0 | 0 | 0 | 0 | 0 | 0 | 1 |
| 3  | 0 | 0 | 0 | 0 | 0 | 0 | 0 | 0 | 0 | 0 | 1 | 0 |
| 4  | 0 | 0 | 0 | 0 | 0 | 0 | 0 | 0 | 0 | 1 | 0 | 0 |
| 5  | 0 | 0 | 0 | 0 | 0 | 0 | 0 | 0 | 1 | 0 | 0 | 0 |
| 6  | 0 | 0 | 0 | 0 | 0 | 0 | 0 | 0 | 0 | 1 | 0 | 1 |
| 7  | 0 | 0 | 0 | 0 | 0 | 0 | 0 | 0 | 1 | 0 | 1 | 0 |
| 8  | 0 | 0 | 0 | 0 | 0 | 0 | 0 | 1 | 0 | 0 | 0 | 0 |
| 9  | 0 | 0 | 0 | 0 | 0 | 0 | 1 | 0 | 0 | 0 | 0 | 0 |
| 10 | 0 | 0 | 0 | 0 | 0 | 0 | 0 | 1 | 0 | 0 | 0 | 1 |
| 11 | 0 | 0 | 0 | 0 | 0 | 0 | 1 | 0 | 0 | 0 | 1 | 0 |
| 12 | 0 | 0 | 0 | 0 | 0 | 0 | 0 | 1 | 0 | 1 | 0 | 0 |
| 13 | 0 | 0 | 0 | 0 | 0 | 0 | 1 | 0 | 1 | 0 | 0 | 0 |
| 14 | 0 | 0 | 0 | 0 | 0 | 0 | 0 | 1 | 0 | 1 | 0 | 1 |
| 15 | 0 | 0 | 0 | 0 | 0 | 0 | 1 | 0 | 1 | 0 | 1 | 0 |
| 16 | 0 | 0 | 0 | 0 | 0 | 1 | 0 | 0 | 0 | 0 | 0 | 0 |
| 17 | 0 | 0 | 0 | 0 | 1 | 0 | 0 | 0 | 0 | 0 | 0 | 0 |
| 18 | 0 | 0 | 0 | 0 | 0 | 1 | 0 | 0 | 0 | 0 | 0 | 1 |
| 19 | 0 | 0 | 0 | 0 | 1 | 0 | 0 | 0 | 0 | 0 | 1 | 0 |
| 20 | 0 | 0 | 0 | 0 | 0 | 1 | 0 | 0 | 0 | 1 | 0 | 0 |
| 21 | 0 | 0 | 0 | 0 | 1 | 0 | 0 | 0 | 1 | 0 | 0 | 0 |
| 22 | 0 | 0 | 0 | 0 | 0 | 1 | 0 | 0 | 0 | 1 | 0 | 1 |
| 23 | 0 | 0 | 0 | 0 | 1 | 0 | 0 | 0 | 1 | 0 | 1 | 0 |
| 24 | 0 | 0 | 0 | 0 | 0 | 1 | 0 | 1 | 0 | 0 | 0 | 0 |
| 25 | 0 | 0 | 0 | 0 | 1 | 0 | 1 | 0 | 0 | 0 | 0 | 0 |
| 26 | 0 | 0 | 0 | 0 | 0 | 1 | 0 | 1 | 0 | 0 | 0 | 1 |
| 27 | 0 | 0 | 0 | 0 | 1 | 0 | 1 | 0 | 0 | 0 | 1 | 0 |
| 28 | 0 | 0 | 0 | 0 | 0 | 1 | 0 | 1 | 0 | 1 | 0 | 0 |
| 29 | 0 | 0 | 0 | 0 | 1 | 0 | 1 | 0 | 1 | 0 | 0 | 0 |
| 30 | 0 | 0 | 0 | 0 | 0 | 1 | 0 | 1 | 0 | 1 | 0 | 1 |
| 31 | 0 | 0 | 0 | 0 | 1 | 0 | 1 | 0 | 1 | 0 | 1 | 0 |
| 32 | 0 | 0 | 0 | 1 | 0 | 0 | 0 | 0 | 0 | 0 | 0 | 0 |

FIG. 33B

| No. | DA5 | DB5 | DA4 | DB4 | DA3 | DB3 | DA2 | DB2 | DA1 | DB1 | DA0 | DB0 |
|---|---|---|---|---|---|---|---|---|---|---|---|---|
| 33 | 0 | 0 | 1 | 0 | 0 | 0 | 0 | 0 | 0 | 0 | 0 | 0 |
| 34 | 0 | 0 | 0 | 1 | 0 | 0 | 0 | 0 | 0 | 0 | 0 | 1 |
| 35 | 0 | 0 | 1 | 0 | 0 | 0 | 0 | 0 | 0 | 0 | 1 | 0 |
| 36 | 0 | 0 | 0 | 1 | 0 | 0 | 0 | 0 | 0 | 1 | 0 | 0 |
| 37 | 0 | 0 | 1 | 0 | 0 | 0 | 0 | 0 | 1 | 0 | 0 | 0 |
| 38 | 0 | 0 | 0 | 1 | 0 | 0 | 0 | 0 | 0 | 1 | 0 | 1 |
| 39 | 0 | 0 | 1 | 0 | 0 | 0 | 0 | 0 | 1 | 0 | 1 | 0 |
| 40 | 0 | 0 | 0 | 1 | 0 | 0 | 0 | 1 | 0 | 0 | 0 | 0 |
| 41 | 0 | 0 | 1 | 0 | 0 | 0 | 1 | 0 | 0 | 0 | 0 | 0 |
| 42 | 0 | 0 | 0 | 1 | 0 | 0 | 0 | 1 | 0 | 0 | 0 | 1 |
| 43 | 0 | 0 | 1 | 0 | 0 | 0 | 1 | 0 | 0 | 0 | 1 | 0 |
| 44 | 0 | 0 | 0 | 1 | 0 | 0 | 0 | 1 | 0 | 1 | 0 | 0 |
| 45 | 0 | 0 | 1 | 0 | 0 | 0 | 1 | 0 | 1 | 0 | 0 | 0 |
| 46 | 0 | 0 | 0 | 1 | 0 | 0 | 0 | 1 | 0 | 1 | 0 | 1 |
| 47 | 0 | 0 | 1 | 0 | 0 | 0 | 1 | 0 | 1 | 0 | 1 | 0 |
| 48 | 0 | 0 | 0 | 1 | 0 | 1 | 0 | 0 | 0 | 0 | 0 | 0 |
| 49 | 0 | 0 | 1 | 0 | 1 | 0 | 0 | 0 | 0 | 0 | 0 | 0 |
| 50 | 0 | 0 | 0 | 1 | 0 | 1 | 0 | 0 | 0 | 0 | 0 | 1 |
| 51 | 0 | 0 | 1 | 0 | 1 | 0 | 0 | 0 | 0 | 0 | 1 | 0 |
| 52 | 0 | 0 | 0 | 1 | 0 | 1 | 0 | 0 | 0 | 1 | 0 | 0 |
| 53 | 0 | 0 | 1 | 0 | 1 | 0 | 0 | 0 | 1 | 0 | 0 | 0 |
| 54 | 0 | 0 | 0 | 1 | 0 | 1 | 0 | 0 | 0 | 1 | 0 | 1 |
| 55 | 0 | 0 | 1 | 0 | 1 | 0 | 0 | 0 | 1 | 0 | 1 | 0 |
| 56 | 0 | 0 | 0 | 1 | 0 | 1 | 0 | 1 | 0 | 0 | 0 | 0 |
| 57 | 0 | 0 | 1 | 0 | 1 | 0 | 1 | 0 | 0 | 0 | 0 | 0 |
| 58 | 0 | 0 | 0 | 1 | 0 | 1 | 0 | 1 | 0 | 0 | 0 | 1 |
| 59 | 0 | 0 | 1 | 0 | 1 | 0 | 1 | 0 | 0 | 0 | 1 | 0 |
| 60 | 0 | 0 | 0 | 1 | 0 | 1 | 0 | 1 | 0 | 1 | 0 | 0 |
| 61 | 0 | 0 | 1 | 0 | 1 | 0 | 1 | 0 | 1 | 0 | 0 | 0 |
| 62 | 0 | 0 | 0 | 1 | 0 | 1 | 0 | 1 | 0 | 1 | 0 | 1 |
| 63 | 0 | 0 | 1 | 0 | 1 | 0 | 1 | 0 | 1 | 0 | 1 | 0 |
| 64 | 0 | 1 | 0 | 0 | 0 | 0 | 0 | 0 | 0 | 0 | 0 | 0 |

FIG. 35A

| No. | DB0 | DA0 | DB1 | DA1 | DB2 | DA2 | DB3 | DA3 | DB4 | DA4 | DB5 | DA5 |
|---|---|---|---|---|---|---|---|---|---|---|---|---|
| 1 | 0 | 0 | 0 | 0 | 0 | 0 | 0 | 0 | 0 | 0 | 0 | 0 |
| 2 | 1 | 0 | 0 | 0 | 0 | 0 | 0 | 0 | 0 | 0 | 0 | 0 |
| 3 | 0 | 1 | 0 | 0 | 0 | 0 | 0 | 0 | 0 | 0 | 0 | 0 |
| 4 | 0 | 0 | 1 | 0 | 0 | 0 | 0 | 0 | 0 | 0 | 0 | 0 |
| 5 | 0 | 0 | 1 | 0 | 0 | 0 | 0 | 0 | 0 | 0 | 0 | 0 |
| 6 | 1 | 0 | 0 | 0 | 0 | 0 | 0 | 0 | 0 | 0 | 0 | 0 |
| 7 | 0 | 1 | 0 | 1 | 0 | 0 | 0 | 0 | 0 | 0 | 0 | 0 |
| 8 | 0 | 0 | 0 | 0 | 1 | 0 | 0 | 0 | 0 | 0 | 0 | 0 |
| 9 | 0 | 0 | 0 | 0 | 1 | 0 | 0 | 0 | 0 | 0 | 0 | 0 |
| 10 | 1 | 0 | 0 | 0 | 0 | 0 | 0 | 0 | 0 | 0 | 0 | 0 |
| 11 | 0 | 1 | 1 | 0 | 0 | 1 | 0 | 0 | 0 | 0 | 0 | 0 |
| 12 | 0 | 0 | 1 | 0 | 0 | 0 | 0 | 0 | 0 | 0 | 0 | 0 |
| 13 | 0 | 0 | 0 | 0 | 1 | 0 | 0 | 0 | 0 | 0 | 0 | 0 |
| 14 | 1 | 0 | 0 | 0 | 0 | 1 | 0 | 0 | 0 | 0 | 0 | 0 |
| 15 | 0 | 1 | 0 | 1 | 0 | 0 | 0 | 0 | 0 | 0 | 0 | 0 |
| 16 | 0 | 0 | 0 | 0 | 0 | 0 | 1 | 0 | 0 | 0 | 0 | 0 |
| 17 | 0 | 0 | 0 | 0 | 0 | 0 | 1 | 0 | 0 | 0 | 0 | 0 |
| 18 | 1 | 0 | 0 | 0 | 0 | 0 | 1 | 0 | 0 | 0 | 0 | 0 |
| 19 | 0 | 1 | 0 | 0 | 0 | 0 | 0 | 1 | 0 | 0 | 0 | 0 |
| 20 | 0 | 0 | 1 | 0 | 0 | 0 | 1 | 0 | 0 | 0 | 0 | 0 |
| 21 | 0 | 0 | 1 | 0 | 0 | 0 | 0 | 1 | 0 | 0 | 0 | 0 |
| 22 | 1 | 0 | 0 | 0 | 0 | 0 | 1 | 0 | 0 | 0 | 0 | 0 |
| 23 | 0 | 1 | 0 | 1 | 0 | 0 | 0 | 1 | 0 | 0 | 0 | 0 |
| 24 | 0 | 0 | 0 | 0 | 1 | 0 | 1 | 0 | 0 | 0 | 0 | 0 |
| 25 | 0 | 0 | 0 | 0 | 1 | 0 | 0 | 1 | 0 | 0 | 0 | 0 |
| 26 | 1 | 0 | 0 | 0 | 0 | 1 | 1 | 0 | 0 | 0 | 0 | 0 |
| 27 | 0 | 1 | 1 | 0 | 0 | 0 | 0 | 1 | 0 | 0 | 0 | 0 |
| 28 | 0 | 0 | 1 | 0 | 0 | 1 | 1 | 0 | 0 | 0 | 0 | 0 |
| 29 | 0 | 0 | 0 | 0 | 1 | 0 | 0 | 1 | 0 | 0 | 0 | 0 |
| 30 | 1 | 0 | 0 | 0 | 0 | 1 | 1 | 0 | 0 | 0 | 0 | 0 |
| 31 | 0 | 1 | 0 | 1 | 0 | 0 | 0 | 0 | 0 | 0 | 0 | 0 |
| 32 | 0 | 0 | 0 | 0 | 0 | 0 | 0 | 0 | 1 | 0 | 0 | 0 |

FIG. 35B

| No. | DA5 | DB5 | DA4 | DB4 | DA3 | DB3 | DA2 | DB2 | DA1 | DB1 | DA0 | DB0 |
|---|---|---|---|---|---|---|---|---|---|---|---|---|
| 33 | 0 | 0 | 0 | 1 | 0 | 0 | 0 | 0 | 0 | 0 | 0 | 0 |
| 34 | 0 | 0 | 0 | 1 | 0 | 0 | 0 | 0 | 0 | 0 | 0 | 1 |
| 35 | 0 | 0 | 1 | 0 | 0 | 0 | 0 | 0 | 0 | 0 | 1 | 0 |
| 36 | 0 | 0 | 0 | 1 | 0 | 0 | 0 | 0 | 0 | 1 | 0 | 0 |
| 37 | 0 | 0 | 1 | 0 | 0 | 0 | 0 | 0 | 0 | 1 | 0 | 0 |
| 38 | 0 | 0 | 0 | 1 | 0 | 0 | 0 | 0 | 0 | 0 | 0 | 1 |
| 39 | 0 | 0 | 1 | 0 | 0 | 0 | 0 | 1 | 0 | 0 | 0 | 0 |
| 40 | 0 | 0 | 0 | 1 | 0 | 0 | 0 | 1 | 0 | 0 | 1 | 0 |
| 41 | 0 | 0 | 1 | 0 | 0 | 0 | 0 | 1 | 0 | 0 | 0 | 0 |
| 42 | 0 | 0 | 0 | 1 | 0 | 0 | 0 | 0 | 1 | 0 | 0 | 1 |
| 43 | 0 | 0 | 1 | 0 | 0 | 0 | 1 | 1 | 0 | 0 | 0 | 0 |
| 44 | 0 | 0 | 0 | 1 | 0 | 0 | 0 | 0 | 0 | 1 | 0 | 0 |
| 45 | 0 | 0 | 1 | 0 | 0 | 0 | 1 | 1 | 0 | 1 | 0 | 0 |
| 46 | 0 | 0 | 0 | 1 | 0 | 0 | 0 | 0 | 0 | 0 | 0 | 1 |
| 47 | 0 | 0 | 1 | 0 | 0 | 0 | 0 | 0 | 0 | 0 | 1 | 0 |
| 48 | 0 | 0 | 0 | 1 | 0 | 1 | 0 | 0 | 0 | 0 | 0 | 0 |
| 49 | 0 | 0 | 1 | 0 | 0 | 1 | 0 | 0 | 0 | 0 | 0 | 1 |
| 50 | 0 | 0 | 0 | 1 | 0 | 1 | 0 | 0 | 0 | 0 | 1 | 0 |
| 51 | 0 | 0 | 1 | 0 | 1 | 0 | 0 | 0 | 0 | 1 | 0 | 0 |
| 52 | 0 | 0 | 0 | 1 | 0 | 1 | 0 | 0 | 0 | 1 | 0 | 0 |
| 53 | 0 | 0 | 1 | 0 | 1 | 0 | 0 | 0 | 0 | 0 | 0 | 1 |
| 54 | 0 | 0 | 0 | 1 | 0 | 1 | 0 | 1 | 0 | 0 | 0 | 0 |
| 55 | 0 | 0 | 1 | 0 | 1 | 0 | 0 | 1 | 0 | 0 | 1 | 0 |
| 56 | 0 | 0 | 0 | 1 | 0 | 1 | 0 | 1 | 0 | 0 | 0 | 0 |
| 57 | 0 | 0 | 1 | 0 | 1 | 0 | 0 | 0 | 1 | 0 | 0 | 1 |
| 58 | 0 | 0 | 0 | 1 | 0 | 1 | 1 | 1 | 0 | 0 | 0 | 0 |
| 59 | 0 | 0 | 1 | 0 | 1 | 0 | 0 | 0 | 0 | 1 | 0 | 0 |
| 60 | 0 | 0 | 0 | 1 | 0 | 1 | 1 | 1 | 0 | 1 | 0 | 0 |
| 61 | 0 | 0 | 1 | 0 | 1 | 0 | 0 | 0 | 0 | 0 | 0 | 1 |
| 62 | 0 | 0 | 0 | 0 | 1 | 0 | 0 | 0 | 0 | 0 | 1 | 0 |
| 63 | 0 | 0 | 1 | 0 | 0 | 0 | 0 | 0 | 0 | 0 | 0 | 0 |
| 64 | 0 | 1 | 0 | 0 | 0 | 0 | 0 | 0 | 0 | 0 | 0 | 0 |

FULL FLASH ANALOG-TO-DIGITAL CONVERTER

BACKGROUND OF THE INVENTION

1. Field of the Invention

The present invention relates to a full flash analog-to-digital (A/D) converter, and more particularly to a full flash A/D converter which can suitably designed as an LSIC (Large Scale Integrated Circuit) and can convert a high-definition television signal of 50 MHz or higher frequencies into a digital signal at high speed.

2. Description of the Prior Art

One conventional flash A/D converter will be described below with reference to FIGS. 1 through 5 of the accompanying drawings.

Japanese Laid-Open Patent Publication No. 62(1987)-32724, for example, discloses a flash A/D converter which can operate at high speed while suppressing digital error.

FIG. 1 schematically shows such a flash A/D converter which includes a reference voltage divider 1 comprising a plurality of series-connected resistors having equal resistances, the resistors being connected between terminals Vra, Vrb to which there are applied voltages that differ from each other by a predetermined potential. The reference voltage divider 1 has $2^n$ reference potential points VR1 through VRx positioned between the resistors and connected respectively to $2^n$ comparators of a comparator group 2, in which the voltages at the reference potential points VR1 through VRx are compared with an analog input signal supplied from an input terminal Vin. The output signal from the comparator group 2 is supplied through an AND gate group 3 to two encoders 4, 5 by which the output signal is converted into a digital signal depending on the level of the analog input signal.

It is assumed that the flash A/D converter is an 8-bit A/D converter. It has 256 comparators divided into four blocks and 256 AND gates divided into four blocks. As shown in FIG. 2A, each of the AND gate blocks 3e through 3t has 64 AND gates A1 through A64. The output signals from comparators C1 through C64 (not shown) are supplied through respective input terminals #1 through #64 to double-phase buffers P1 through P64 which produce two output signals in normal and opposite phases. For example, each AND gate Ai of the second AND gate block 3B is supplied with a normal-phase output signal from a buffer Pi and an on opposite-phase output signal from a buffer Pi+1. The polarities of the input terminals of the comparators are opposite to those shown in FIG. 1. The output signals from the AND gates A1 through A64 are supplied through distribution amplifiers B1 through B64 to wired-OR (WOR) circuits on 7 bit lines SUP, D5 through D0 of a second first-stage encoder block 4B. Each WOR circuit comprises switching transistors, for example, and the WOR circuits are arranged as indicated at "1" in the connection diagram of FIG. 2B.

As shown in FIG. 2A, every four AND gates make up one unit, and D5 through D2 bits of low-order 6 bits of each of the units are shared by four AND gates. The highest-order bit line SUP of the encoder block 4B is supplied with a highest-order-bit output signal from each of three AND gates A1 through A3 and three AND gates A30 through A32 of the first and eighth units 3e, 3l of the second through fourth AND gate blocks 3b through 3h.

Third and fourth encoder blocks 4C, 4D are also of the same construction. In a first encoder block 4A, no WOR circuit is arranged on the line SUP, and each WOR circuit is arranged on the six bit lines D5 though D0. In FIG. 2B, the WOR circuits on the line SUP are indicated at "1*".

FIG. 3 shows another conventional flash A/D converter. As shown in FIG. 3, 6-bit output signals D5 through D0 from the first-stage encoder blocks 4A through 4D are supplied through error inhibiting circuits 6A through 6D each composed of AND gates and inverters, to low-order bit lines D5 through D0 of the second-stage encoder 5, and output signals D5 through D0 from the second through fourth encoder blocks 4B through 4D are supplied to high-order bit lines D7, D6. The high-order bit lines D7, D6 are also supplied with highest-order-bit output signals SUP from the encoder blocks 4B through 4D, generating high-order 2 bits D7, D6.

Output signals SUP, D5 through D0 from the third encoder block 4C (not shown) are supplied to the highest-order bit line D7.

The output signal SUP from the first encoder block 4A is used as an overflow signal. The output signals SUP from the second through fourth encoder blocks 4B through 4D are supplied to the corresponding error inhibiting circuits 6B through 6D and also to the adjacent error inhibiting circuits 6A through 6C.

Output signals from the bit lines D7 through D0 of the encoder 5 are transmitted to respective output terminals through an output inverting circuit 7 which comprises exclusive-OR gates.

In the above conventional flash A/D converter, when an input voltage Vin is applied, the output signals from the first to ith comparators go high, and the output signals from the (i+1)th to last comparators go low, with only the output signal from the ith AND gate at a level changing point being high. The high output signal from the ith AND gate is supplied to the encoders, which then generates a binary code corresponding to the level changing point.

When the slew rate of the input signal Vin is high, since the comparators cannot switch synchronously with the input signal, the H and L levels may have an irregular distribution such as:

... H H L H* L L L ...

in the vicinity of the level changing point in the array of the comparators. If a binary code of such an irregular level pattern were supplied to the AND gate group 3, because 2 "H"s are applied to the encoder 4, a very large error (sparkle) would be produced depending on the location where such an irregular pattern occurs. If the error pattern H* is caused between 7F and 80 of a hexadecimal notation, then "FF" will be outputted.

To prevent such an error from taking place, the output signals SUP of the second through fourth encoder blocks 4B through 4D are supplied to the error inhibiting circuits 6A through 6D.

For example, as shown in FIG. 4, in the event an irregular pattern is produced in the vicinity of a point where the D5 bit changes in one AND gate block, and the output signals from the AND gates A31, A32 become H, H*, respectively, the output codes produced by the AND gates A31, A33 are as follows:

|  | D5      D0 |
|---|---|
| Output code produced by AND gate A31: | 011110 |
| Output code produced by AND gate A33: | 100000. |

The D5 bit is inhibited by the WOR circuits on the line SUP, and the proper output code "011110" is produced, inhibiting an error of 16 LSB or higher. Errors with respect to the low-order 6 bits D4 through D0 are also inhibited.

Furthermore, as shown in FIG. 5, if an irregular pattern is produced between adjacent AND blocks 3A, 3B, and the output signals from the AND gates A63, A1 become H, H*, respectively, then the six low-order bits D5 through D0 of the AND gate block 3A are inhibited. When the irregular pattern does not exceed 32 LSB, the high-order bits D7, D6 are also inhibited.

With the conventional A/D converter, all the output signals from the six low-order bits plus 1 bit are wired-ORed in order to produce two high-order bits. Therefore, the number of sources of the WOR circuits on the high-order bit lines D7, D6 of the second-stage encoder 5 amounts to 16. In the first-stage encoder blocks 4A through 4D, the number of sources of the WOR circuits on the 6 bit lines D5 through D0 also amount to 32. Since the output logic amplitude of the emitters of the WOR circuits is smaller than the input logic amplitude of the bases thereof, a large amplitude is necessary to drive each of the WOR circuits, and the time required to reach a desired amplitude is prolonged.

The load electrostatic capacitance of the highest-order bit line SUP of each of the first-stage encoder blocks 4A through 4D is much greater than that of the other bit lines, it lowers the limit for a delay, i.e., a processing speed.

OBJECTS AND SUMMARY OF THE INVENTION

It is a first object of the present invention to provide a full flash A/D converter which has simplified encoders and can inhibit the generation of a digital error (sparkle).

A second object of the present invention is to provide a full flash A/D converter in which encoders generate a complement bit of a second low-order bit, and the complement bit and the second low-order bit are ANDed to detect, with ease, a particular error pattern that is applied to the encoders, without an increase in a delay time.

A third object of the present invention is to provide a full flash A/D converter which can detect a particular error pattern that is applied to the encoders, without an increase in a delay time.

A fourth object of the present invention is to provide a full flash A/D converter which has encoders for generating odd and even parity bits for a plurality of information bit signals, and an error detecting circuit for effecting parity check on the information bits using the parity bits, for easily detecting a particular error pattern applied to the encoders.

A fifth object of the present invention is to provide a full flash A/D converter which can easily detect a particular error pattern or a bit-random error applied to encoders and also correct such an error.

A sixth object of the present invention is to provide a full flash A/D converter which is capable of high-speed operation with a reduced number of added elements, and also of inhibiting a sparkle error caused by a metastable condition of comparators.

A seventh object of the present invention is to provide a full flash A/D converter which is simple in arrangement and can inhibit a glitch (digital error) that is produced in an encoder for encoding a supplied signal into a binary code.

According to the present invention, there is provided a full flash analog-to-digital converter comprising a plurality of comparators for comparing an analog input voltage with respective reference voltages, a first-stage encoder for generating low-order bits based on output signals from the comparators, and a second-stage encoder for generating high-order bits based on the low-order bits generated by the first-stage encoder, the first-stage encoder comprising means for generating a complement bit of the highest-order bit of the low-order bits generated by the first-stage encoder, the second-stage encoder comprising means for generating the high-order bits based on the highest-order bit and the complement bit.

According to the present invention, there is also provided a full flash analog-to-digital converter comprising a plurality of comparators for comparing an analog input voltage with respective reference voltages, an encoder for generating a plurality of bits based on output signals from the comparators, the encoder comprising means for generating an additional bit by ORing the AND logical product of complement bits of second and third low-order bits of the plurality of bits, and a complement bit of a first low-order bit of the plurality of bits, a logic circuit for ANDing the additional bit and a complement bit of the additional bit, and means for detecting an error pattern in the output signals from the comparators based on an output signal from the logic circuit.

According to the present invention, there is also provided a full flash analog-to-digital converter comprising a plurality of comparators for comparing an analog input voltage with respective reference voltages, and an encoder for generating a plurality of information bits based on output signals from the comparators, the encoder comprising means for generating a plurality of complement bit signals corresponding respectively to the information bits.

According to the present invention, there is further provided a full flash analog-to-digital converter comprising a plurality of comparators for comparing an analog input voltage with respective reference voltages, an encoder for generating a plurality of bits based on output signals from the comparators, the encoder comprising means for generating a complement bit of a second low-order bit of the plurality of bits, a logic circuit for ANDing the complement bit and the second low-order bit, and means for detecting an error pattern in the output signals from the comparators based on an output signal from the logic circuit.

According to the present invention, there is also provided a full flash analog-to-digital converter comprising a plurality of comparators for comparing an analog input voltage with respective reference voltages, an encoder for generating a plurality of information bits based on output signals from the comparators, the encoder comprising means for generating odd-and even-parity bits for the plurality of information bits, and an error detecting circuit for detecting an error pattern in the output signals from the comparators based on the odd- and even-parity bits and the information bits.

According to the present invention, there is also provided a full flash analog-to-digital converter comprising a plurality of comparators for comparing an analog input voltage with respective reference voltages, a differentiating circuit for detecting differences between output voltages from each one and every other one of the comparators, encoder means for generating a binary code based on an output signal from the differentiating circuit, the encoder means comprising a first encoder for generating an [m−1] binary code in response to a (2m−1)th output signal (m is a natural number) of the differentiating circuit, and a second encoder for generating an [m]binary code in response to a 2mth output signal from the differentiating circuit, and a combining circuit for combining output signals from the first and second encoders into a final binary code.

According to the present invention, there is further provided a full flash analog-to-digital converter comprising a plurality of comparators for comparing an analog input voltage with respective reference voltages, a differentiating circuit for detecting differences between output voltages from each one and every other one of the comparators, encoder means for generating a binary code based on an output signal from the differentiating circuit, the encoder means comprising a first encoder for generating an [m−1] binary code in response to a (2m−1)th output signal (m is a natural number) of the differentiating circuit, and a second encoder for generating an [m]binary code in response to a 2mth output signal from the differentiating circuit, and a combining circuit for combining output signals from the first and second encoders into a final binary code, the arrangement being such that when an ith bit (i is a natural number) as counted from the lowest-order bit of the binary code produced in response to the (2m−1)-th output signal from the differentiating circuit, and bits lower in order than the ith bit are "0" and also when an (i+1)th bit of the binary bit is "1", the (2m−1)th output signal from the differentiating circuit is supplied to an (i+1)th bit line of the second encoder rather than to an (i+1)th bit line of the first encoder.

According to the present invention, there is also provided a full flash analog-to-digital converter comprising first through Nth (N≧2) comparator blocks each comprising a plurality of comparators, a high-order bit encoder, a low-order bit encoder, a high-order bit control AND gate block connected to output terminals of predetermined ones of the comparators of the first through Nth comparator blocks, for selecting one of the comparator blocks depending on the level of an analog input signal applied thereto to control the high-order bit encoder and first through Nth low-order bit control AND gate blocks connected respectively to output terminals of the first through Nth comparator blocks, for controlling the low-order bit encoder.

The above and other objects, features, and advantages of the present invention will become apparent from the following detailed description of illustrative embodiments thereof to be read in conjunction with the accompanying drawings, in which like reference numerals represent the same or similar objects.

BRIEF DESCRIPTION OF THE DRAWINGS

FIG. 2B is a table showing connections in the portion shown in FIG. 2A;

FIG. 7B is a table showing connections in the circuit portion shown in FIG. 7A;

FIGS. 13A, 13B, 14A, and 14B are tables showing the manner in which the circuit portion shown in FIG. 12 operates;

FIGS. 16A, 16B, 17A, and 17B are tables showing the manner in which the circuit portion shown in FIG. 15 operates;

FIGS. 19A, 19B, 20A, and 20B are tables showing the manner in which the circuit portion shown in FIG. 18 operates;

FIGS. 25A, 25B, 26A, 26B, and 27 are tables showing the manner in which the error detecting and correcting circuits operate;

FIGS. 29A, 29B, and 29C are tables showing the manner in which the circuit portion shown in FIG. 28 operates;

FIGS. 31A, 32B, and 32C are tables showing the manner in which the circuit portion shown in FIG. 30 operates;

FIGS. 33A and 33B are tables showing the manner in which the circuit portion shown in FIG. 32 operates;

FIG. 35A and 35B are tables showing the manner in which the circuit portion shown in FIG. 34 operates;

DETAILED DESCRIPTION OF THE PREFERRED EMBODIMENTS

Figure 1:
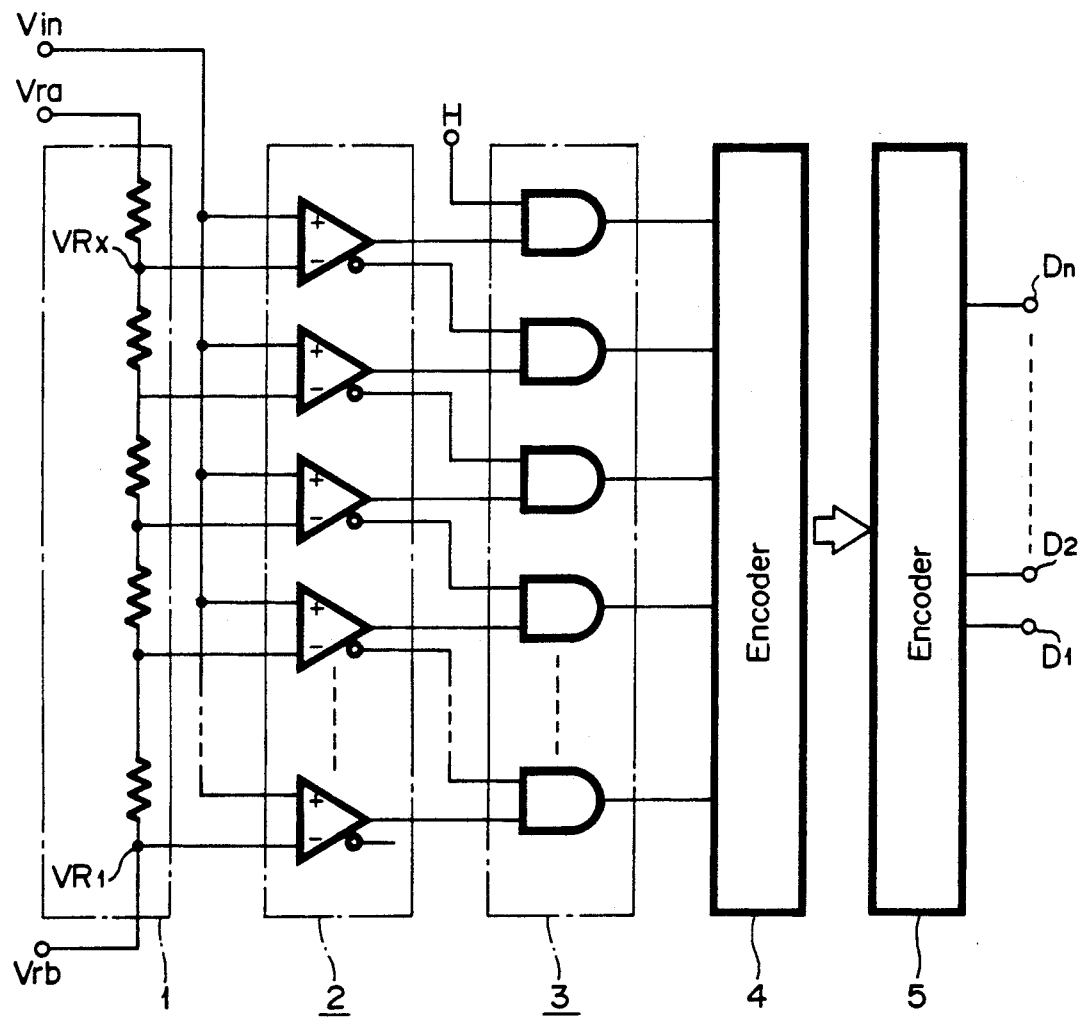
FIG. 1 is a block diagram of a conventional flash A/D converter.
Figure 2A:
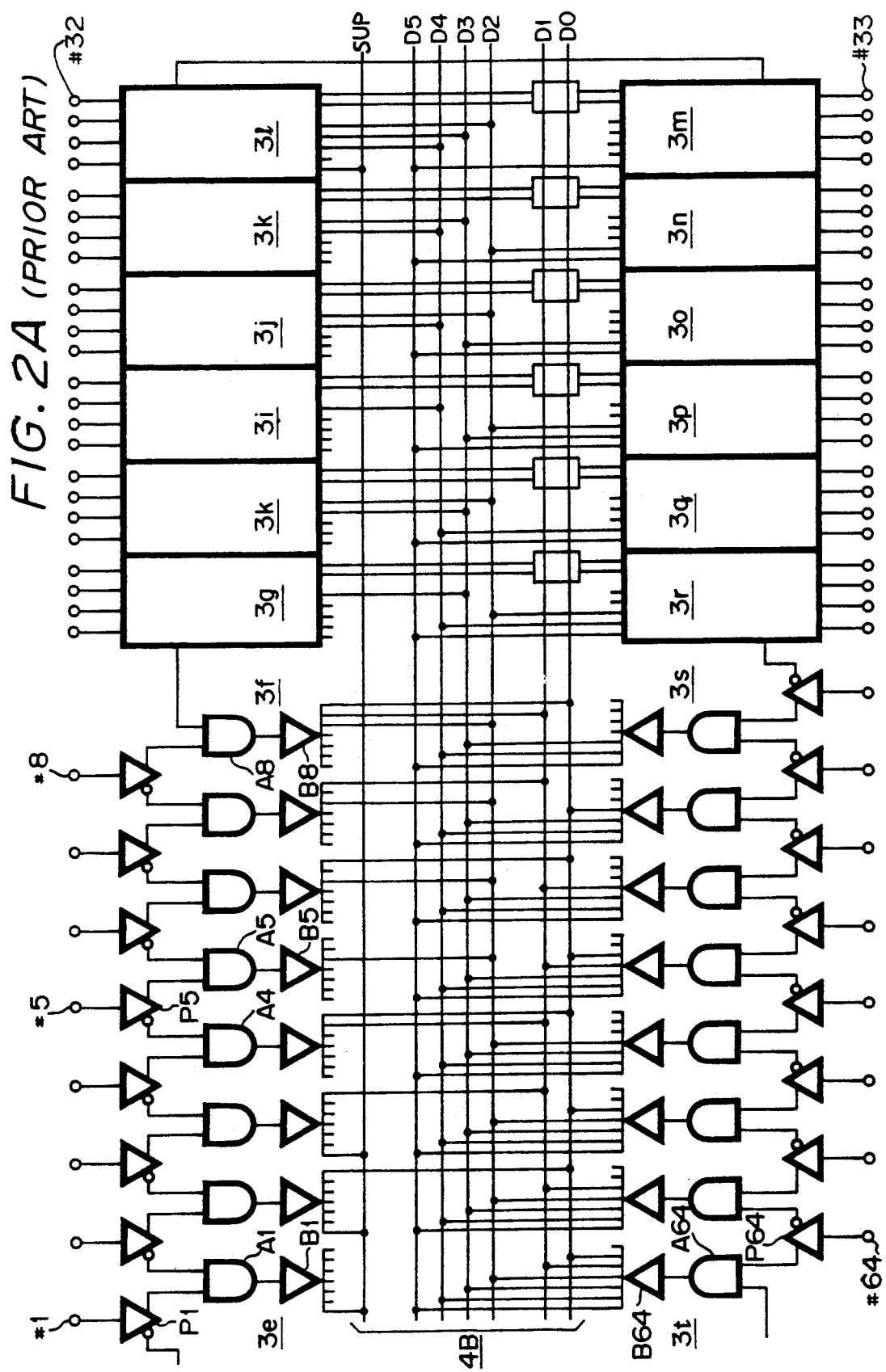
FIG. 2A is a block diagram of a portion of the A/D converter shown in FIG. 1.
Figure 3:
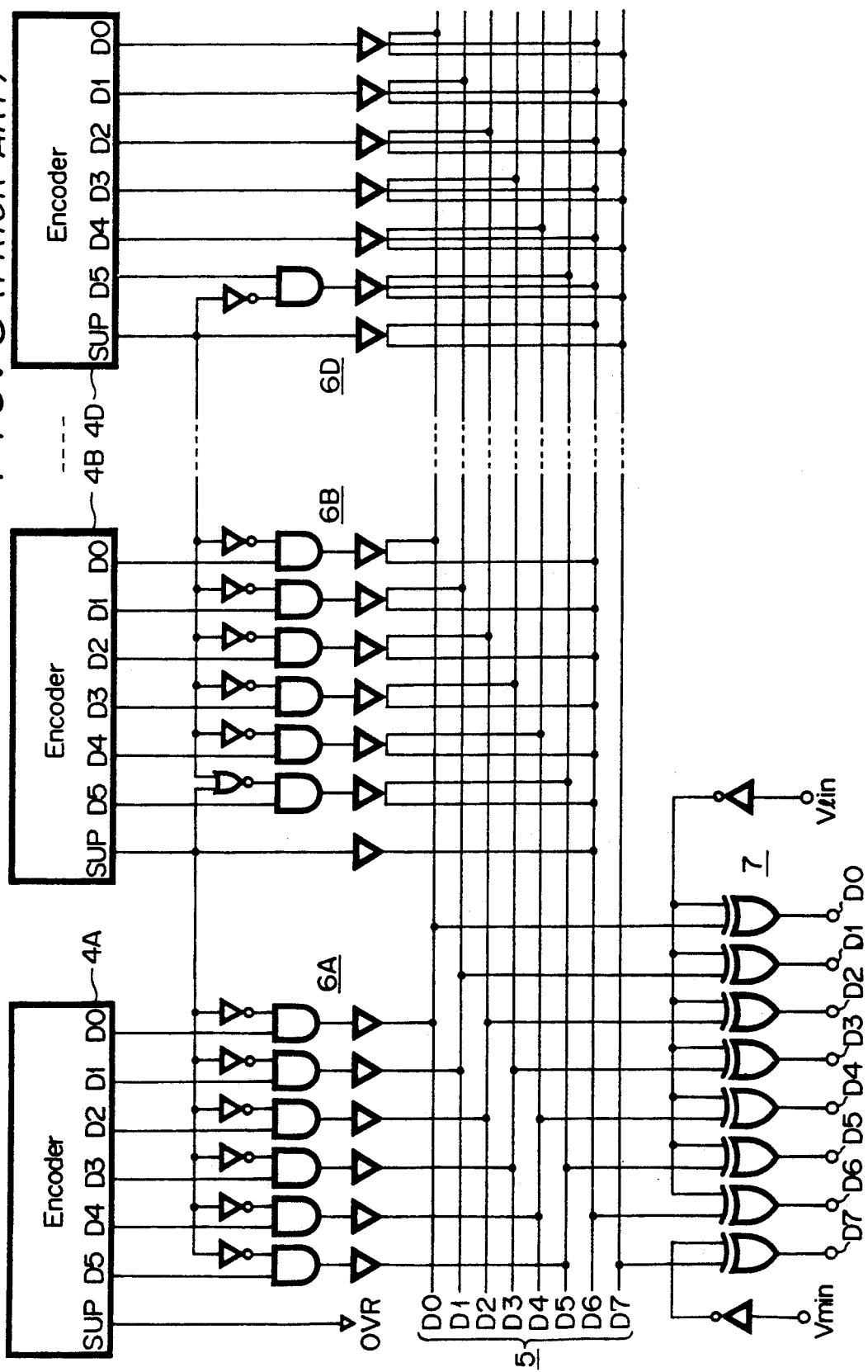
FIG. 3 is a block diagram of a portion of another conventional flash A/D converter.
Figure 4:
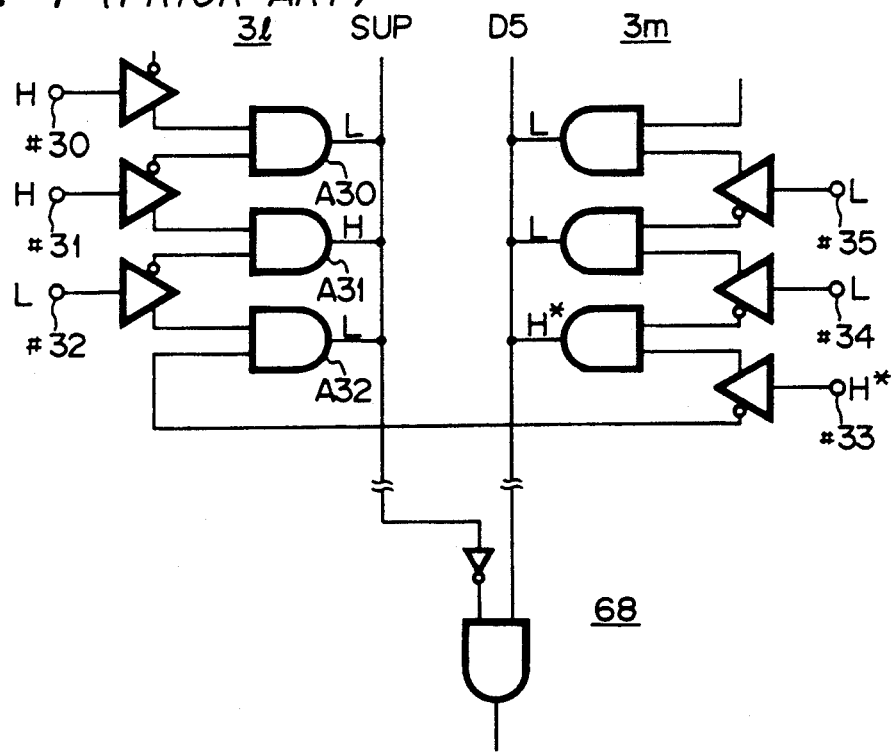
FIGS. 4 and 5 are block diagrams showing the manner in which the circuit portion shown in FIG. 3 operates.
Figure 5:
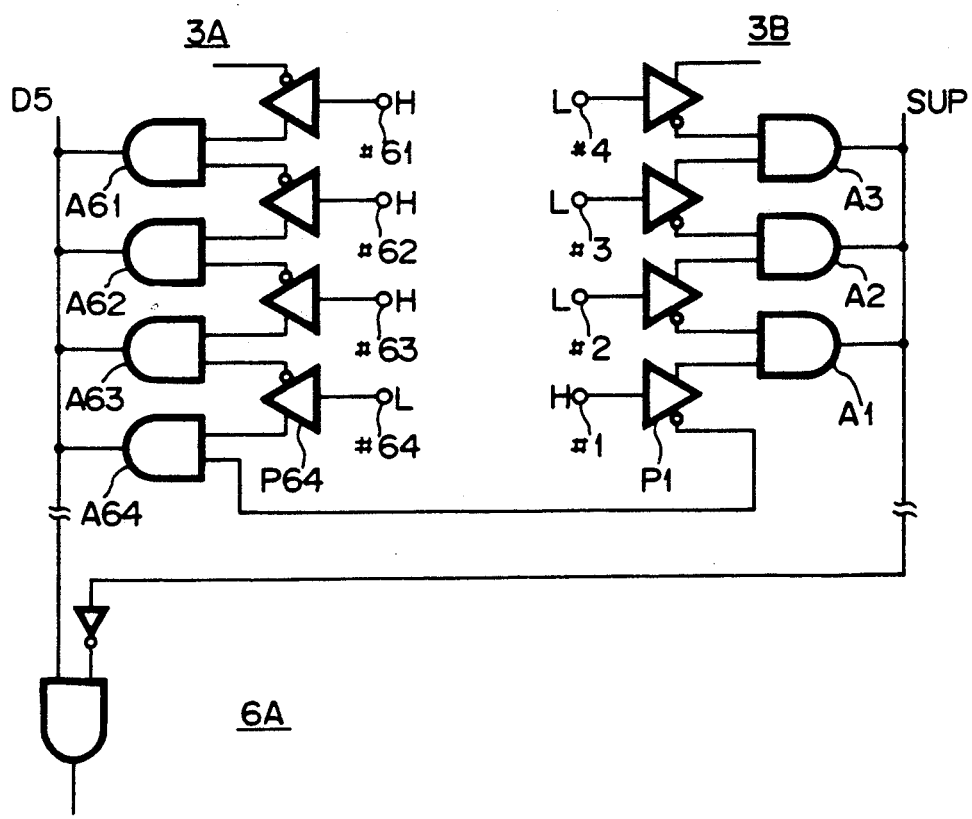
Figure 6:
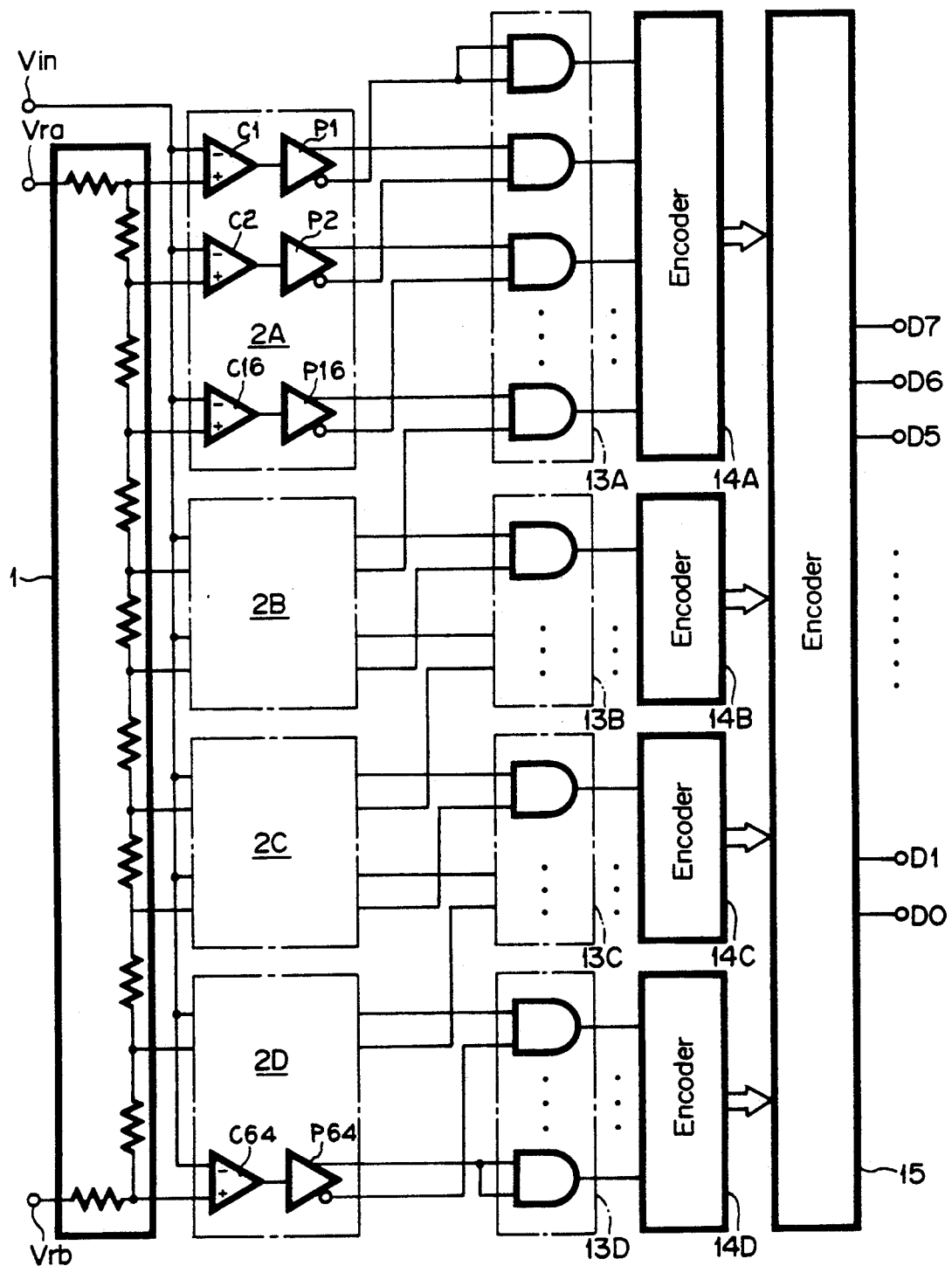
FIG. 6 is a block diagram of a full flash A/D converter according to a first embodiment of the present invention.
Figure 7A:
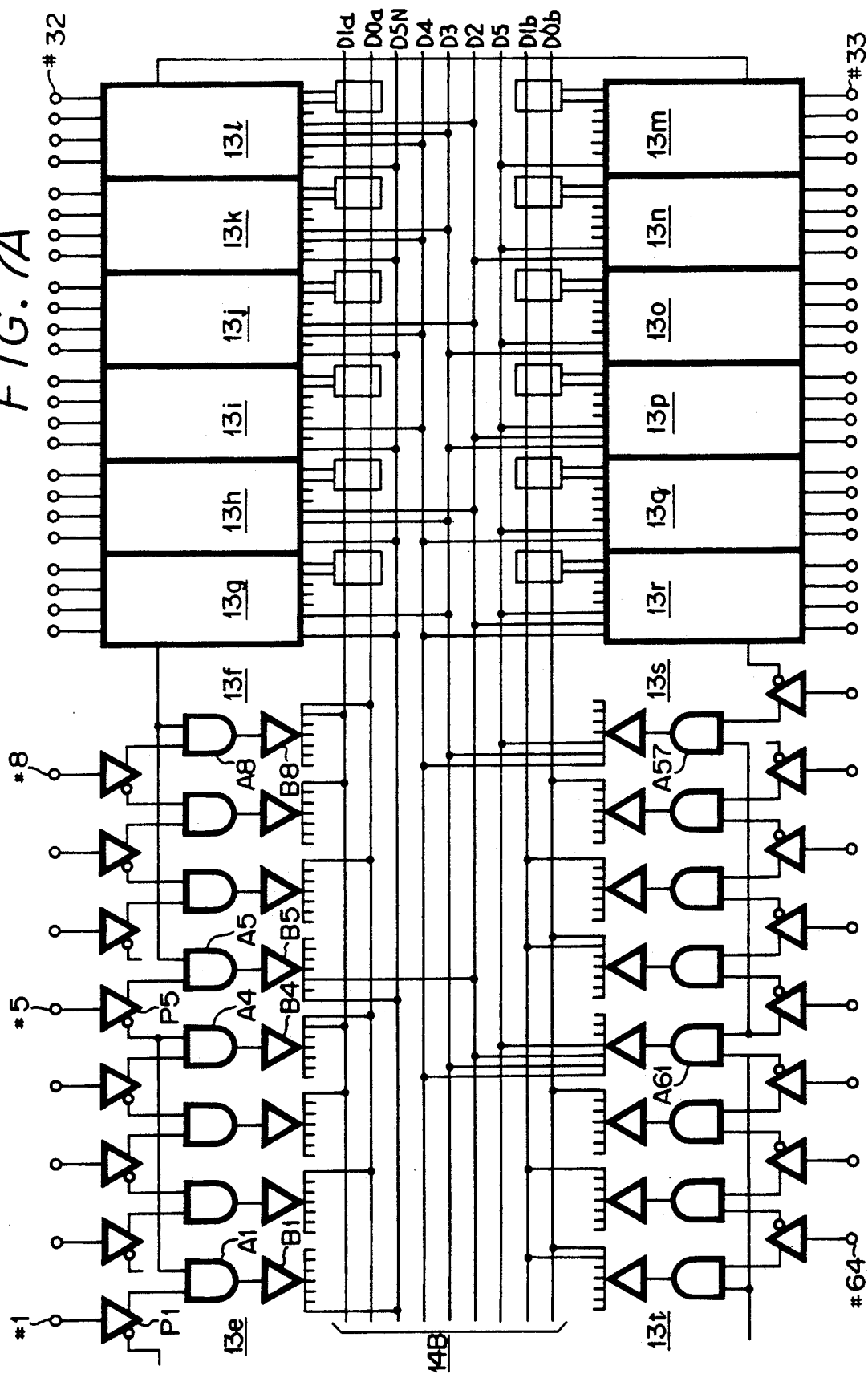
FIG. 7A is a block diagram of a portion of the A/D converter shown in FIG. 6.
Figure 8:
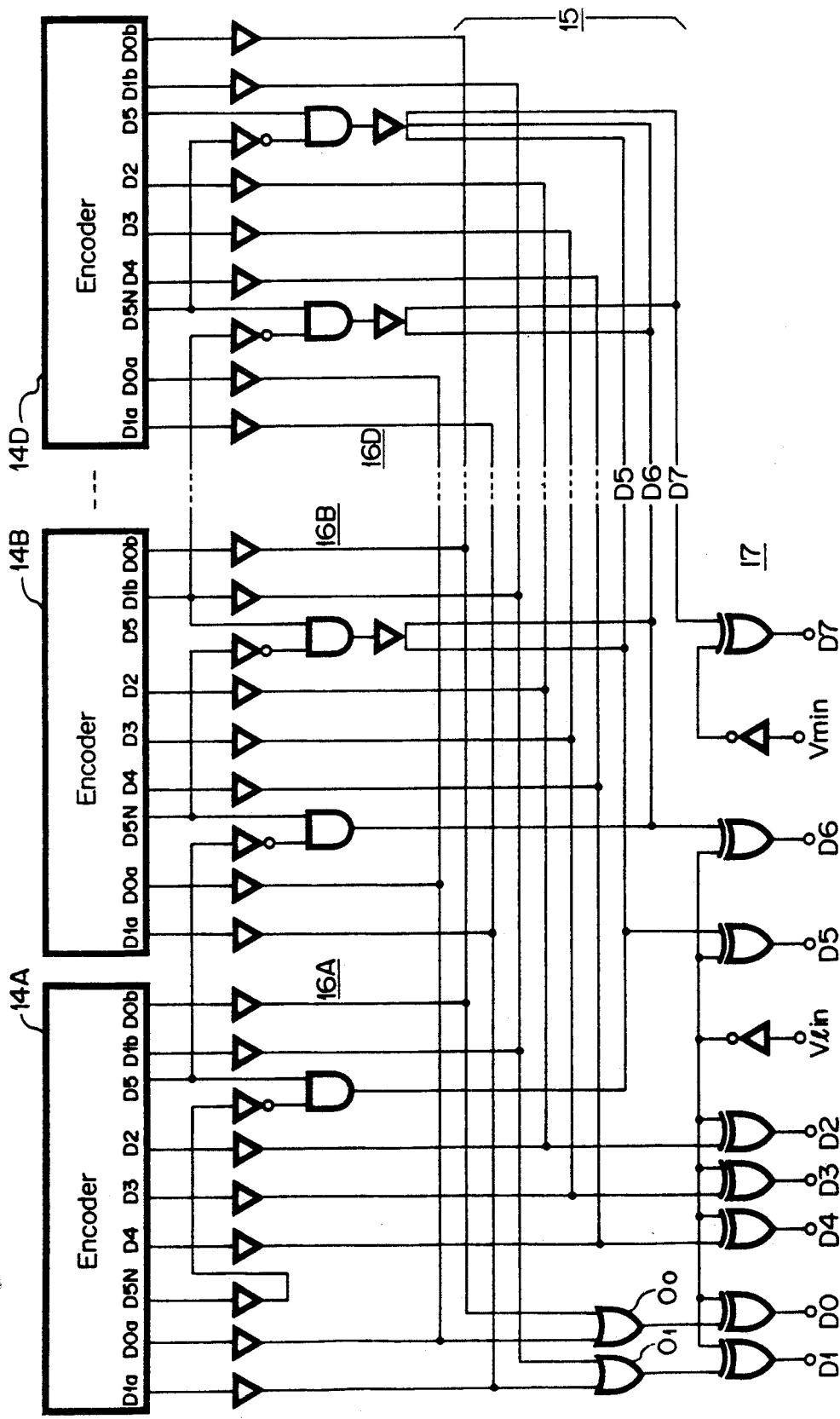
FIG. 8 is a block diagram of another portion of the A/D converter shown in FIG. 6.

FIG. 6 shows in block form a full flash A/D converter according to a first embodiment of the present invention. FIGS. 7A and 8 show different portions of the full flash A/D converter illustrated in FIG. 6. Those components shown in FIGS. 6, 7A, and 8 which correspond to those shown in FIGS. 1 through 3 are denoted by identical reference numerals or reference numerals whose unit digits are identical, and will not be described in detail.

In FIG. 6, the full flash A/D converter includes four comparator blocks 2A through 2D into which 256 comparators and 256 double-phase buffers connected in cascade thereto are divided. Each of the comparator blocks 2A through 2D comprises 64 comparators C1 through C64 and 64 double-phase buffers P1 through P64, as shown in FIG. 7A. The output signals from the comparator blocks 2A through 2D are supplied to AND gate blocks 13A through 13D, whose output signals are supplied to first-stage encoders 14A through 14D. The output signals from the first-stage encoders 14A through 14D are in turn supplied to a second-stage encoder 15.

As shown in FIG. 6, each of the AND gate blocks 13A through 13D has 64 AND gates A1 through A64. As disclosed in Japanese Patent Application No. 1(1989)-155846 filed by the applicant, a $(4n+1)$th AND gate $A4n+1$ in each of the AND gate blocks 13A through 13D is supplied with a normal-phase output signal from a $(4n+1)$th buffer $P4n+1$, and an opposite-phase output signal from a $(4n+4)$th buffer $P4n+4$ is supplied to the $(4n+1)$th AND gate $A4n+1$ and also to a $(4n+4)$th AND gate $A4n+4$. $(4n+2)$th and $(4n+3)$th AND gates $A4n+2$, $A4n+3$ are supplied with respective normal-phase output signals from $(4n+2)$th and $(4n+3)$th buffers $P4n+2$, $P4n+3$, and also respective opposite phase output signals from $(4n+3)$th and $(4n+4)$th buffers $P4n+3$, $P4n+4$. An opposite-phase output signal from the $(4n+2)$th buffer $P4n+2$ is not supplied anywhere.

Each of the first-stage encoder blocks 14A through 14D additionally has a bit line D5N for a complement of a highest-order bit D5 among low-order bits, and two bit lines D1b, D0b equivalent to two low-order bit lines D1a, D0a. The bit lines D1a, D0a and D1b, D0b are disposed on respective opposite sides of each first-stage encoder block in order to reduce parasitic capacitance.

As shown in FIG. 7A, the output signals from the AND gates A1 through A64 are supplied through respective distribution amplifiers B1 through B64 to predetermined WOR circuits on the 9 bit lines D5, D5N, D4 through D2, D1a, D0a, D0b of the second first-stage encoder block 14B, for example. The WOR circuits are arranged as indicated at "1" in the connection diagram of FIG. 7B.

Every four AND gates make up one unit. The output signals from the first AND gates A1, A5, ... A29 of eight units 13e through 13l are supplied to the high-order bit lines D5N, D4 through D2, and the output signals from the first AND gates A33, A37, ... A61 of other eight units 13m through 13t are supplied to the high-order bit lines D5, D4 through D2, so that the number of WOR circuits on the high-order bit lines D5, D5N, D4 through D2 of the first-stage encoder block 14B is greatly reduced.

The two low-order bits from the eight units 13e through 13l are supplied to predetermined WOR circuits on the bit lines D1a, D0a, whereas the two low-order bits from the other eight units 13m through 13t are supplied to predetermined WOR circuits on the other bit lines D1b, D0b, so that the number of WOR circuits on the bit lines D1a, D0a, D1b, D0b is reduced to half.

The highest-order bit line D5N of the encoder block 14B is supplied with the output signal from the first AND gate A1 of the AND gate block 13B.

The third and fourth encoder blocks 14C, 14D are of the identical construction. In the first encoder block 14A, the output signal from the first AND gate A1 of the AND gate block 13B is not supplied to the highest-order bit line D5N, but is employed as an overflow signal. In FIG. 7B, the WOR circuits on the D5N line are indicated at "1*".

As shown in FIG. 8, the low-order bit lines D1a, D0a and D1b, D0b of each of the first-stage encoder blocks 14A through 14D are connected through respective OR gates O1, O0 in common to low-order bit lines D1, D0 of the encoder 15. The three intermediate-order bit lines D4 through D2 of each of the encoder blocks 14A through 14D are connected in common to intermediate-order bit lines D4 through D2 of the encoder 15. The output signals from the highest-order bit lines D5 and the complement bit lines D5N of each of the first-stage encoder blocks 14A through 14D are supplied through corresponding error inhibiting circuits 16A through 16D to the bit line D5 and the high-order bit lines D7, D6 of the encoder 15, and also to the adjacent error inhibiting circuits 16A through 16D.

The output signals from the bit lines D7 through D0 of the encoder 15 are transmitted through an output inverting circuit 7 to corresponding output terminals.

Operation of the full flash A/D converter according to the first embodiment will be described below also with reference to FIGS. 9 through 11.

Figure 9:
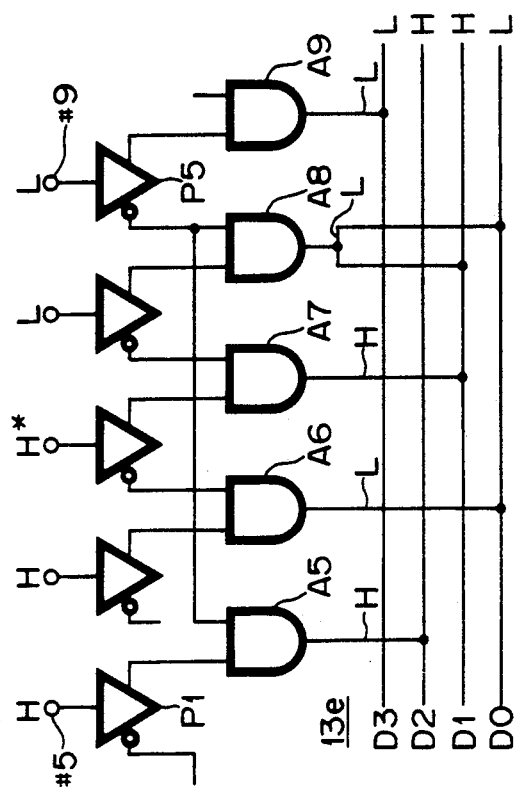
FIGS. 9, 10, and 11 are block diagrams showing the manner in which the circuit portion shown in FIG. 8 operates.
Figure 10:
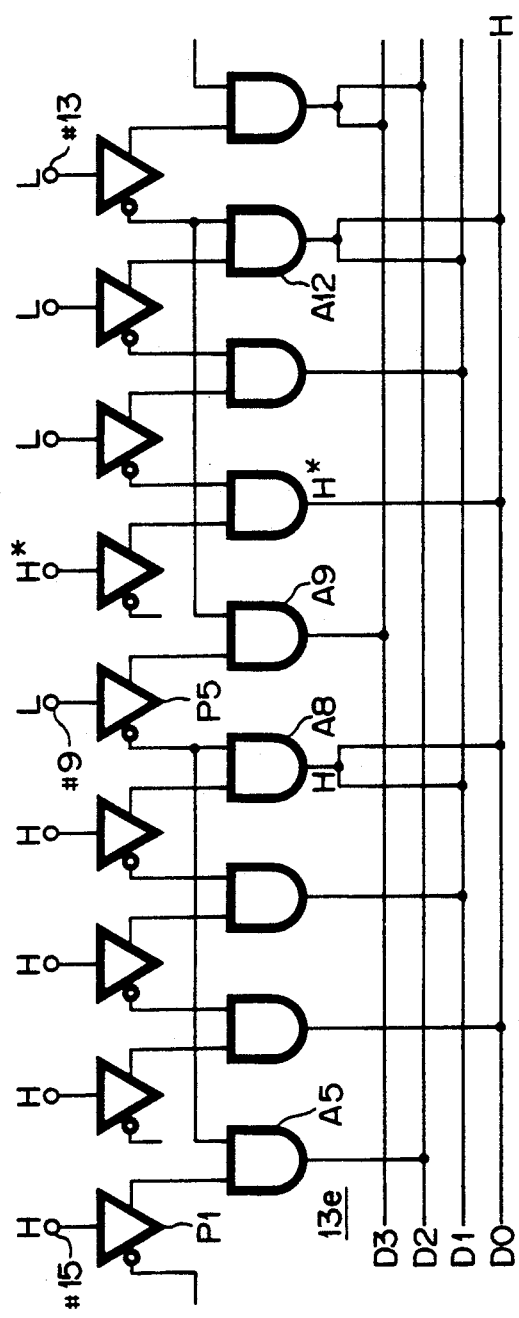

As shown in FIG. 9, the $(4n+1)$th AND gate $A4n+1$ of each of the AN gate blocks 13A through 13D handles the high-order bits D5 through D2 of the first-stage encoder blocks 14A through 14D, whereas the three $(4n+2)$th, $(4n+3)$th, and $(4n+4)$th AND gates $A4n+2$, $A4n+3$, $A4n+4$ handle the low-order bits D1, D0. Therefore, as shown in FIG. 10, a digital error of D2 or more bits is not produced in the event that there is an irregular pattern containing wrong bits that are three or less bits apart. The encoders in this embodiment are thus essentially less susceptible to an error due to an irregular pattern from the comparators.

The bit line D5N of each of the first-stage encoder blocks 14A through 14D essentially effects ORing of the output signals from the AND gates A1 through A32, and intuitively serves to produce the complement of the bit line D5. Normally, when either one of the encoder blocks 14A through 14D is to produce an output signal, at most one of the eight bit lines D5, D5N goes high. Thus, the WOR circuits on the bit lines D5, D5N generate high-order bits D6, D7 of the output signal, with the result that the number of the WOR circuits on the bit lines D6, D7 is greatly reduced.

Figure 11:
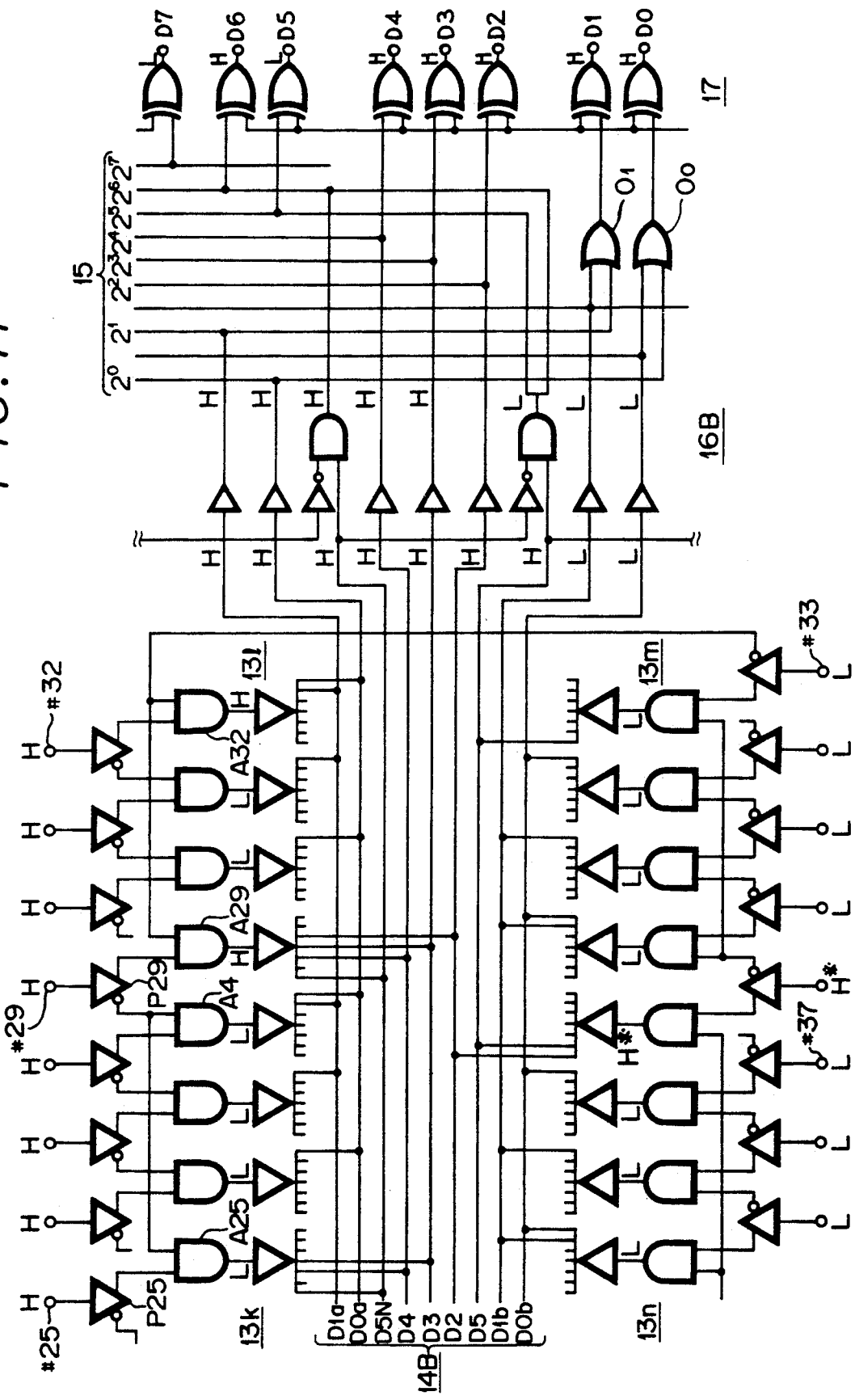

Furthermore, as shown in FIG. 11, if an irregular pattern is produced in the vicinity of the input signal being a multiple of 32, varying the D5 bit in the AND block to cause two of the bit lines D5, D5N of the encoder blocks 14A through 14D to go high, the D5 or D5N bit located in a direction (to the right in FIG. 8) to increase the output code is inhibited by the error inhibiting circuits 16A through 16D shown in FIG. 8. In this case, the same encoder block is not required to distinguish between its inside and outside regions for error inhibition, unlike the conventional arrangements.

According to this embodiment, if an irregular pattern containing wrong bits that are up to seven bits apart is generated, it is possible to reduce the error down to a level of about 16 LSB though the level cannot exactly be defined with only the output signals from the comparators.

As described above, since the bit D5N which is the complement of the highest-order bit D5 of the first-stage encoder is provided, and the bits D5N, D5 are ORed to produce high-order bits, the number of sources of the WOR circuits for the high-order bits may be reduced, thereby reducing the logic amplitude. The number of sources of the WOR circuits for the low-order bits is also the same as the number of sources of the WOR circuits for the high-order bits, so that the signal levels of the high- and low-order bits can be equalized. The load capacitance of the full flash A/D converter is also reduced for high-speed A/D conversion.

Using the complement bit D5N, errors can be inhibited without distinguishing between the inside and outside regions of the first-stage encoder blocks.

With the above embodiment, the first-stage encoder generates low-order bits and also a bit which is the complement of the highest-order bit at the first stage, and the second-stage encoder generate high-order bits using the highest-order bit at the first stage and its complement bit. The full flash A/D converter therefore has simplified encoders, but can prevent a digital error (sparkle) from being produced.

FIGS. 12 through 14A, 14B illustrate a full flash A/D converter according to a second embodiment of the present invention.

Figure 12:
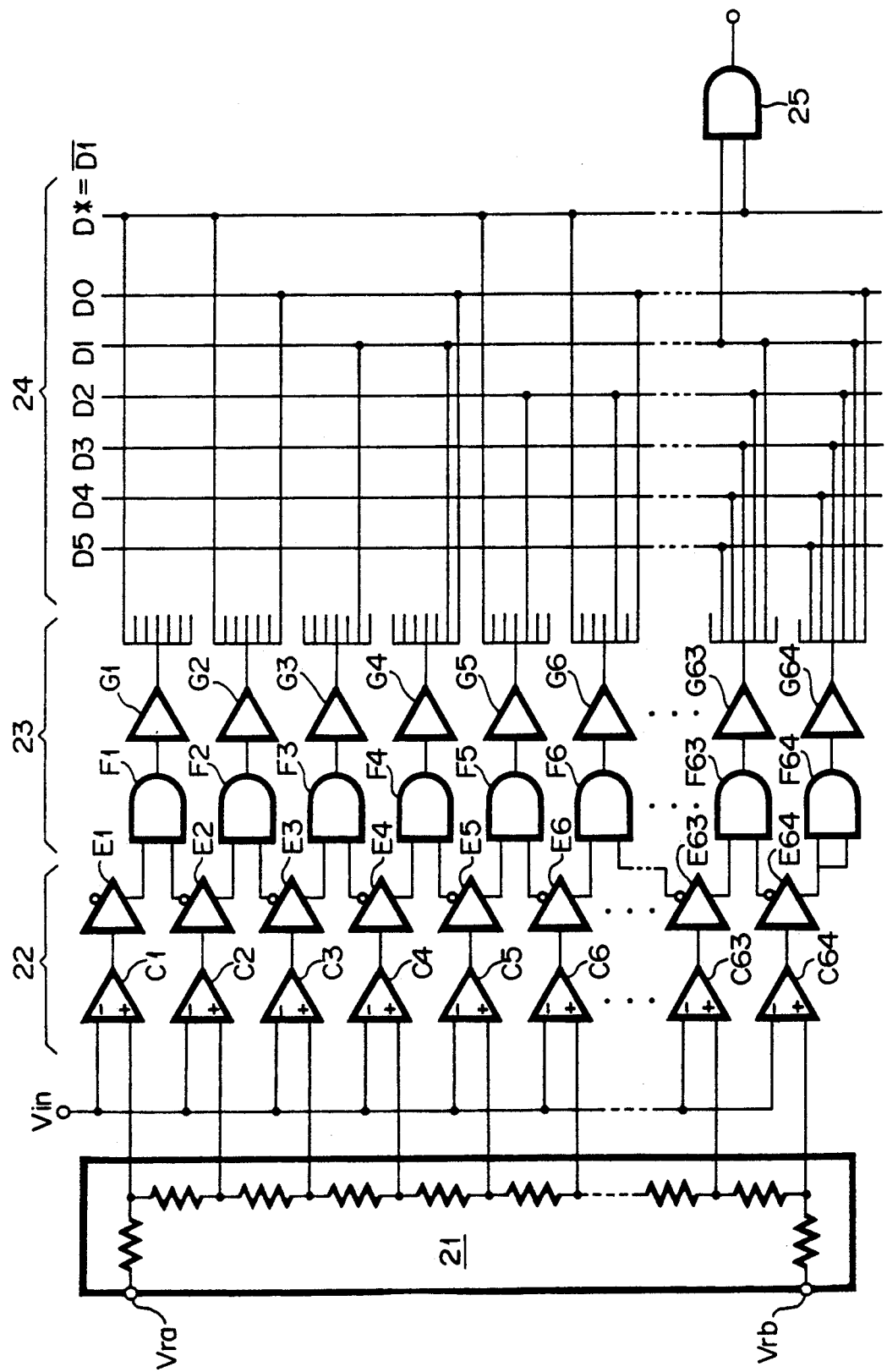
FIG. 12 is a block diagram of a portion of a full flash A/D converter according to a second embodiment of the present invention.
Figures 13B, 14B:
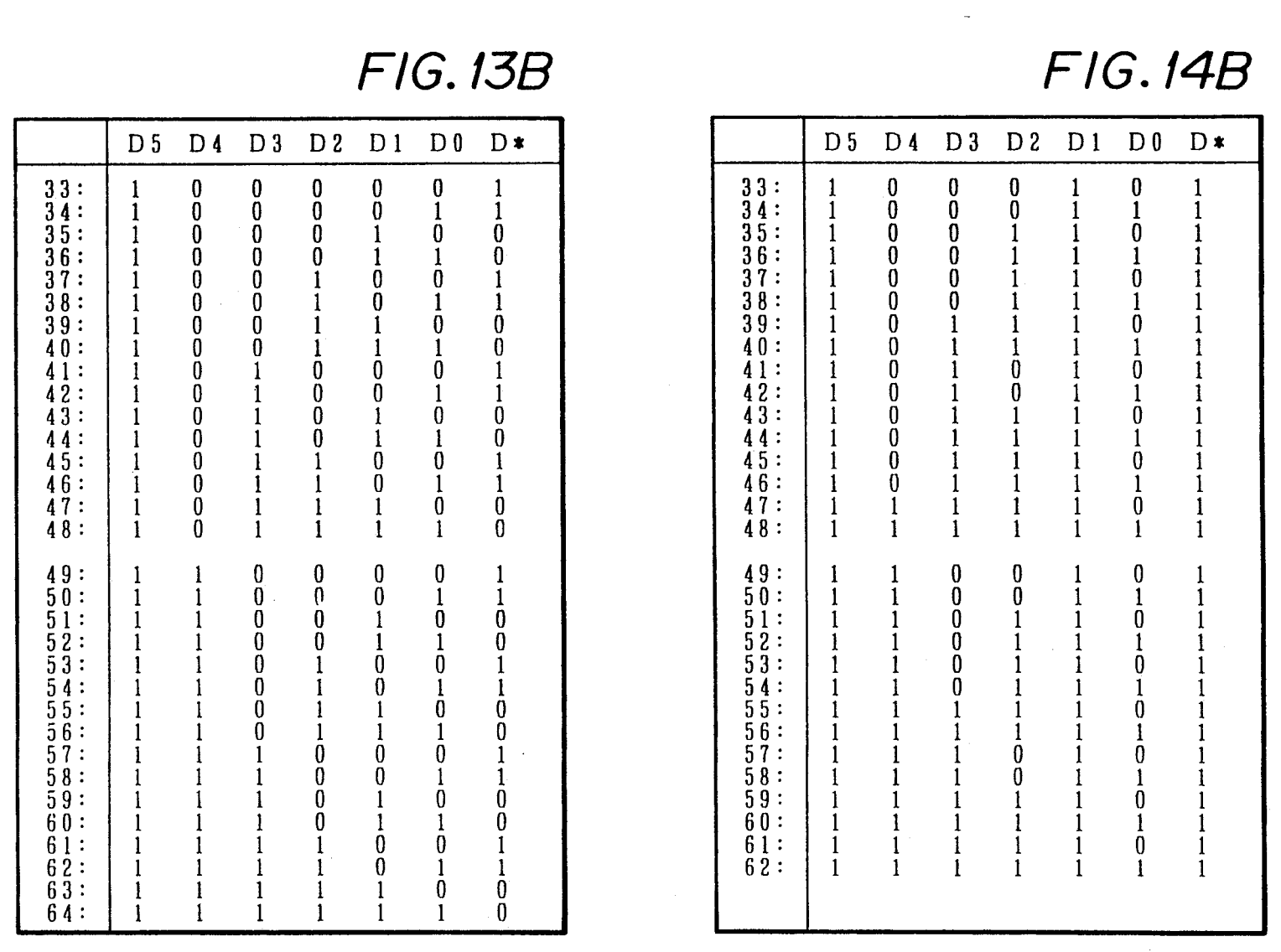

FIG. 12 shows in block form the full flash A/D converter according to the second embodiment, and FIGS. 13A and 13B illustrate connections in the full flash A/D converter.

As shown in FIG. 12, the full flash A/D converter has a comparator group 22, and an AND gate group 23. If the full flash A/D converter is a 6-bit A/D converter, then the comparator group 22 is composed of 64 comparators C1 through C64 and the AND gate group 23 is composed of 64 AND gates F1 through F64. The output signals from the comparators C1 through C64 are supplied to double-phase buffers E1 through E64 which can produce output signals in normal and opposite phases. Each of the AND gates Fi is supplied with a normal-phase output signal from a buffer Ei and an opposite-phase output signal from a buffer Ei+1. The output signals from the AND gates F1 through F64 are supplied through distribution amplifiers G1 through G64 to WOR circuits on seven bit lines D5 through D0, D* of an encoder 24.

The output signals from the two bit lines D1, D* of the encoder 24 are supplied to an AND gate 25.

As shown in FIGS. 13A and 13B, each WOR circuit is located at a position corresponding to "1" of a normal binary code on the first through sixth bit lines D5 through D0. The seventh bit D* is the complement of the second low-order bit D1, and the output signal from the same AND gate Fi is not supplied in common to each WOR circuit on the bit lines D*, D1.

Operation of the full flash A/D converter according to the second embodiment will be described below also with reference to FIGS. 14A and 14B.

In the event that there is no error contained in an input signal from each AND gate Fi, the output signal from the encoder 24 is such that, as shown in FIGS. 13A and 13B, the first through sixth bits D5 through D0 represent a normal binary code and the seventh bit D* represents an inversion of the second low-order bit D1.

If a "2-in error" is produced, making the output signals from an AND gate Fi and a next but one AND gate Fi+2, e.g., the AND gates F1, F3, high, when the H output signals from AND are the gates F1, F3 supplied to each WOR circuit on the bit lines D1, D*, the output signal from the encoder 24 in response to the input signal from the AND gate F1 has "1" for the bit D1, and the output signal from the encoder 24 which corresponds to the input signal from the AND gate F3 has "1" for the bit D* Comparison with FIGS. 13A and 13B indicates that the above output pattern of the encoder 24 is different from the normal output pattern of the encoder 24.

As shown in FIGS. 14A and 14B, the output pattern from the encoder 24 in response to the input signal from each AND gate Fi is also different from the normal output pattern in that the bits D1, D* represent "1".

In this embodiment, the AND gate 25 serves to AND the bits D1, D* to detect a "2-in error" containing wrong bits that are one bit apart. Therefore, such an error can reliably be detected with a simple arrangement without an increase in the delay time.

While the full flash A/D converter described above is a 6-bit A/D converter, the principles of the embodiment are also applicable to A/D converters of other bit numbers.

The full flash A/D converter can also be arranged to detect other "2-in errors" containing wrong bits that are three or seven bits apart.

While the AND gate 25 is employed to AND the signals in the illustrated embodiment, any of various other suitable logic circuits may be used to achieve the same result.

As described above, since a bit which is the complement of the second low-order bit is produced in the encoder and the complement bit and the second low-order bit are ANDed, the full flash A/D converter can easily detect a particular error pattern applied to the encoder without an increase in the delay time.

FIGS. 15 through 17A, 17B illustrate a full flash A/D converter according to a third embodiment of the present invention.

Figure 15:
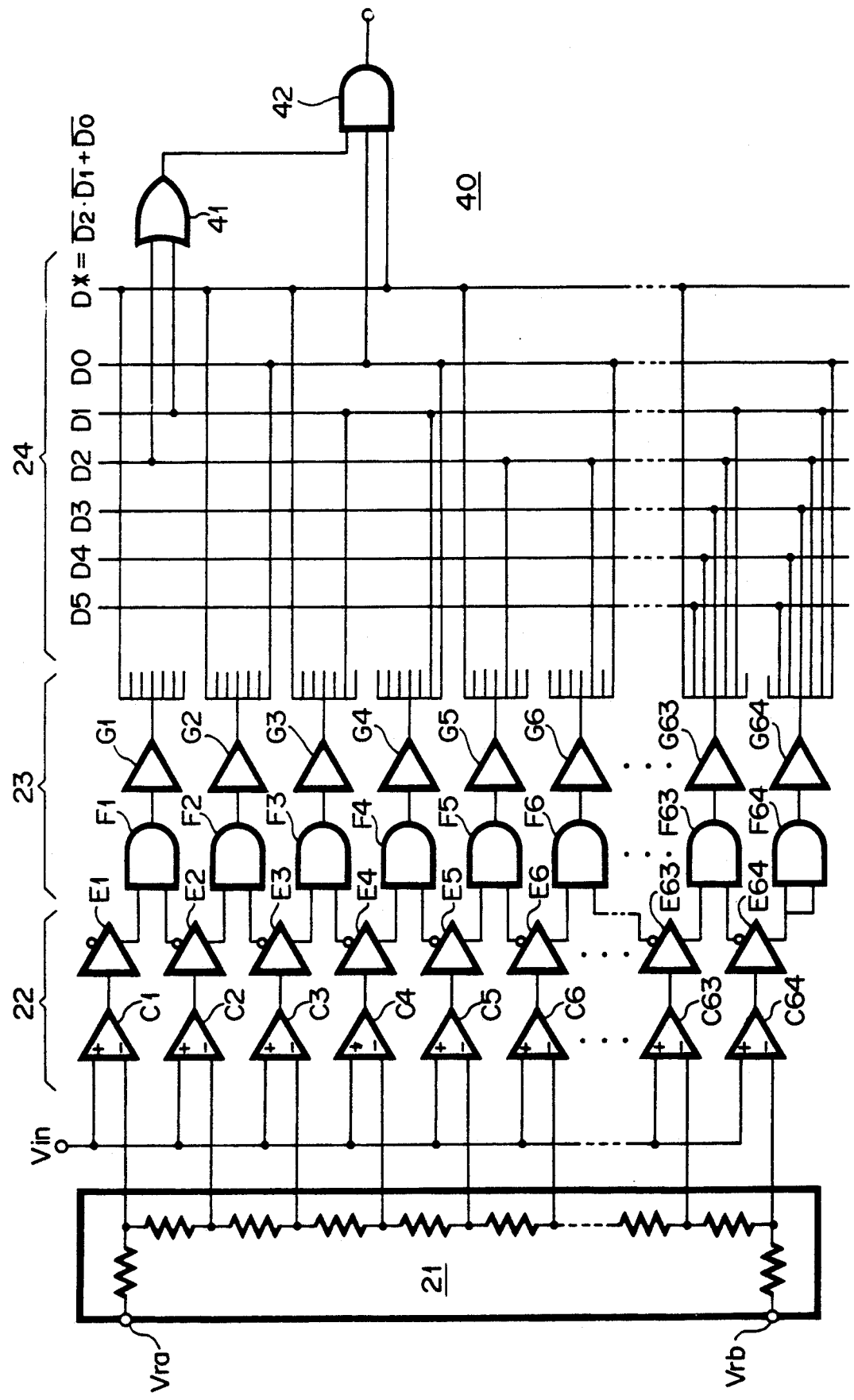
FIG. 15 is a block diagram of a portion of a full flash A/D converter according to a third embodiment of the present invention.
Figures 16A, 17A:
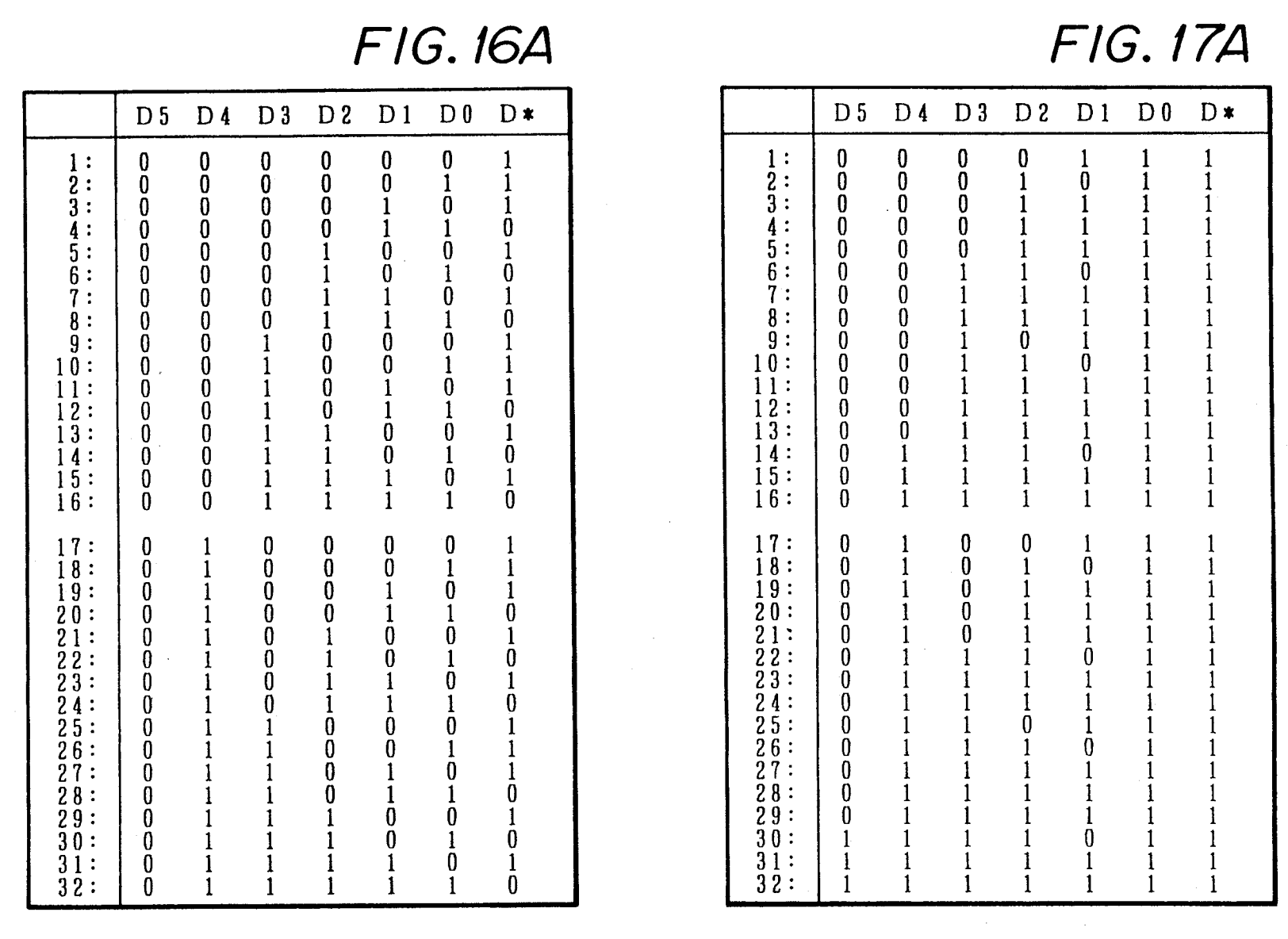
Figures 16B, 17B:
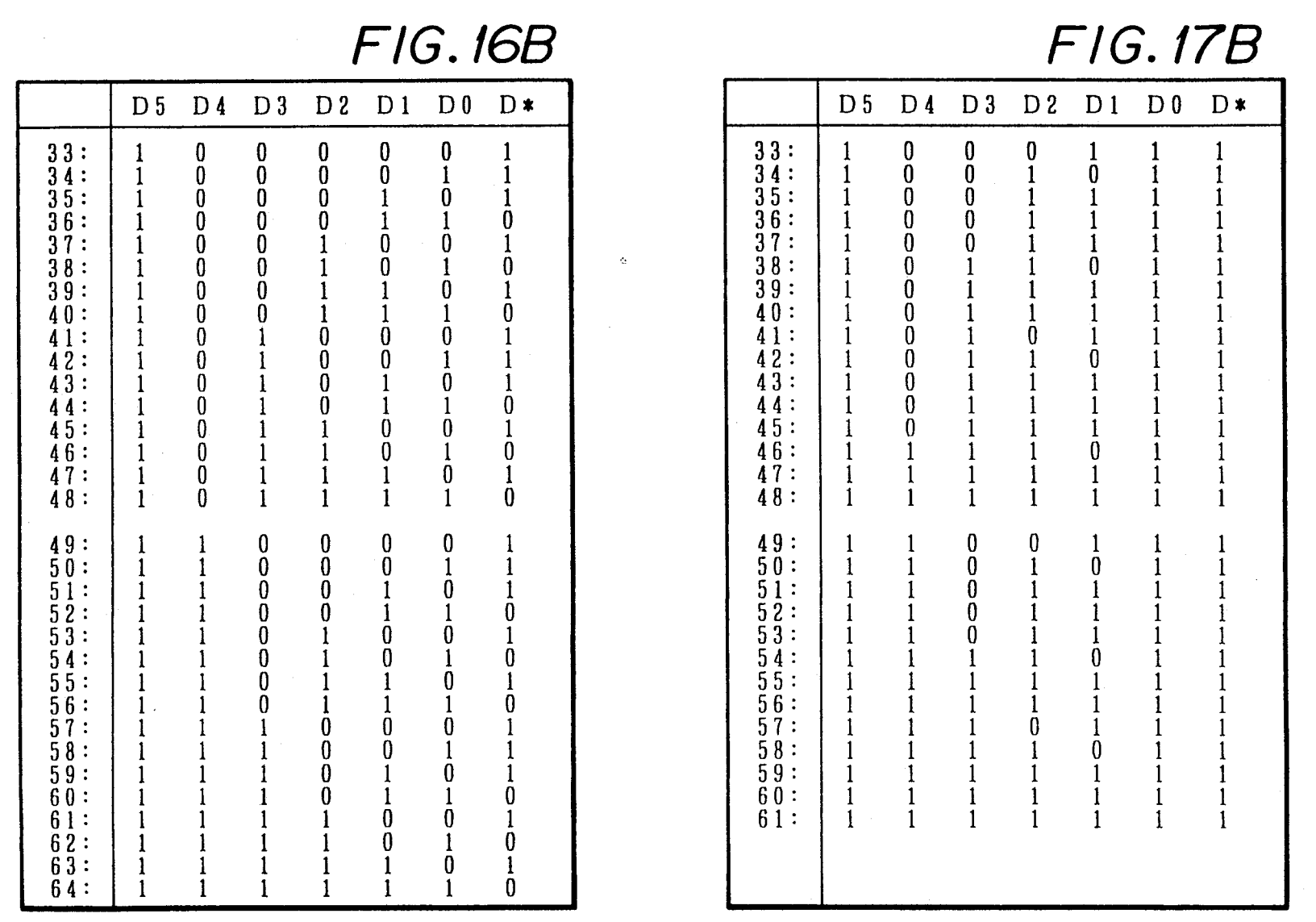

FIG. 15 shows in block form the full flash A/D converter according to the third embodiment, and FIGS. 16A and 16B illustrate connections in the full flash A/D converter.

As shown in FIG. 15, the full flash A/D converter has a comparator group 22, and an AND gate group 23. If the full flash A/D converter is a 6-bit A/D converter, then the comparator group 22 is composed of 64 comparators C1 through C64 and the AND gate group 23 is composed of 64 AND gates F1 through F64. The output signals from the comparators C1 through C64 are supplied to double-phase buffers E1 through E64 which can produce output signals in normal and opposite phases. Each of the AND gates Fi is supplied with a normal-phase output signal from a buffer Ei and an opposite-phase output signal from a buffer Ei+1. The output signals from the AND gates F1 through F64 are supplied through distribution amplifiers G1 through G64 to WOR circuits on seven bit lines D5 through D0, D* of an encoder 24.

As shown in FIGS. 16A and 16B, each WOR circuit is located at a position corresponding to "1" of a normal binary code on the first through sixth bit lines D5 through D0.

The seventh bit D* is an additional bit for detecting an error, and is generated through a logic operation effected on low-order three bits D2 through D0 according to the following equation (1):

$$D^* = D2 \cdot D1 + D0 \tag{1}$$

An error detecting circuit 40 comprises an OR gate 41 and a three-input AND gate 42. The OR gate 41 is supplied with the output signals from the third and second low-order bit lines D2, D1 of the encoder 24, and the AND gate 42 is supplied with the output signals from the lowest-order and additional bit lines D1, D* and also the output signal from the OR gate 41.

Operation of the full flash A/D converter according to the third embodiment will be described below also with reference to FIGS. 17A and 17B.

In the event that there is no error contained in an input signal from each AND gate Fi, the output signal from the encoder 24 is such that, as shown in FIGS. 16A and 16B, the first through sixth bits D5 through D0 represent a normal binary code. The additional bit D* generated according to the equation (1) above repeats one pattern in a cyclic period of 8 levels, as shown in FIGS. 16A and 16B and the following table 1.

|    | D2N | D1N | D0N | D* |
|----|-----|-----|-----|----|
| 1: | 1   | 1   | 1   | 1  |
| 2: | 1   | 1   | 0   | 1  |
| 3: | 1   | 0   | 1   | 1  |
| 4: | 1   | 0   | 0   | 0  |
| 5: | 0   | 1   | 1   | 1  |
| 6: | 0   | 1   | 0   | 0  |
| 7: | 0   | 0   | 1   | 1  |
| 8: | 0   | 0   | 0   | 0  |

Since the inverted bits D2N through D0N of the low-order three bits D2 through D0 are given as shown in the table 1, the additional bit D* which is produced by effecting the logic operation on these bits according to the equation (1) repeats the pattern of "1"s and "0"s in the cyclic period of 8 levels.

If a "2-in error" is produced, making the output signals from an AND gate Fi and a next but two AND gate Fi+3, e.g., the AND gates F1, F4, high, when the H output signals from the AND gates F1, F4 are supplied to each WOR circuit on the bit lines D2 through D0, D*, the output signal from the encoder 24 in response to the input signal from the AND gate F1 has "1" for the bits D1, D0, and differs from the normal output code of the encoder 24.

As shown in FIGS. 17A and 17B, the output signal from the encoder 24 in response to the input signal from each of the AND gates F2 through F60 is an error code which is also different from the normal output code. This error code has low-order 3 bits D2 through D0 which repeat the same pattern in a cyclic period of 8 levels.

The error detecting circuit 40 effects a logic operation according to the equation (2), below, generating the inverted bit D*N of the additional bit D*

$$\begin{aligned}(\overline{D2} + \overline{D1}) \cdot \overline{D0} &= \overline{D2 \cdot D1} + \overline{D0} \\ &= \overline{D2 \cdot D1 + D0} \\ &= \overline{D^*}\end{aligned} \tag{2}$$

The AND gate 42 serves to AND the additional bit D* and its inverted bit D*N to detect a "2-in error" containing wrong bits that are two bit apart.

In the above embodiment, the "2-in error" can reliably be detected with a simple arrangement, composed of the OR gate 41 and the three-input AND gate 42, without an increase in the delay time.

While the full flash A/D converter described above is a 6-bit A/D converter, the principles of the embodiment are also applicable to A/D converters of other bit numbers.

While the error detecting circuit 40 comprising the OR gate 41 and the AND gate 42 is employed to AND the signals in the illustrated embodiment, any of various other suitable logic circuits may be used to achieve the same result.

As described above, the encoder generates an additional bit by ORing the AND logical product of the complement bits of the second and third low-order bits of a plurality of bit signals and the complement of the first low-order bit, and ANDs the additional bit and the complement bit of the additional bit. Therefore, the full flash A/D converter can easily detect a particular error pattern applied to the encoder without an increase in the delay time.

FIGS. 18 through 20A, 20B illustrate a full flash A/D converter according to a fourth embodiment of the present invention.

Figure 18:
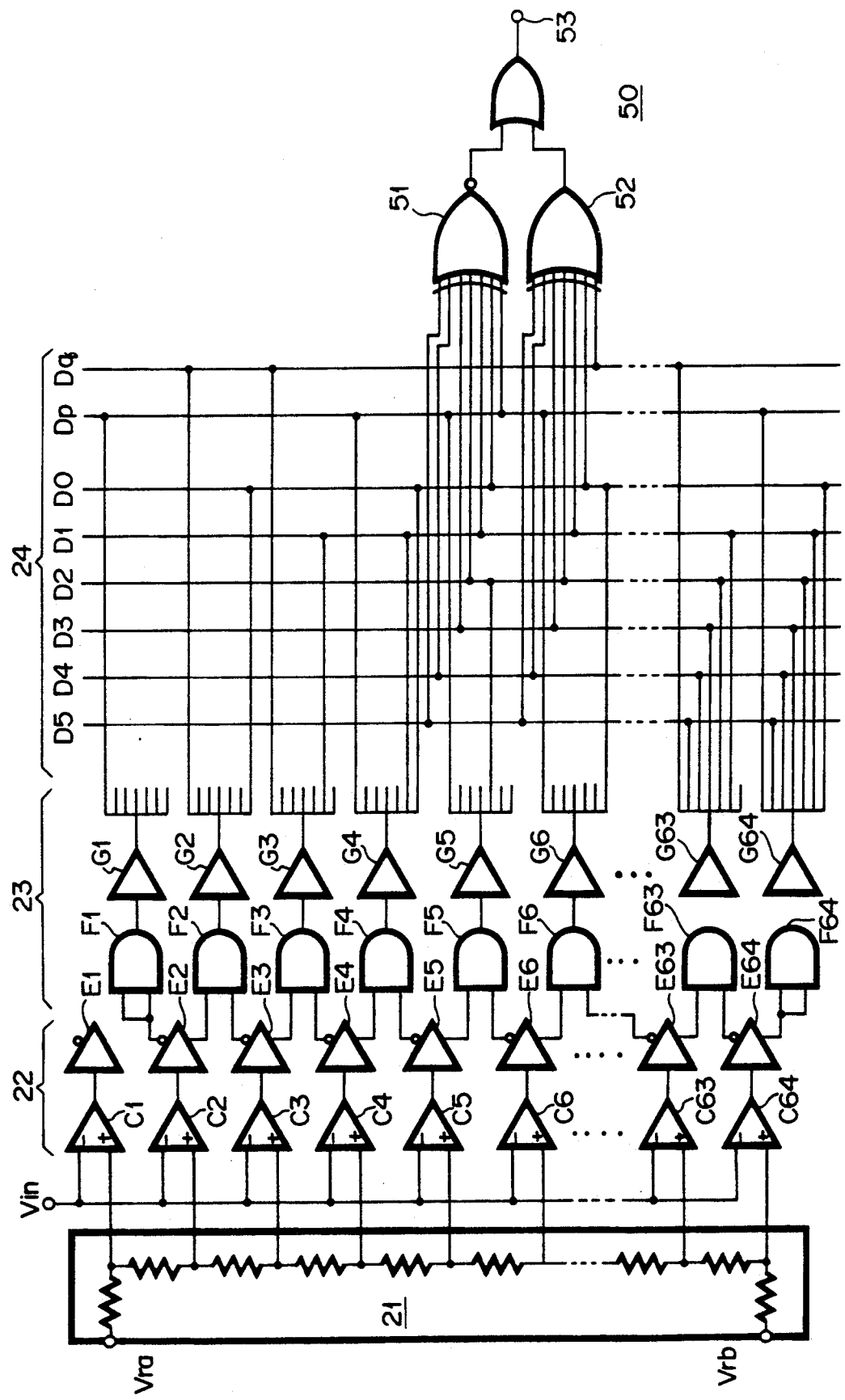
FIG. 18 is a block diagram of a portion of a full flash A/D converter according to a fourth embodiment of the present invention.

FIG. 18 shows in block form the full flash A/D converter according to the fourth embodiment, and FIGS. 19A and 19B illustrate connections in the full flash A/D converter.

As shown in FIG. 18, the full flash A/D converter has a comparator group 22, and an AND gate group 23. If the full flash A/D converter is a 6-bit A/D converter, then the comparator group 22 is composed of 64 comparators C1 through C64 and the AND gate group 23 is composed of 64 AND gates F1 through F64. The output signals from the comparators C1 through C64 are supplied to double-phase buffers E1 through E64 which ca produce output signals in normal and opposite phases. Each of the AND gates Fi is supplied with a normal-phase output signal from a buffer Ei and an opposite-phase output signal from a buffer Ei+1. The output signals from the AND gates F1 through F64 are supplied through distribution amplifiers G1 through G64 to WOR circuits on eight bit lines D5 through D0, Dp, Dq of an encoder 24.

As shown in FIGS. 19A and 19B, each WOR circuit is located at a position corresponding to "1" of a normal binary code on the first through sixth bit lines D5 through D0.

The seventh and eight bit lines Dp, Dq are odd- and even-parity bit lines, and the parity bits Dp, Dq are complementary to each other.

An error detecting (parity check) circuit 50 comprises an exclusive-NOR (XNOR) gate 51, an exclusive-OR (XOR) gate 52, and an AND gate 53. The output signals from the bit lines D5 through D0 of the encoder 24 are supplied to both the XNOR gate 51 and the XOR gate 52, and the output signal from the odd-parity bit line Dp is supplied to the XNOR gate 51. The XOR gate 52 is supplied with the output signal from the even-parity bit line Dp. The output signals from the XNOR gate 51 and the XOR gate 52 are transmitted through the OR gate 53.

Operation of the full flash A/D converter according to the fourth embodiment will be described below also with reference to FIGS. 20A and 20B.

In the event that there is no error contained in an input signal from each AND gate Fi, the output signal from the encoder 24 is such that, as shown in FIGS. 19A and 19B, the first through sixth bits D5 through D0 represent a normal binary code.

The odd- and even-parity bits Dp, Dq are such that "1"s and "0"s are switched around between first 32 data items and second 32 data items of the total of 64 data items, between first 16 data items and second 16 data items of each of the groups of 32 data items, and also between first 8 data items and second 8 data items of each of the groups of 16 data items.

If a "2-in error" is produced, making the output signals from an AND gate Fi and a next but one AND gate Fi+2 high, the output signal from the encoder 24 in response to the input signal from the AND gate Fi is given as shown in FIGS. 20A and 20B, and differs from the normal output code of the encoder 24.

For example, if the output signals from the AND gates F1, F3 go high, when the H output signals from the AND gates F1, F3 are supplied to each WOR circuit on the bit lines D1, Dp, Dq, the output code from the encoder 24 in response to the input signal from the AND gate A1 is such that only the information bit D1 is "1" as shown in FIGS. 20A and 20B. Both the odd- and even-parity bits Dp, Dq become "1".

In the error detecting circuit 50, only the output signal from the XNOR gate 51 supplied with the odd-parity bit Dp becomes "1". Therefore, the odd-parity bit Dp detects the error, and a signal indicative of the detected error is outputted through the OR gate 53.

If both the output signals from the AND gates F2, F4 go high, the information bits D1, D0 of the output code from the encoder 24 in response to the input signal from the AND gate F2 become "1", and both the parity bits Dp, Dq become "1". In this case, the output signal from the XOR gate 52 supplied with the even-parity bit Dq becomes "1", and hence the even-parity bit Dq detects the error.

In case an error containing wrong bits that are one bit apart is produced in any one Fi of the AND gates F3 through F62, the error is detected by the odd-parity bit Dp or the even-parity bit Dq in the same manner as described above.

In the above embodiment, the odd- and even-parity bits are complementary to each other for reliably detecting an error, which contains wrong bits that are one bit apart, produced in any AND gate Fi. A bit-random error can also be detected by the parity check.

When an error is detected, the output code is prevented from being updated, so that any error code will not be outputted.

The full flash A/D converter can also detect an error containing wrong bits that are two bits apart in the same manner as when the odd- or even-parity bit is employed singly.

While the full flash A/D converter described above is a 6-bit A/D converter, the principles of the embodiment are also applicable to A/D converters of other bit numbers.

While the error detecting circuit 50 comprises the XNOR gate 51, the XOR gate 52, and the OR gate 53 in the illustrated embodiment, any of various other suitable logic circuits may be used to achieve the same result.

As described above, the encoder has an error detecting circuit which generates odd- and even-parity bits of a plurality of information big signals, and effect parity check on the information bits using the parity bits. Therefore, the full flash A/D converter can easily detect a particular error pattern applied to the encoder and also can detect a bit-random error.

A full flash A/D converter according to a fifth embodiment of the present invention will be described below with reference to FIGS. 21 through 24.

Figure 21:
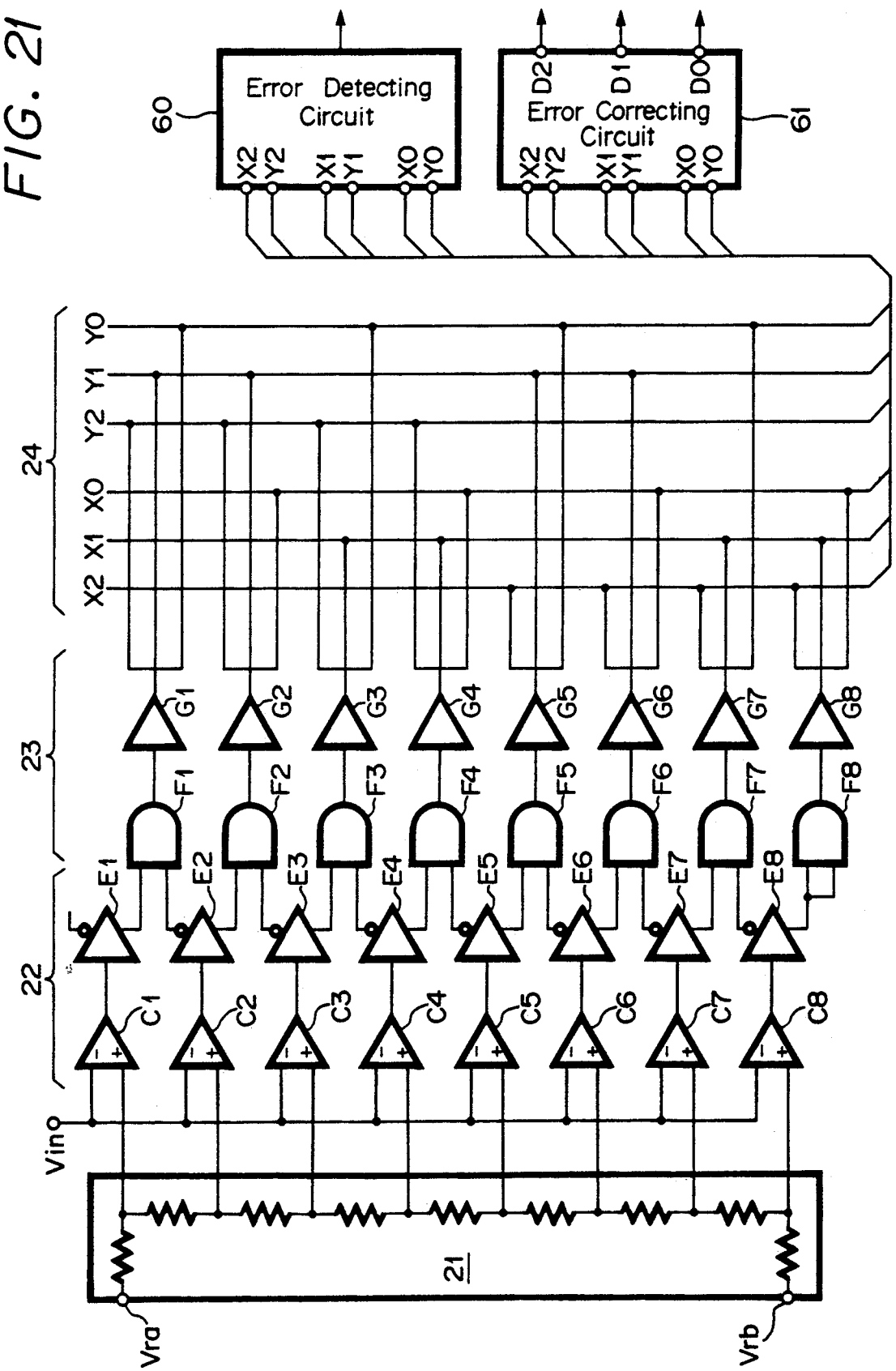
FIG. 21 is a block diagram of a portion of a full flash A/D converter according to a fifth embodiment of the present invention.

FIG. 21 shows in block form the full flash A/D converter according to the fifth embodiment.

As shown in FIG. 21, the full flash A/D converter has a comparator group 22, and an AND gate group 23. If the full flash A/D converter is a 3-bit A/D converter, then the comparator group 22 is composed of 8 comparators C1 through C8 and the AND gate group 23 is composed of 8 AND gates F1 through F8. The output signals from the comparators C1 through C8 are supplied to double-phase buffers E1 through E8 which can produce output signals in normal and opposite phases. Each of the AND gates Fi is supplied with a normal-phase output signal from a buffer Ei and an opposite-phase output signal from a buffer Ei+1. The output signals from the AND gates F1 through F8 are supplied through distribution amplifiers G1 through G8 to WOR circuits on three information bit lines X2 through X0 and complement bit lines Y2 through Y0.

An error detecting circuit 60 and an error correcting circuit 61 are supplied with the output signals from the information bit lines X2 through X0 and the complement bit lines Y2 through Y0.

Figure 22:
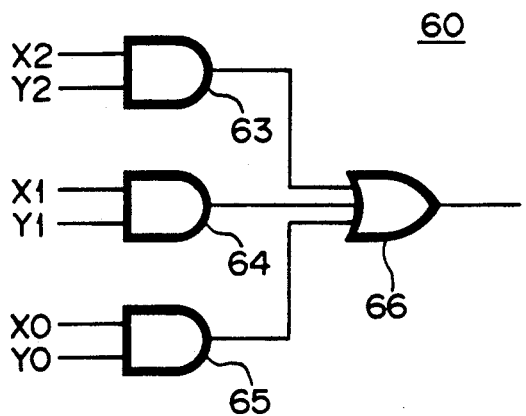
FIGS. 22 and 23 are block diagrams of portions of error detecting circuits for use in the full flash A/D converter shown in FIG. 21.

As shown in FIG. 22, the error detecting circuit 60 comprises three AND gates 63 through 65 and an OR gate 66. The AND gates 63 through 65 are supplied with information bits X2 through X0, and also with corresponding complement bits Y2 through Y0. The output signals from the AND gates 63 through 65 are transmitted through the OR gate 66.

Figure 23:
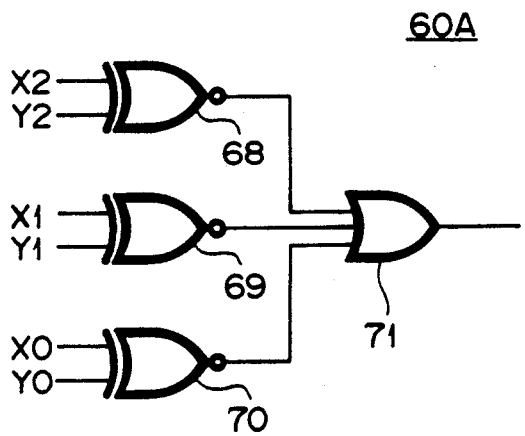

FIG. 23 shows another error detecting circuit 60A which comprises three XNOR gates 68 through 70 and a OR gate 71. The error detecting circuit 60A detects, as an error, the condition that the output signal from the comparator C1 goes low. To avoid this, the buffer E1 and the AND gate F1 may be disconnected from each other, and the input signal supplied to the AND gate F1 may be of a fixed high level.

Figure 24:
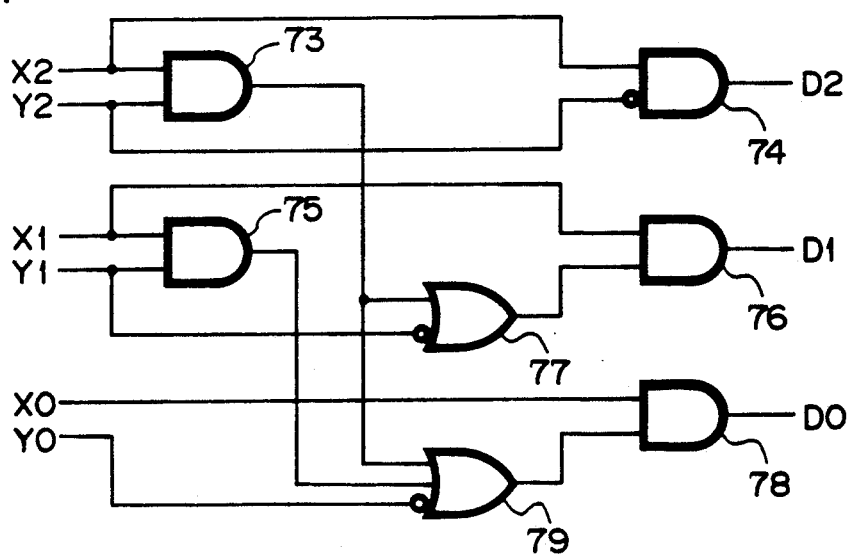
FIG. 24 is a block diagram of a portion of an error correcting circuit for use in the full flash A/D converter shown in FIG. 21.

FIG. 24 shows the error correcting circuit 61. In the error correcting circuit 61, the high-order information bit X2 is supplied to each of AND gates 73, 74, and the corresponding complement bit Y2 is supplied to the AND gate 73 with its inverted bit being supplied to the AND gate 74.

The intermediate-order information bit X1 is supplied to each of AND gates 75, 76, and the corresponding complement bit Y1 is supplied to the AND gate 75, with its inverted bit being supplied to the AND gate 76 through an OR gate 77. The OR gate 77 is supplied with the output signal from the AND gate 73.

The low-order information bit X0 is supplied to an AND gate 78, and the corresponding complement bit Y0 is inverted and supplied to the AND gate 78 through an OR gate 79. The OR gate 79 is supplied with the output signals from the AND gates 73, 75.

The AND gates 74, 76, 78 output corrected information bits D2, D1, D0, respectively.

The full flash A/D converter according to the fifth embodiment operates as follows:

As long as the output signal from the comparator group 22 is of a normal code, the AND gate group (differentiating circuit) 23 produces a single output signal, and the following equations (3) are satisfied:

$$X2 = \sim Y2 \\ X1 = \sim Y1 \\ X0 = \sim Y0 \qquad (3)$$

where the symbol $\sim$ represent negation.

If an error containing wrong bits that are one bit apart is produced, causing the output signal from the comparator group 22 to deviate from the normal code, e.g., the comparators C1 through C4, C6 producing an output signal of "1" and the comparators C5, C7, C8 producing an output signal of "0", then the output signals from the AND gates F1, F6 become "1".

These output signals are supplied to the information bit lines X2 through X0 and the complement bit lines Y2 through Y0. The encoder 24 produces X binary output codes "011", "101" and Y binary output codes "100", "010" which are inversions of the X binary output codes.

When the output signal from the AND gate F4 is correct, the output code from the encoder 24 should be of "011", and when the output signal from the AND gate F6 is correct, the output code from the encoder 24 should be of "101".

When the output signals from the AND gates 63, 64 of the error correcting circuit 60 are indicated as:

$$X2=Y2=1, X1=Y1=1,$$

i.e., when the information bits X2, X1 and the corresponding complement bits Y2, Y1 are the same as each other, it is detected that the equations (3) are not satisfied, thus detecting the error.

Generally, when a multi-in error is generated, it always causes the output code of the encoder to become "1". Therefore, the fact that the corresponding bits of the X information bit group and the Y information bit group are "1" may be detected.

When a bit-random error is produced, only either one of the X and Y bit groups combined may be in error. In order to detect such an error pattern, the error detecting circuit 60A shown in FIG. 23 also detect the condition:

$$Xi = Yi = 0 \ (i=0\sim 7).$$

Thus, a condition in which corresponding bits of the X and Y bit groups are in agreement with each other is detected.

Furthermore, when there is only bit for which an error is detected, the full flash A/D converter according to the present invention can detect which bit is in error. If such an error occurs, it can be corrected since it can be recognized what combination of bits the original code is composed of.

When a multi-in error is produced, since the comparator group itself causes the error, there is no information which would allow correct bits to be determined. However, inasmuch as a location where the error occurs is probably limited nearly to an area where the input signal to the encoder is of "1", no problem will arise if a code in the vicinity of that area is outputted.

According to the present invention, the error correcting circuit 61 corrects a detected error so that the highest-order bit thereof will e of "0".

More specifically, the AND gates 73, 74 of the error correcting circuit 61 effects a logic operation according to the equation (4) below. When the high-order information bit X2 and the corresponding complement bit Y2 coincide with each other due to a multi-in error or the like, the corrected high-order information bit D2 becomes "0".

$$D2 = X2 \cdot (\sim Y2) \qquad (4)$$

The AND gates 75, 76 and the OR gate 77 effects a logic operation according to the equation (5) below. When the intermediate-order information bit X1 and the corresponding complement bit Y1 coincide with each other due to a multi-in error or the like, the corrected intermediate-order information bit D1 becomes "0".

$$\begin{aligned} D1 &= X1 \cdot \sim[\sim(X2 \cdot Y2) \cdot Y1] \\ &= X1 \cdot [(X2 \cdot Y2) + (\sim Y1)] \end{aligned} \qquad (5)$$

The AND gate 78 and the OR gate 79 effects a logic operation according to the equation (6) below. When the low-order information bit X0 and the corresponding complement bit Y0 coincide with each other due to a multi-in error or the like, the corrected low-order information bit D1 becomes "0".

$$\begin{aligned} D0 &= X0 \cdot \sim[\sim(X2 \cdot Y2) \cdot \sim(X1 \cdot Y1) \cdot Y0] \\ &= X0 \cdot [(X2 \cdot Y2) + (X1 \cdot Y1) + (\sim Y0)] \end{aligned} \qquad (6)$$

In the above embodiment, the number of the bit lines of the encoder 24 is doubled, but the circuit arrangement is simplified.

The error detecting circuit 60 or 60A and the error detecting circuit 61 may be arranged to share the AND gates, etc.

While the full flash A/D converter described above is a 3-bit A/D converter, the principles of the embodiment are also applicable to A/D converters of other bit numbers.

For example, if the full flash A/D converter is a 6-bit A/D converter, then the X group of information bits of the encoder is arranged as shown in FIGS. 25A and 25B. The Y group of complement bits is represented by an inversion of FIGS. 25A and 25B, i.e., is achieved by replacing the "0"s and the "1"s in FIGS. 25A and 25B with "1"s and "0"s, respectively.

When an input signal having an error pattern containing wrong bits that are one bit or two bits apart is supplied to the 6-bit encoder, the error is corrected as described above by the error correcting circuit, which outputs a corrected code. The corrected code and a correct code do not differ from each other as shown in FIG. 27.

When an input signal having an error pattern containing wrong bits that are three bits apart is supplied to the 6-bit encoder, a corrected code $Z5 \sim Z0$ differs from a correct code $X5 \sim X0$, leaving a difference indicated by $\Delta$ in FIGS. 26A and 26B.

In the event of a multi-in error containing wrong bits that are one through sixteen bits apart, the difference $\Delta$ between a corrected code and a correct code is as shown in FIG. 27, and repeats itself at a cyclic period of 8 levels.

As described above, when a multi-in error occurs, it is impossible to determine which code is correct. If the difference is smaller than the intervals between input signals supplied to a plurality of encoders, however, the corrected code lies between the maximum and minimum ones of the input signals supplied to the encoders.

If the number of bits of the encoder is increased, the number of gate stages of the error correcting circuit and the fan-in (number of inputs) are traded off. Provided smaller sparkles cannot be detected, there may be employed an error correcting circuit in which bits as counted from LSB are appropriately reduced.

With the above embodiment, the encoder generates a plurality of information bit signals and a plurality of corresponding complement bit signals. The full flash A/D converter is simple in arrangement, but can detect and correct errors effectively and reliably.

FIGS. 28 and 29A through 29C illustrate a full flash A/D converter according to a sixth embodiment of the present invention, the full flash A/D converter comprising a 4-bit A/D converter.

Figure 28:
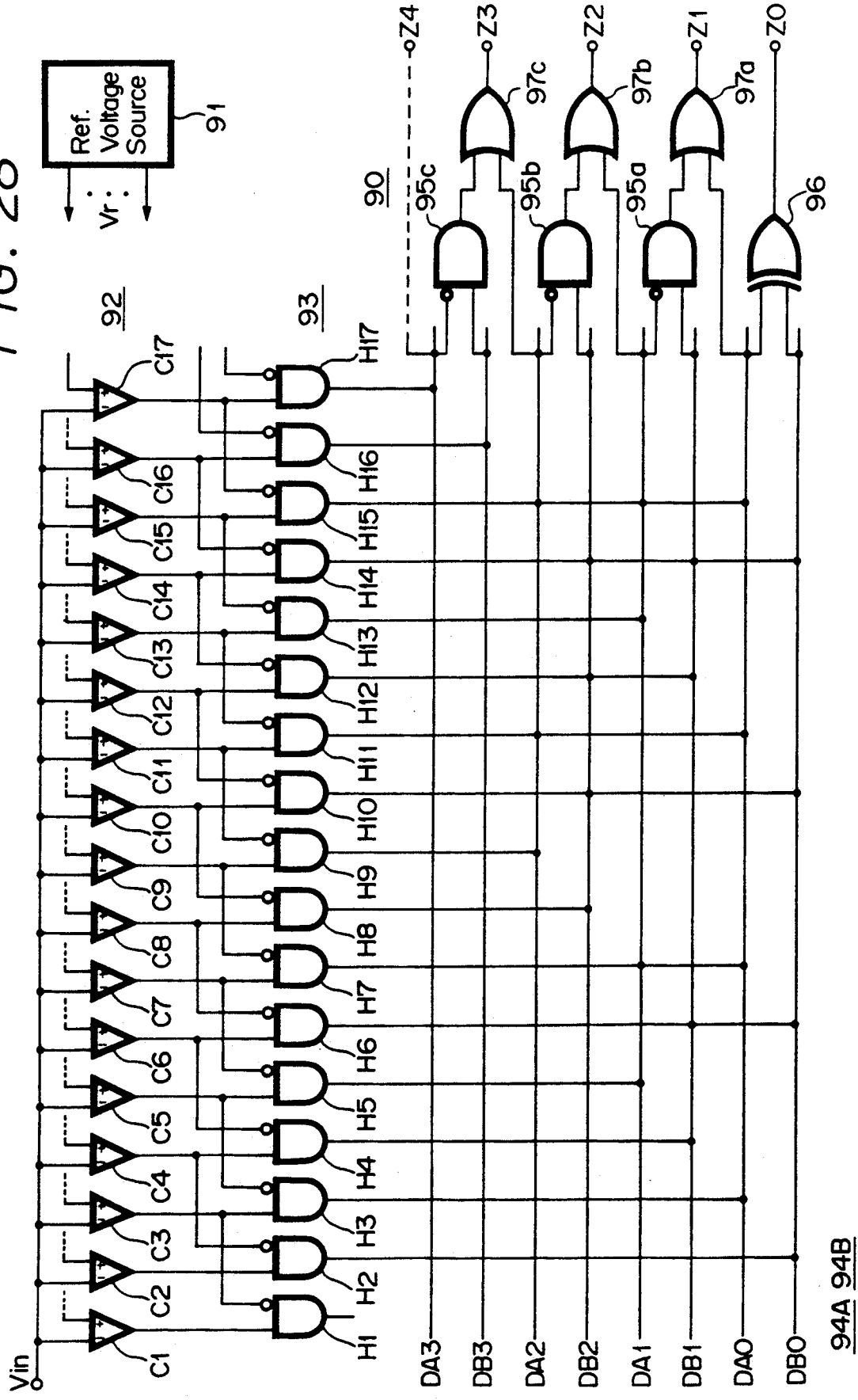
FIG. 28 is a block diagram of a portion of a full flash A/D converter according to a sixth embodiment of the resent invention.

FIG. 28 shows in block form the full flash A/D converter according to the sixth embodiment.

As shown in FIG. 28, the full flash A/D converter has a comparator group 92, and a differentiating circuit 93. The comparator group 92 is composed of 16 comparators C1 through C16 and the differentiating circuit 93 is composed of 16 AND gates H1 through H16. Each AND gate Hj is supplied with the output signal from the corresponding comparator Cj and also the output signal, as inverted, from a comparator Cj+2 which is one comparator apart from the comparator Cj.

First and second encoders 94A, 94B have four bit lines DA0 through DA3 and four bit lines DB0 through DB3, respectively, and WOR circuits corresponding to binary codes are arranged on the bit lines DA0 through DA3 and DB0 through DB3.

The output signal from the (2m−1)th AND gate H2m−1 (m is a natural number) of the differentiating circuit 93 is supplied to the bit lines DA0 through DA3 of the first encoder 94A in a manner corresponding to an [m−1] binary code, and the output signal from the 2mth AND gate H2m of the differentiating circuit 93 is supplied to the bit lines DB0 through DB3 of the second encoder 94B in a manner corresponding to an [m] binary code.

A combining circuit 90 comprises an XOR gate 96, AND gates 95a, 95b, 95c, and

The output signals from the lowest-order bit lines DA0, DB0 of the encoders 94A, 94B are supplied to the XOR gate 96. The AND gates 95a, 95b, 95c are supplied with the output signals, as inverted, from the second through fourth bit lines DA1 through DA3 of the first encoder 94A, and also with the output signals from the second through fourth bit lines DB1 through DB3 of the second encoder 94B.

The output signals from the AND gates 95a, 95b, 95c and the output signals from the three low-order bit lines DA0 through DA2 of the first encoder 94A are supplied to the OR gates 97a, 97b, 97c, whose output signals are outputted as three high-order bits Z1, Z2, Z3 from the combining circuit 90. The output signal from the XOR gate 96 is outputted as the lowest-order bit Z0.

Operation of the full flash A/D converter shown in FIG. 28 will be described also with reference to FIG. 29.

The full flash A/D converter according to the present invention contains at most one metastable comparator. In view of this feature, the differentiating circuit 93 detects the difference between comparators Cj, Cj+2 which are one comparator apart, rather than between adjacent comparators.

Under normal condition, the output signals from two adjacent AND gates Hj, Hj+1 go high, and these H output signals are supplied to the first and second encoders 94A, 94B, respectively.

If the output signal from the (2m−1)th comparator of the comparator group 92 serves as a level-changing point, then the output signals from the (2m−3)th and (2m−2)th AND gates of the differentiating circuit 93 go high, and the encoders 94A, 94B generate [m−2] and [m−1] binary codes, respectively, in a manner corresponding to these two H output signals.

Since the lowest-order bits DA0, DB0 of the encoders 94A, 94B are not equal to each other, the lowest-order bit Z0 outputted from the XOR gate 96 of the combining circuit 90 becomes "1". When the second bits DA1, DB1 of the encoders 94A, 94B are "0" and "1", respectively, or the lowest-order bit DA0 of the encoder 94A is "1", the second bit Z1 of the combining circuit 90 becomes "1". The same holds true for the third and fourth bits Z2, Z3.

The combining circuit 90 thus adds the [m−2], [m−1] binary codes generated by the encoders 94A, 94B, including a carry.

If the output signal from the 2mth comparator of the comparator group 92 serves as a level-changing point, then the output signals from the (2m−2)th and (2m−1)th AND gates of the differentiating circuit 93 go high, and the encoders 94A, 94B generate [m−1] binary codes, respectively, in a manner corresponding to these two H output signals.

Since the lowest-order bits DA0, DB0 of the encoders 94A, 94B are not equal to each other, the lowest-order bit Z0 outputted from the XOR gate 96 of the combining circuit 90 becomes "0". When the second bits DA1, DB1 of the encoders 94A, 94B are "0" and "1", respectively, or the lowest-order bit DA0 of the encoder 94A is "1", the second bit Z1 of the combining circuit 90 becomes "1". The same holds true for the third and fourth bits Z2, Z3.

The combining circuit 90 thus adds the [m−1] binary codes generated by the encoders 94A, 94B, including a carry.

Normally, as shown in FIG. 29B, the difference Δ between the output code from the combining circuit 90 and the normal binary code is 0.

If the output signal from the comparator Cj+2 is metastable, then the output signal from the AND gate Hj+1 of the differentiating circuit 93 goes high, and the output signals from the two AND gates Hj, Hj+2 adjacent to and on the opposite sides of the AND gate Hj+1 are under a metastable condition M. Depending on how the metastable condition M is interpreted, three H, HH, and HHH output signals may be produced. At any rate, the differentiating circuit 93 reliably produces an output signal including the H level, providing positional information relative to the comparator in the metastable condition.

If only one output signal from the AND gate Hj goes high, then the difference Δ between the output code from the combining circuit 90 and the normal binary code is given as shown in FIG. 29A.

The difference Δ between the output code from the combining circuit 90 and the normal binary code is also given as shown in FIG. 29C.

In this embodiment, since the output signals from the encoders 94A, 94B are available in limited combinations, the number of elements of the combining circuits 90 is smaller than a full adder, and the combining circuit 90 is much simpler. Although it is possible to employ a full adder, the combining circuit in the illustrated embodiment is more advantageous for applications requiring high-speed operation in that it has no ripple carry.

Therefore, the full flash A/D converter according to the sixth embodiment is made up of a reduced number of components, is capable of operating at high speed, and can prevent a sparkle resulting from the metastable condition of a comparator.

FIGS. 30 and 31A through 31C illustrate a full flash A/D converter according to a seventh embodiment of the present invention.

Figure 30:
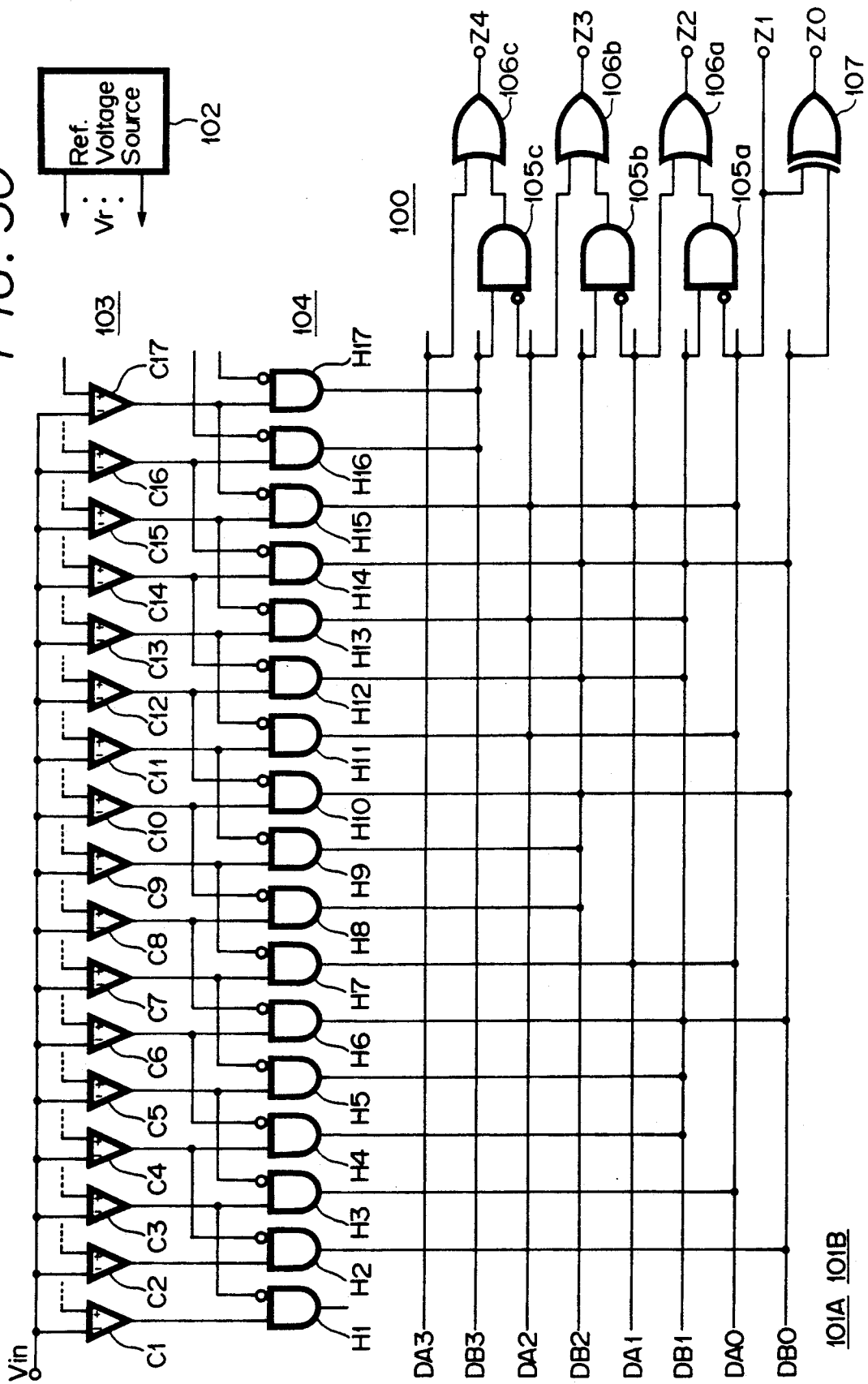
FIG. 30 is a block diagram of a portion of a full flash A/D converter according to seventh embodiment of the present invention.

FIG. 30 shows in block form the full flash A/D converter according to the seventh embodiment.

As shown in FIG. 30, the full flash A/D converter comprises a comparator group 103 and a differentiating circuit 104. The full flash A/D converter includes first and second encoders 101A, 101B which differ from the encoders 94A, 94B shown in FIG. 28 in that when the ith bit (i is a natural number) as counted from the lowest-order bit and bits of lower order than the ith bit, of the binary code of the output signal from the (2m−1)th AND gate H2m−1 of the differentiating circuit 104, are "0" and the (i+1)th- bit of the binary code is "1", the output signal from the AND gate H2m−1 is not supplied to the (i+1)th bit line DAi+1 of the first encoder 101A, but supplied to the (i+1)th bit line DBi+1 of the second encoder 101B.

A combining circuit 100 comprises an XOR gate 107, AND gates 105b, 105c, and OR gates 106a, 106b, 106c.

The output signals from the lowest-order bit lines DA0, DB0 of the encoders 101A, 101B are supplied to the XOR gate 107. The AND gates 105a, 105b, 105c are supplied with the output signals, as inverted, from the first through third bit lines DA0 through DA2 of the first encoder 101A, and also with the output signals from the second through fourth bit lines DB1 through DB3 of the second encoder 101B.

The output signal from the XOR gate 107 of the combining circuit 100 is outputted as the lowest-order bit Z0. The output signal from the lowest-order bit line DA0 of the first encoder 101A is outputted as the second bit Z1 of the combining circuit 100. The output signals from the AND gates 105a, 105b, 105c and the output signals from the three low-order bit lines DA1 through DA3 of the first encoder 101A are supplied to the OR gates 106a, 106b, 106c, whose output signals are outputted as three high-order bits Z2, Z3, Z4 from the combining circuit 90.

The other details of the full flash A/D converter shown in FIG. 30 are the same as those of the full flash A/D converter shown in FIG. 28.

Operation of the full flash A/D converter shown in FIG. 30 will be described also with reference to FIG. 31.

In the embodiment shown in FIG. 28, as shown in FIG. 29C in particular, the difference Δ increases like (data number−1) in the vicinity the output signals (5th, 9th, 17th, ...) of the differentiating circuit 93 where the binary code first becomes "1" at the bit lines DA1 through DA3 of the first encoder 94A.

Taking the above feature of the embodiment shown in FIG. 28 into account, the encoder 101A according to this embodiment is modified as described above. This is expressed as follows:

$$f(Hn-2, DAi-1)=1,$$

and $$f(Hn, DAi-1)=0,$$

and $$f(Hn, DAi)=1$$

where f is a function which agrees with the value of the encoder output whose bit corresponds to the argument of the function. For the AND gate H5, for example, since only the bit line DA1 becomes "0", $$f(H5, DA0)=0,$$

$$f(H5, DA1)=1.$$

Under normal condition, the difference Δ between the output code from the combining circuit 100 and the normal binary code is 0, as shown in FIG. 31B.

If the output signal from the comparator Cj+2 is metastable, and only one output signal from the AND gate Hj goes high, the difference Δ between the output code of the combining circuit 100 and the normal binary code is given as shown in FIG. 31A.

If the output signals from the three AND gates Hj, Hj+1, Hj+2 are high in succession, then the difference Δ between the output code from the combining circuit 100 and the normal binary code is given as shown in FIG. 31C.

Comparison between FIGS. 31A through 31C and FIGS. 29A through 29C clearly indicates that in the embodiment shown in FIG. 30, the difference Δ is reduced for further prevention of a sparkle due to the metastable condition of a comparator.

The combining circuit 100 shown in FIG. 30 may be combined with the encoders shown in FIG. 28.

Figure 32:
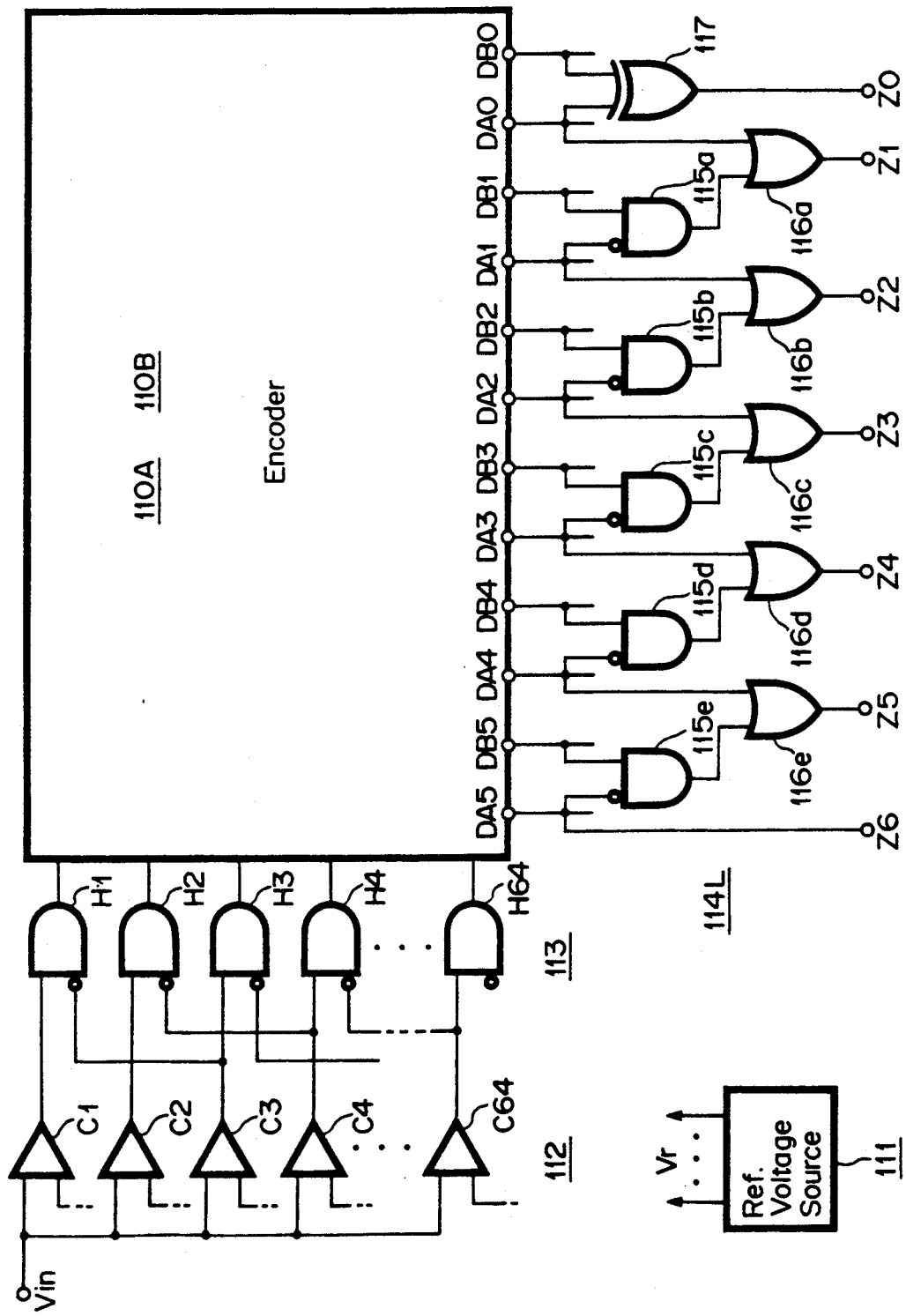
FIG. 32 is a block diagram of a portion of a full flash A/D converter according to an eighth embodiment of the present invention.
Figure 34:
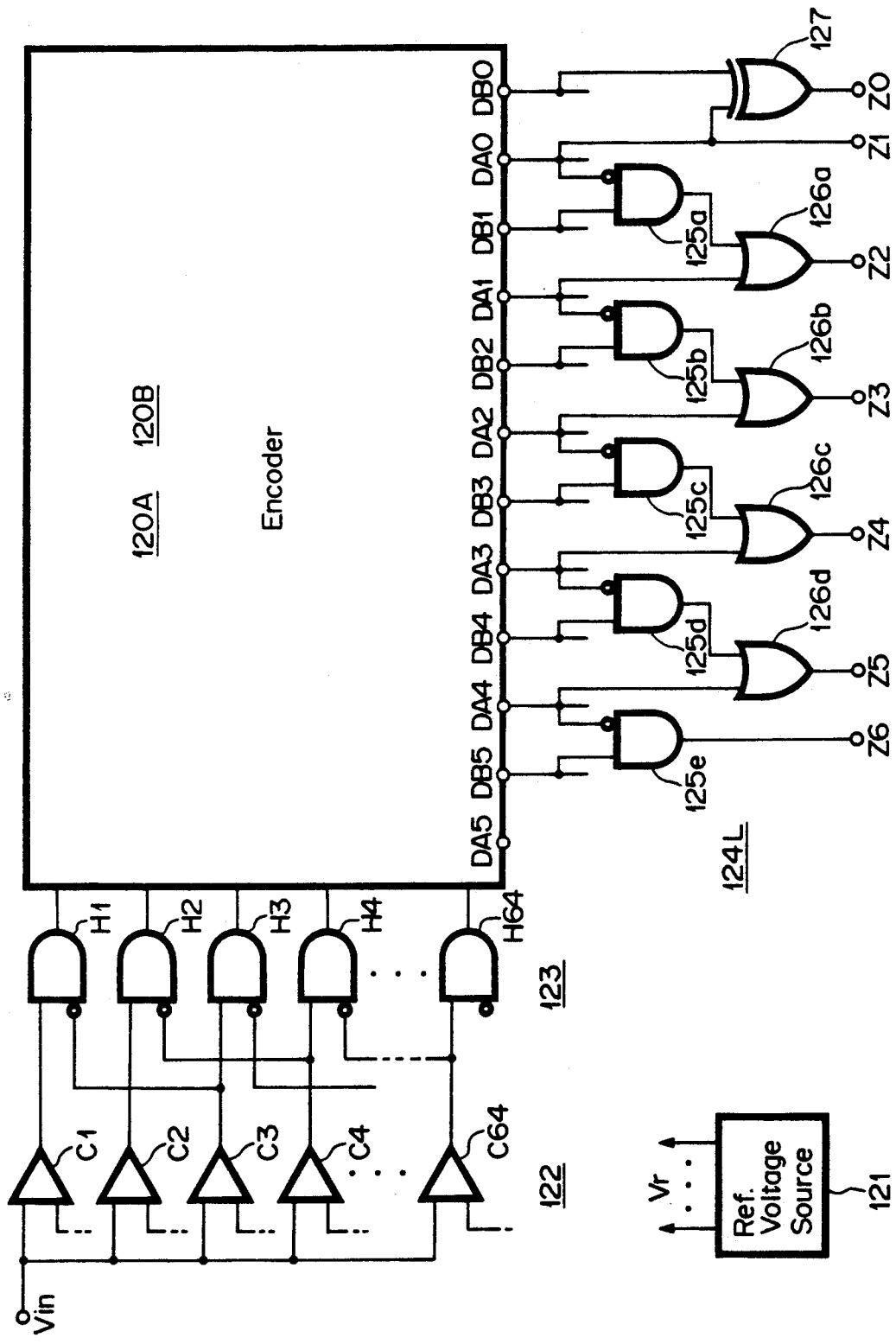
FIG. 34 is a block diagram of a portion of a full flash A/D converter according to a ninth embodiment of the present invention.

FIGS. 32 and 34 show full flash A/D converters according to eighth and ninth embodiments, respectively, of the present invention.

While the principles of the present invention are applied to a 4-bit full flash A/D converter in each of the sixth and seventh embodiments described above, the present invention is also applicable to a 6-bit full flash A/D converter. FIGS. 32 and 33 show such 6-bit full flash A/D converters. Encoders 110A, 110B of the full flash A/D converter shown in FIG. 32 are arranged as shown in FIG. 33, whereas encoders 120A, 120B of the full flash A/D converter shown in FIG. 33 are arranged as shown in FIG. 35.

In each of the eighth and ninth embodiments, the circuit arrangement is greater in scale as the number of bits is increased. The full flash A/D converters according to the eighth and ninth embodiment operate in the same manner as and offers the same advantages as the full flash A/D converters according to the sixth and ninth embodiments.

The principles of the present invention are also applicable to a series/parallel A/D converter having a plurality of stages of higher and lower resolutions.

With the above embodiments, the differentiating circuit detects every other difference between the output signals from the comparators, and the first encoder produces an [m−1] binary code in response to the (2m−1)th output signal of the differentiating circuit whereas the second encoder produces an [m] binary code in response to the 2mth output signal of the differentiating circuit. The output signals from the first and second encoders are combined into a final binary code. Therefore, the full flash A/D converter is made up of a reduced number of components, is capable of operating at high speed, and can prevent a sparkle resulting from the metastable condition of a comparator.

Figure 36:
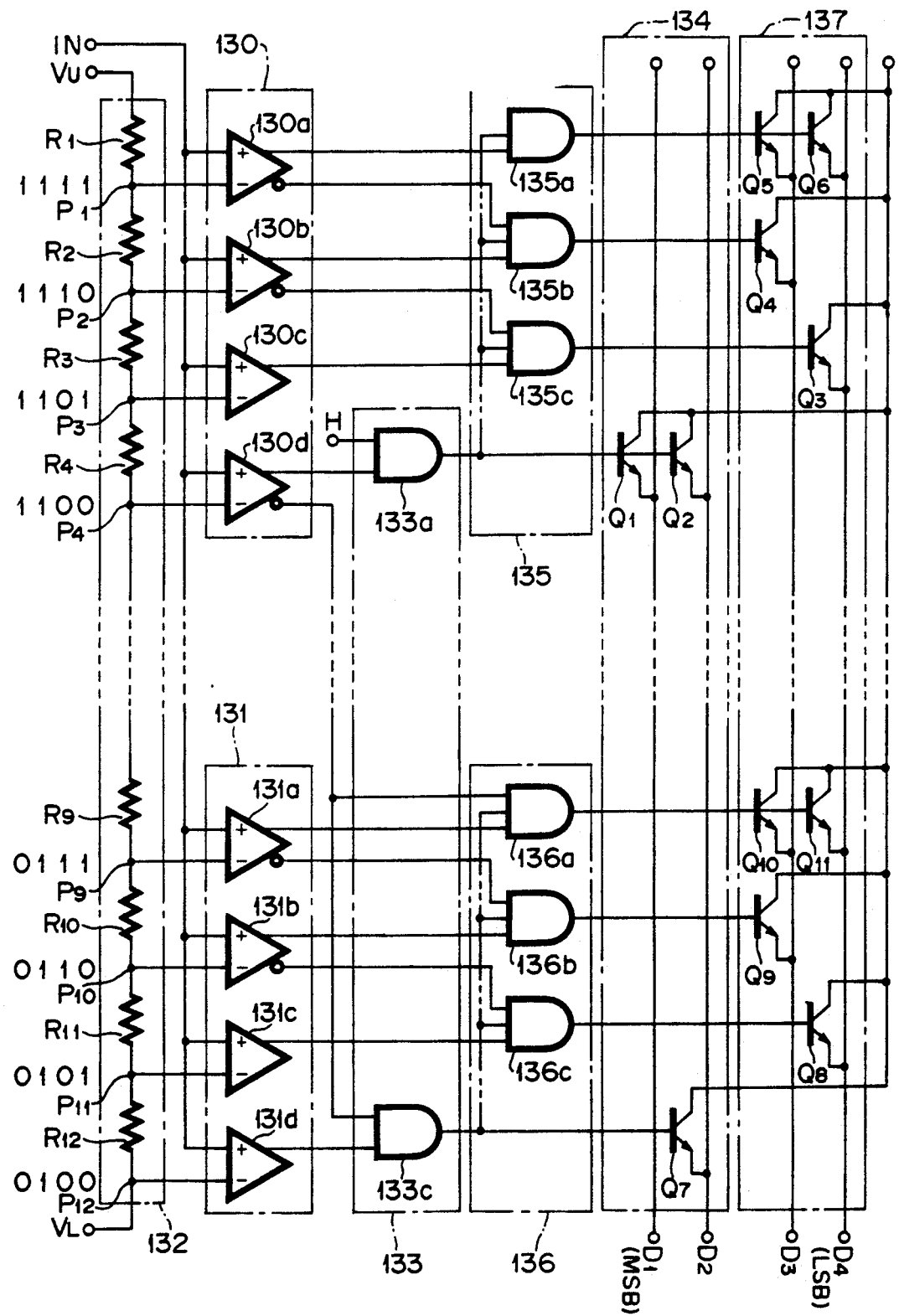
FIG. 36 is a block diagram of a portion of a full flash A/D converter according to a tenth embodiment of the present invention.

FIG. 36 shows in block form a full flash A/D converter according to a tenth embodiment of the present invention. The full flash A/D converter shown in FIG. 36 has an encoder for high-order bits, an encoder for low-order bits, and a gate block for controlling the encoders. The polarities of input signals applied to comparators are opposite to those of the comparators in the first through seventh embodiments.

As shown in FIG. 36, the full flash A/D converter has an input terminal IN to which an analog input signal is supplied, and a first comparator block 130 through an Nth comparator block 131 (N≦2, e.g., N=3). The first comparator 130 comprises comparators 130a through 130d, and the Nth comparator block 131 comprises comparators 131a through 131d. The full flash A/D converter also includes a resistor group 132 comprising, for example, first through twelfth series-connected resistors R1 through R12 equal resistances, the resistors being connected between terminals VU, VL and interconnected through junctions P1 through P12 where different reference voltages are generated. The input terminal IN is connected to input terminals in one phase of the comparators 130a through 130d of the first comparator block 130 and the comparators 131a through 131d of the Nth comparator block 131. The junctions P1 through P12 are connected to the other input terminals in opposite phase of these comparators 130a through 131d. The full flash A/D converter further includes a high-order bit control AND gate block 133 comprising, for example, an AND gate 133a connected to the output terminal of the comparator 130d of the first comparator block 130 and an AND gate 133c connected to the output terminal of the comparator 131d of the Nth comparator block 131. The high-order bit control AND gate block 133 selects the first comparator block 130 or the Nth comparator block 131 depending on the level of an applied analog input signal, and connects the selected comparator block to a high-order bit encoder 134. To the output terminals of the first comparator block 130, there is connected a first low-order bit control AND gate bock 135 comprising AND gates 135a through 135c. To the output terminals of the Nth comparator block 131, there is also connected an Nth low-order bit control AND gate block 136 (N=3, for example) comprising AND gates 136a through 136c. A low-order bit encoder 137 is controlled by the output signals from the first low-order bit control AND gate block 135 and the Nth low-order bit control AND gate block 136. The high- and low-order bit encoders 134, 137 have switching transistors Q1 through Q11 and digital output terminals D1 (MSB) through D4 (LSB).

The full flash A/D converter thus constructed operates as follows: When the level of an analog input signal applied to the input terminal In is higher than the reference voltage at the junction P4, the output signals in one phase from the comparators 130a through 130d of the first comparator block 130 go high, and the output signal from the AND gate 133a of the high-order bit control AND gate block 133 also goes high, thus selecting the first comparator block 130. Therefore, the switching transistors Q1, Q2 of the high-order bit encoder 134 are turned on, so that the digital output terminals D1 (MSB) through D4 (LSB) produce an output signal of "1100".

When the level of an analog input signal applied to the input terminal In is increased in excess of the reference voltage at the junction P3, the output signal from the comparator 130c of the first comparator block 130 and the output signal from the AND gate 135c of the first low-order bit control AND gate block 135 go high. Therefore, the switching transistor Q3 of the low-order bit encoder 137 is turned on, so that the digital output terminals D1 (MSB) through D4 (LSB) product an output signal of "1101".

When the level of an analog input signal applied to the input terminal In is further increased in excess of the reference voltage at the junction P2, the output signal from the comparator 130d of the first comparator block 130 and the output signal from the AND gate 135b of the first low-order bit control AND gate block 135 go high. Therefore, the switching transistor Q4 of the low-order bit encoder 137 is turned on, so that the digital output terminals D1 (MSB) through D4 (LSB) produce an output signal of "1110". At this time, the AND gate 135c is turned off.

When the level of an analog input signal applied to the input terminal In is further increased in excess of the reference voltage at the junction P1, the output signal from the comparator 130a of the first comparator block 130 and the output signal from the AND gate 135a of the first low-order bit control AND gate block 135 go high. Therefore, the switching transistors Q5, Q6 of the low-order bit encoder 137 are turned on, so that the digital output terminals D1 (MSB) through D4 (LSB) produce an output signal of "1111". At this time, the AND gates 135b, 135c are turned off.

It is assumed that the level of an applied input signal is in the vicinity of the junctions P9 through P12 and the Nth comparator block (N=3, for example) is selected.

When the level of an analog input signal applied to the input terminal In exceeds the reference voltage at the junction P12, the output signal from the comparator 131d of the Nth comparator block 131 and the output signal from the comparator 133c of the high-order bit control AND gate block 133 go high. Therefore, the switching transistor Q7 of the high-order bit encoder 134 is turned on, so that the digital output terminals D1 (MSB) through D4 (LSB) produce an output signal of "0100".

When the level of an analog input signal applied to the input terminal In is further increased in excess of the reference voltage at the junction P11, the output signal from the AND gate 136c of the Nth low-order bit control AND gate block 136 goes high. Therefore, the switching transistor Q8 of the low-order bit encoder 137 is turned on, so that the digital output terminals D1 (MSB) through D4 (LSB) produce an output signal of "0101".

When the level of an analog input signal applied to the input terminal In is further increased in excess of the reference voltage at the junction P10, the output signal from the AND gate 136b of the Nth low-order bit control AND gate block 136 goes high. Therefore, the switching transistor Q9 of the low-order bit encoder 137 is turned on, so that the digital output terminals D1 (MSB) through D4 (LSB) produce an output signal of "0110".

When the level of an analog input signal applied to the input terminal In is further increased in excess of the reference voltage at the junction P9, the output signal from the AND gate 136a of the Nth low-order bit control AND gate block 136 goes high. Therefore, the switching transistors Q10, Q11 of the low-order bit encoder 137 are turned on, so that the digital output terminals D1 (MSB) through D4 (LSB) produce an output signal of "0101".

Since the high-order bit encoder 134 is controlled by the output signal from the high-order bit control AND gate block 133, and the low-order bit encoder 137 is controlled by the output signal from the first low-order bit control AND gate block 135 or the Nth low-order bit control AND gate block 136, the full flash A/D converter is simplified in arrangement, and can prevent a glitch from being produced, as described later on. The parameter N is not limited to "3", but may be N≧2. If the first and Nth low-order bit control AND gate blocks 135, 136 are controlled by the output signal from the high-order bit control AND gate block 133, then the first low-order bit control AND gate block 135 or the Nth low-order bit control AND gate block 136 is selected with respect to the first comparator block 130 or the Nth comparator block 131 which is selected. Consequently, any deviation (digital error) of the digital output signal from a true value is reduced as much as possible.

The occurrence of a digital error (deviation from a true value=a glitch) when two level-changing points are produced will be described below with reference to FIG. 37. When the level of an analog input signal applied to the input terminal In corresponds to the reference voltage at the junction P4, if an input voltage corresponding to the reference voltage at the junction P1 remains in the comparator 130a because of the low speed at which the comparator 130a operates, both the output signals from the comparators 130a, 130d are high. Therefore, both the output signals from the AND gates 135a, 133a are also high, energizing the switching transistors Q1, Q2, Q5, Q6. The digital output terminals D1 (MSB) through D4 (LSB) now produces an output signal of "1111", which is an error of three steps or less (that is negligible) apart from a true value of "1100".

Figure 38:
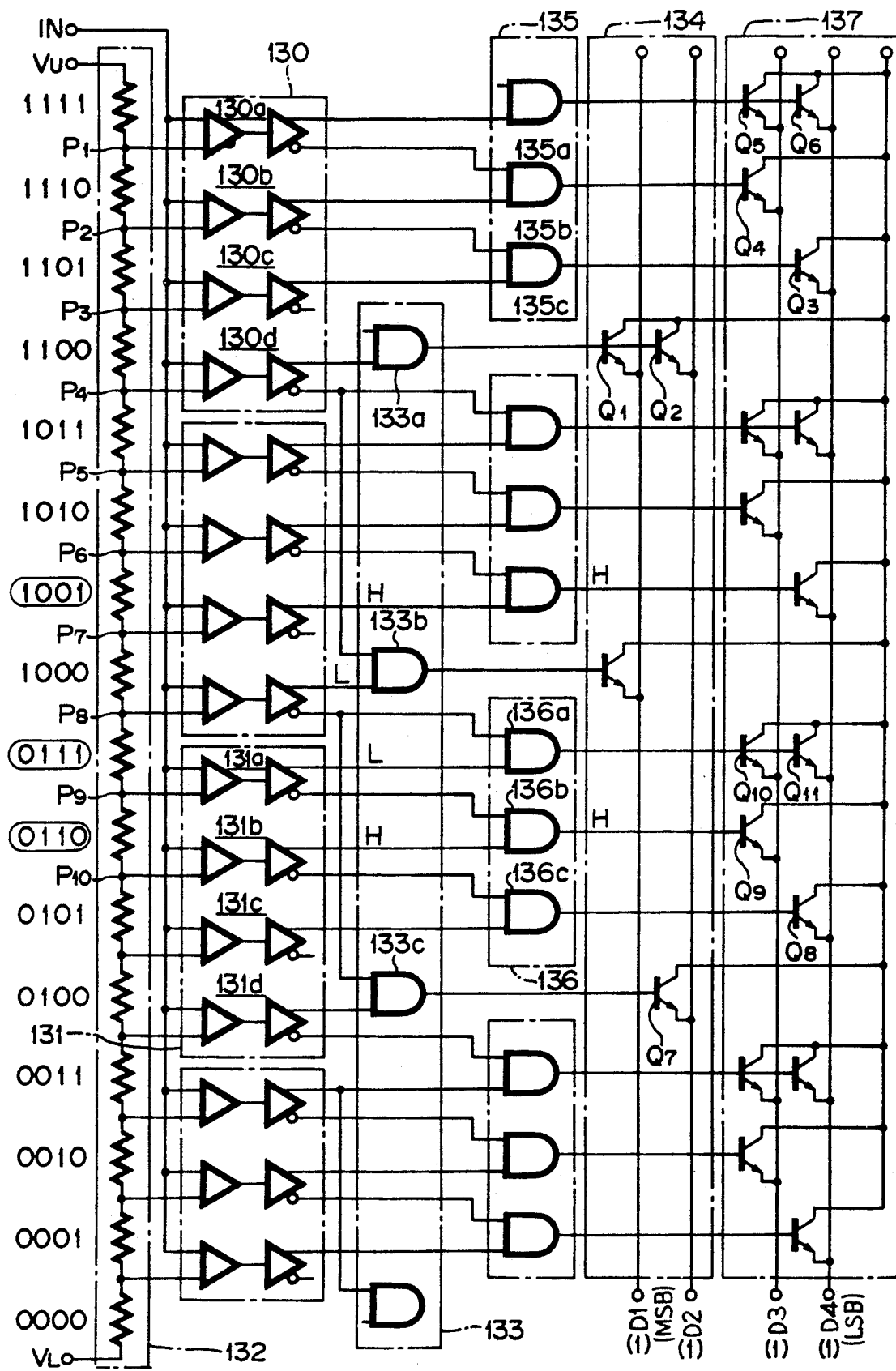

FIG. 38 shows another example of the manner in which a glitch is generated. As shown in FIG. 38, when the level of an analog input signal applied to the input terminal In corresponds to the reference voltage at the junction P10, if an input voltage corresponding to the reference voltage at the junction P7 remains in the comparator, the switching transistor Q12 is turned on, and the digital output terminals D1 (MSB) through D4 (LSB) now produces an output signal of "0111", which is one step apart from a true value. However, such an error is practically negligible.

Figure 37:
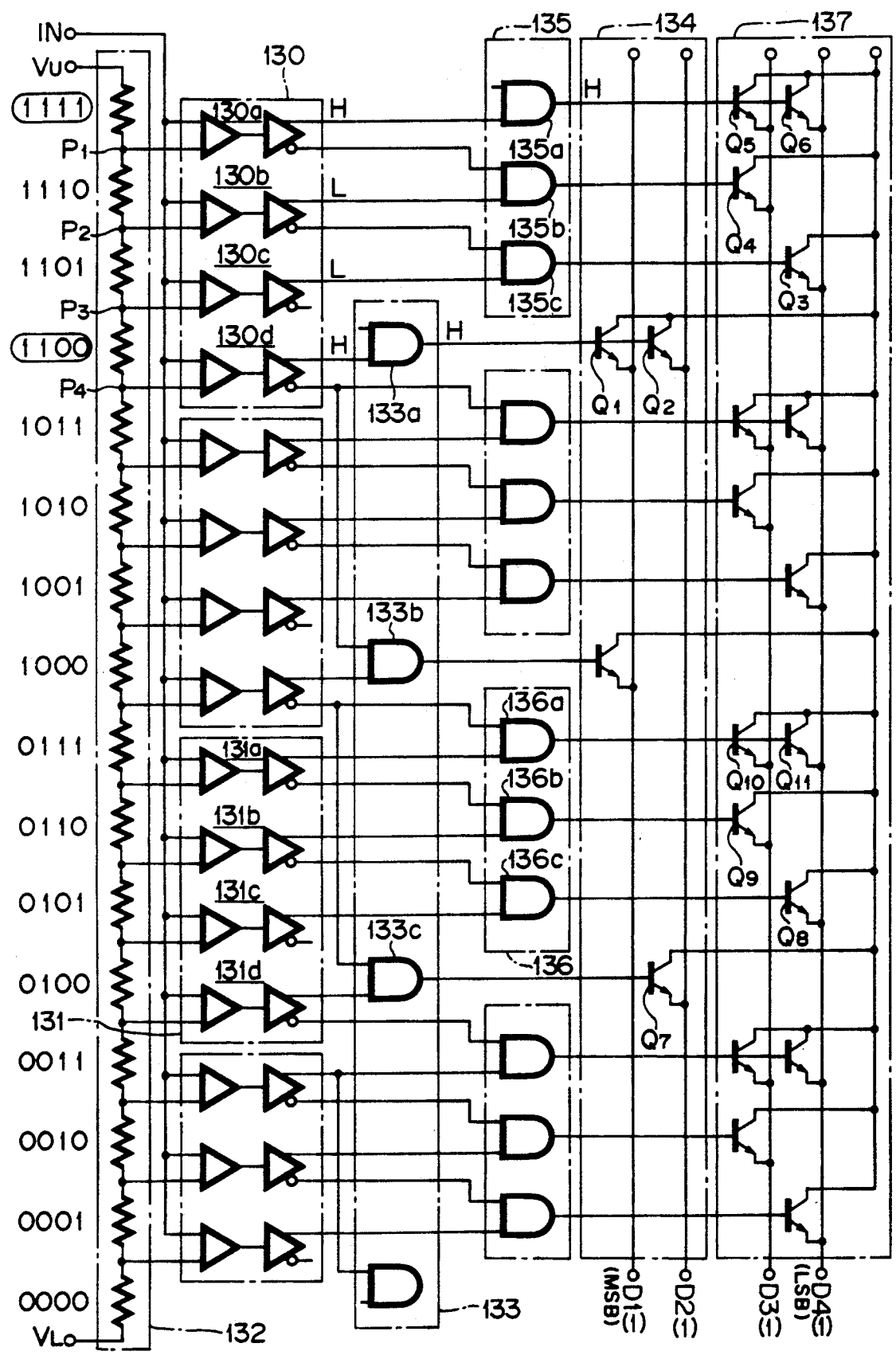
FIGS. 37 through 40 are block diagrams illustrative of the generation of a glitch in the circuit portion shown in FIG. 36.

In the examples of FIGS. 37 and 38, the first and Nth low-order bit control AND gate blocks 135, 136 are not controlled by the output signal from the high-order bit control AND gate block 133.

Figure 39:
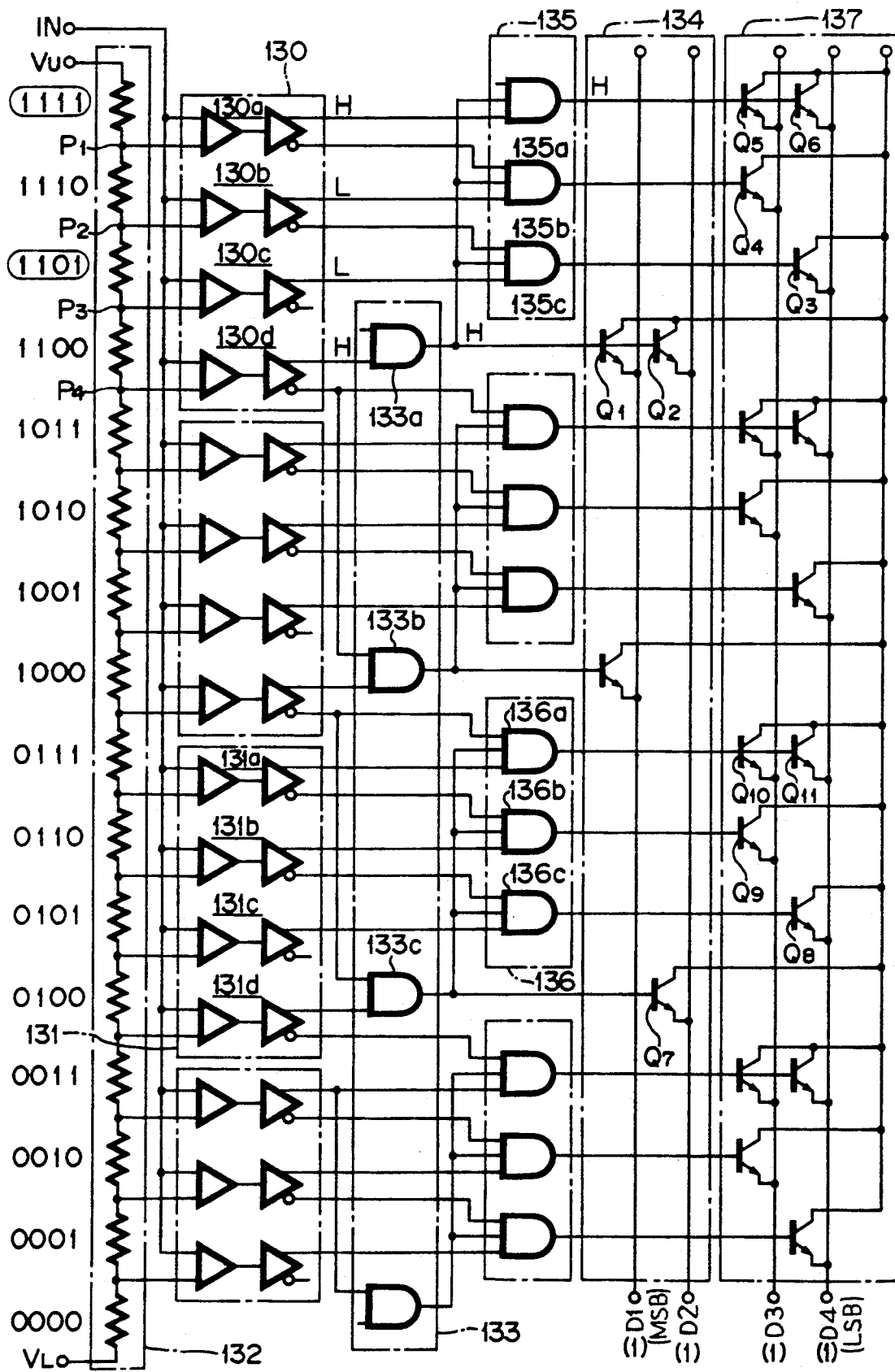
Figure 40:
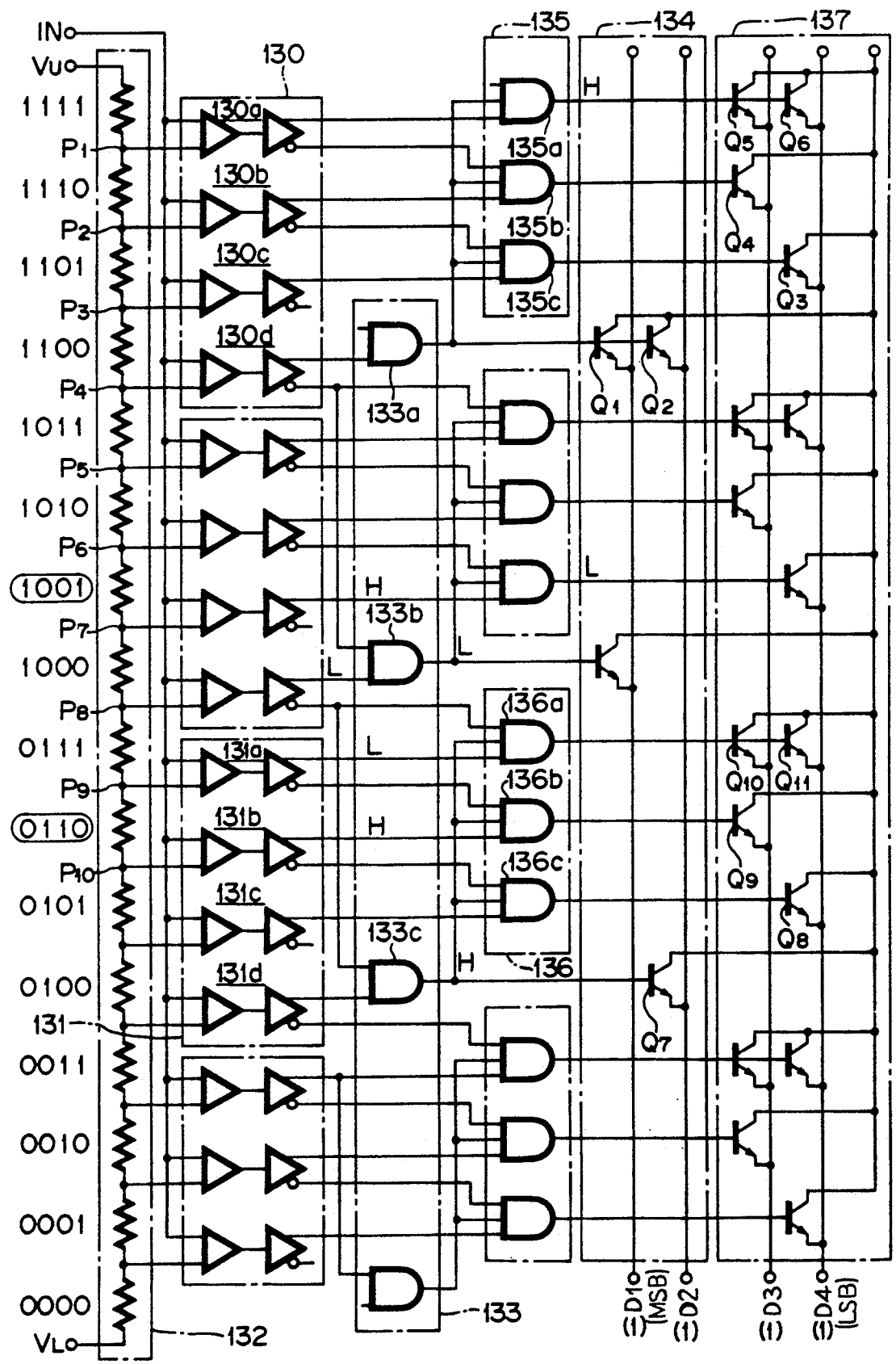

In FIGS. 39 and 40 which show other examples of the manner in which a glitch occurs, the first and Nth low-order bit control AND gate blocks 135, 136 are controlled by the output signal from the high-order bit control AND gate block 133.

As shown in FIG. 39, when the level of an analog input signal applied to the input terminal In corresponds to the reference voltage at the junction P4, if an input voltage corresponding to the reference voltage at the junction P1 remains in the comparator 130a because of the low speed at which the comparator 130a operates. The digital output terminals D1 (MSB) through D4 (LSB) now produces an output signal of "1111", which is an error of three steps or less apart from a true value.

As shown in FIG. 40, when the level of an analog input signal applied to the input terminal In corresponds to the reference voltage at the junction P10, if an input voltage corresponding to the reference voltage at the junction P7 remains in the comparator, the output signal from the AND gate 133b of the high-order bit control AND gate block 133 goes low, turning off the switching transistor Q12. The digital output terminals D1 (MSB) through D4 (LSB) now produces an output signal of "0110", which is one step apart from a true value. The glitch thus produced is less than the glitch which is generated in the example shown in FIG. 38.

The full flash A/D converter shown in FIG. 36 comprises a 4-bit A/D converter. However, the present invention is also applicable to a 16-bit or 3-bit full flash A/D converter, for example.

With the embodiment shown in FIG. 36, the full flash A/D converter has a high-order bit control AND gate block and a low-order bit control AND gate block. Therefore, the full flash A/D converter does not require a converting circuit composed of XOR gates as is the case with the conventional flash A/D converters. The full flash A/D converter is relatively simple in arrangement, and can reduce the occurrence of glitches.

If the low-order bit control AND gate block is controlled by the high-order bit control AND gate block, any deviation of the digital output signal from a true value is minimized.

Having described preferred embodiments of the invention with reference to the accompanying drawings, it is to be understood that the invention is not limited to the precis embodiments and that various changes and modifications could be effected by one skilled in the art without departing from the spirit or scope of the invention as defined in the appended claims.

What is claimed is:

1. A full flash analog-to-digital converter comprising:
    a plurality of comparators for comparing an analog input voltage with respective reference voltages;
    a first-stage encoder for generating low-order bits based on output signals from said comparators;

a second-stage encoder for generating high-order bits based on the low-order bits generated by said first-stage encoder;
means for generating a complement bit of the highest-order bit of said low-order bits; and
said second-stage encoder comprising means for inhibiting or generating said high-order bits, only in response to said highest-order bit and said complement bit.

2. A full flash analog-to-digital converter comprising:
a plurality of comparators for comparing an analog input voltage with respective reference voltages;
an encoder for generating a plurality of bits based on output signals from said comparators;
said encoder comprising means for generating an additional bit by ORing the AND logical product of complement bits of second and third low-order bits of said plurality of bits, and a complement bit of a first low-order bit of said plurality of bits;
a logic circuit for ANDing said additional bit and a complement bit of the additional bit; and
means for detecting an error pattern in the output signals from said comparators based on an output signal from said logical circuit.

3. A full flash analog-to-digital converter comprising:
a plurality of comparators for comparing an analog input voltage with respective reference voltages;
an encoder for generating a plurality of information bits based on output signals from said comparators;
said encoder comprising means for generating a plurality of pairs of complementary bit signals corresponding respectively to each of said information bits; and
a logic combining circuit connected to receive said pairs of bit signals for producing an output in response thereto.

4. A full flash analog-to-digital converter comprising:
a plurality of comparators for comparing an analog input voltage with respective reference voltages;
an encoder for generating a plurality of bits based on output signals from said comparators;
said encoder comprising means for generating a complement bit of a second low-order bit of said plurality of bits;
a logic circuit for ANDing said complement bit and said second low-order bit; and
means for detecting an error pattern in the output signals from said comparators based on an output signal from said logic circuit.

5. A full flash analog-to-digital converter comprising:
a plurality of comparators for comparing an analog input voltage with respective reference voltages;
an encoder for generating a plurality of information bits based on output signals from said comparators;
said encoder comprising means for generating odd- and even-parity bits for said plurality of information bits; and
an error detecting circuit for detecting an error pattern in the output signals from said comparators based on said odd- and even-parity bits and said information bits.

6. A full flash analog-to-digital converter comprising:
a plurality of comparators for comparing an analog input voltage with respective reference voltages;
a differentiating circuit for detecting differences between output voltages from each one and every other one of said comparators;
encoder means for generating a binary code based on an output signal from said differentiating circuit;
said encoder means comprising:
a first encoder for generating an [m−1] bit binary code in response to a (2m−1)th output signal (m is a natural number) of said differentiating circuit; and
a second encoder for generating an [m] bit binary code in response to a 2mth output signal from said differentiating circuit; and
a combining circuit for combining output signals from said first and second encoders into a final binary code.

7. A full flash analog-to-digital converter comprising:
a plurality of comparators for comparing an analog input voltage with respective reference voltages;
a differentiating circuit for detecting differences between output voltages from each one and every other one of said comparators;
encoder means for generating a binary code based on an output signal from said differentiating circuit;
said encoder means comprising:
a first encoder for generating an [m−1] bit binary code in response to a (2m−1)th output signal (m is a natural number) of said differentiating circuit; and
a second encoder for generating an [m] bit code in response to a 2mth output signal from said differentiating circuit;
a combining circuit for combining output signals from said first and second encoders into a final binary code; and
the arrangement being such that when an ith bit (i is a natural number) as counted from the lowest-order bit of the binary code produced in response to the (2m−1)th output signal from said differentiating circuit, and bits lower in order than said ith bit are "0" and also when an (i+1)th bit of the binary bit is "1", said (2m−1)th output signal from said differentiating circuit is supplied to an (i+1)th bit line of said second encoder rather than to an (i+1)th bit line of said first encoder.

8. A full flash analog-to-digital converter according to claim 6, wherein ith bits (i is a natural number) as counted from the lowest-order bits of output signals from said first and second encoders are denoted by DAi−1 and DBi−1, respectively, said combining circuit comprising means for generating a lowest-order bit of an output signal thereof according to a logic operation:

(DA0 XOR DB0)

and generating an (i+1)th bit as counted from said last-mentioned lowest-order bit according to a logic operation:

[(NOT DAi) AND DBi) OR DAi−1]

9. A full flash analog-to-digital converter according to claim 6 or 7, wherein ith bits (i is a natural number) as counted from the lowest-order bits of output signals from said first and second encoders are denoted by DAi−1 and DBi−1, respectively, said combining circuit comprising means for generating a lowest-order bit of an output signal thereof according to a logic operation:

(DA0 XOR DB0)

generating a 2nd bit as counted from said last-mentioned lowest-order bit with a bit DB0, and generating an (i+2)th bit as counted from said last-mentioned lowest-order bit according to a logic operation:

[(DAi OR (DBi AND (NOT DAi−1)].

10. A full flash analog-to-digital converter comprising:
first through Nth (N≧2) comparator blocks each comprising a plurality of comparators;
a high-order bit encoder;
a low-order bit encoder;
a high-order bit control AND gate block connected to output terminals of predetermined ones of the comparators of said first through Nth comparator blocks, for selecting one of said comparator blocks depending on the level of an analog input signal applied thereto to control said high-order bit encoder; and
first through Nth low-order bit control AND gate blocks connected respectively to output terminals of said first through Nth comparator blocks, for controlling said low-order bit encoder.

11. A full flash analog-to-digital converter according to claim 10, wherein said first through Nth low-order bit control AND gate blocks are controlled by an output signal from said high-order bit control AND gate block.

* * * * *